(12) United States Patent
Ho et al.

(10) Patent No.: US 8,971,679 B2
(45) Date of Patent: Mar. 3, 2015

(54) APPARATUS AND METHOD FOR PASSIVE ALIGNMENT OF OPTICAL DEVICES

(71) Applicant: Optonet Inc., Evanston, IL (US)

(72) Inventors: Seng-Tiong Ho, Wheeling, IL (US); Yingyan Huang, Wilmette, IL (US)

(73) Assignee: Optonet Inc., Evanston, IL (US)

( * ) Notice: Subject to any disclaimer, the term of this patent is extended or adjusted under 35 U.S.C. 154(b) by 0 days.

(21) Appl. No.: 14/026,615

(22) Filed: Sep. 13, 2013

(65) Prior Publication Data

US 2015/0016775 A1 Jan. 15, 2015

Related U.S. Application Data

(60) Continuation-in-part of application No. 12/614,995, filed on Nov. 9, 2009, now Pat. No. 8,538,208, which is a continuation-in-part of application No. 12/187,928, filed on Aug. 7, 2008, now Pat. No. 7,616,856, which is a division of application No. 10/652,269, filed on Aug. 28, 2003, now Pat. No. 7,426,328, said application No. 12/614,995 is a continuation-in-part of application No. 10/708,536, filed on Mar. 10, 2004, now Pat. No. 7,643,719.

(60) Provisional application No. 60/406,704, filed on Aug. 28, 2002, provisional application No. 60/454,806, filed on Mar. 14, 2003.

(51) Int. Cl.
  G02B 6/26 (2006.01)
  G02B 6/42 (2006.01)
  G02B 6/10 (2006.01)
  G02B 6/32 (2006.01)

(52) U.S. Cl.
  CPC .......................................... G02B 6/32 (2013.01)
  USPC ................................ 385/31; 385/16; 385/131

(58) Field of Classification Search
  USPC .............................................. 385/16, 31, 131
  See application file for complete search history.

(56) References Cited

U.S. PATENT DOCUMENTS

| 6,157,759 | A | 12/2000 | Seo et al. ......................... 385/49 |
| 6,671,438 | B2 | 12/2003 | Ido et al. .......................... 385/49 |
| 6,853,778 | B2 | 2/2005 | Helbing et al. .................. 385/49 |
| 7,492,995 | B2 | 2/2009 | Kuroda et al. ................... 385/49 |
| 7,643,719 | B1 * | 1/2010 | Zhou et al. ..................... 385/131 |
| 2001/0006568 | A1 * | 7/2001 | Copner et al. .................. 385/16 |
| 2007/0040268 | A1 * | 2/2007 | Sherrer et al. ................ 257/712 |
| 2007/0164419 | A1 * | 7/2007 | Sherrer et al. ................ 257/689 |
| 2007/0274630 | A1 * | 11/2007 | Ghiron et al. ................... 385/33 |
| 2008/0277571 | A1 * | 11/2008 | Sherrer et al. ................ 250/239 |

* cited by examiner

Primary Examiner — Charlie Peng
Assistant Examiner — Mary El Shammaa
(74) Attorney, Agent, or Firm — Brinks Gilson & Lione

(57) ABSTRACT

An apparatus for passive alignment of optical devices comprises a substrate including a trench in a top surface thereof, where the trench has a first end positioned at an edge of the substrate and a second end positioned at an interior region of the substrate, and a lens disposed on the top surface of the substrate adjacent to the second end of the trench. The apparatus further includes a top holder having a longitudinal indentation in a bottom surface thereof for mounting an optical fiber. The longitudinal indentation is sized to fit a top portion of the optical fiber such that a bottom portion of the optical fiber extends below the bottom surface of the top holder when the optical fiber is mounted therein. One or both of the substrate and the top holder include one or more spacer features configured for three-dimensional (3D) alignment of the lens with the optical fiber when the top holder is brought into contact with the substrate.

16 Claims, 46 Drawing Sheets

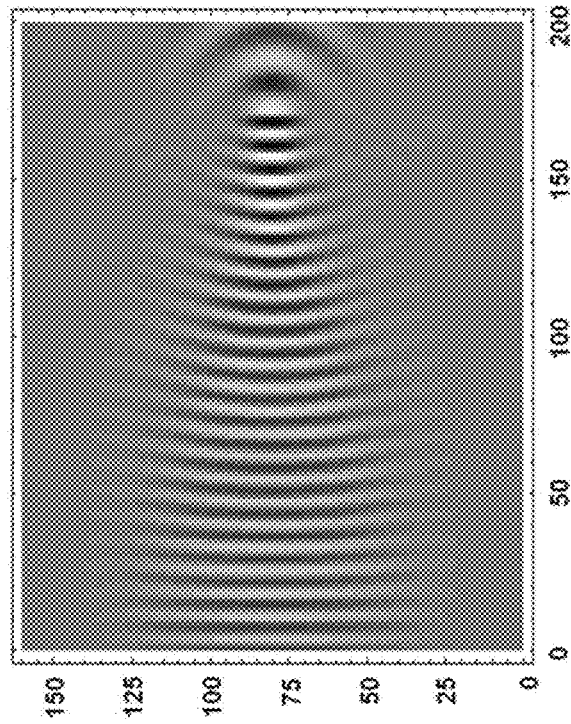
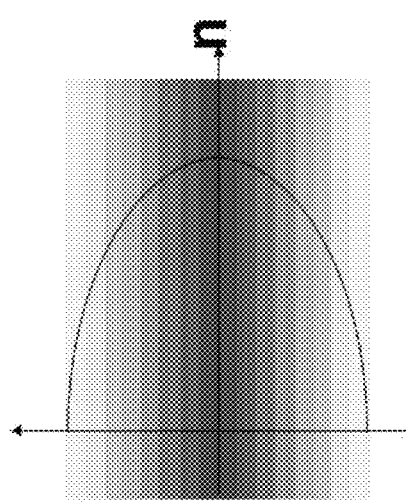
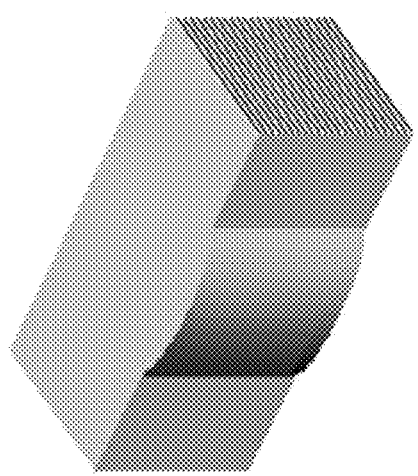
FIG. 5(a)
FIG. 5(b)
FIG. 5(c)

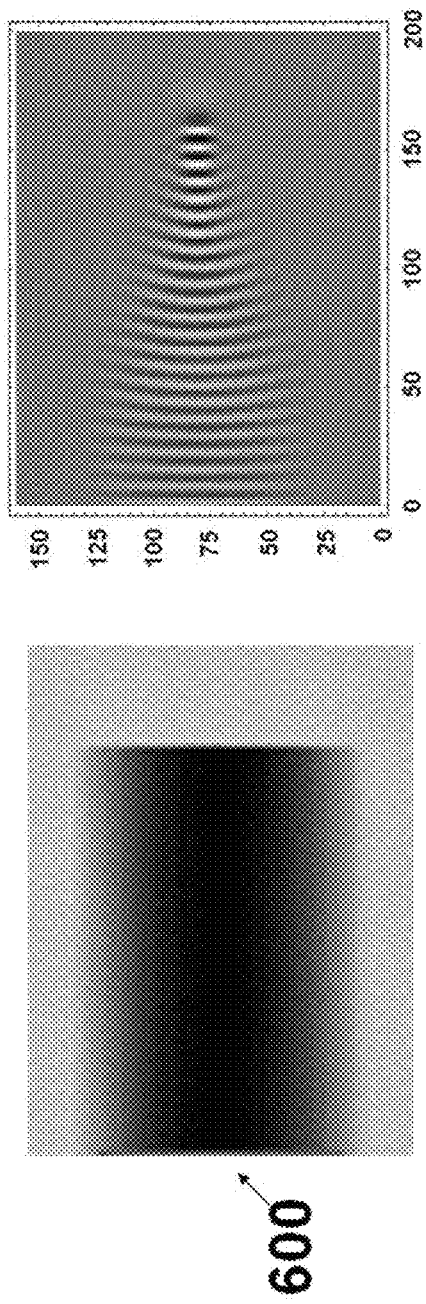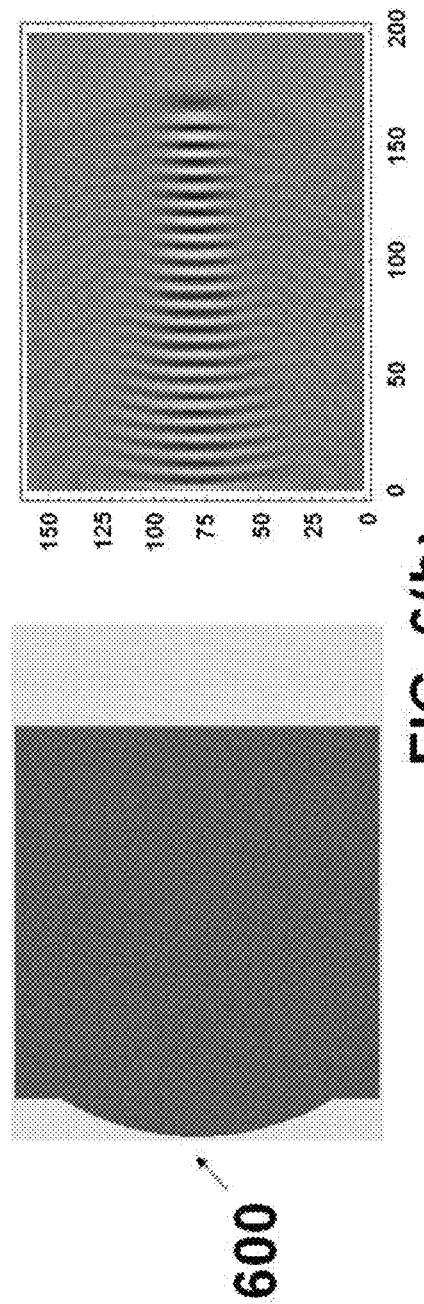

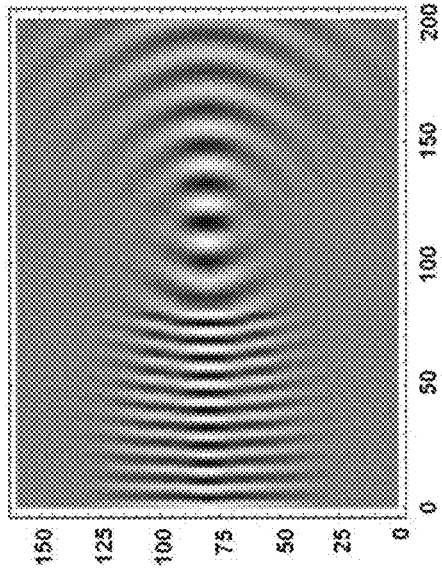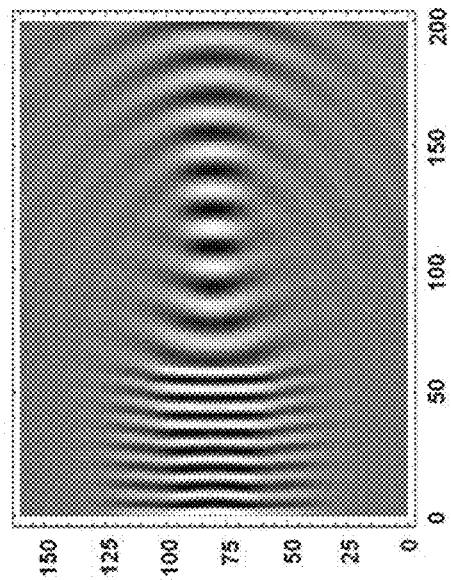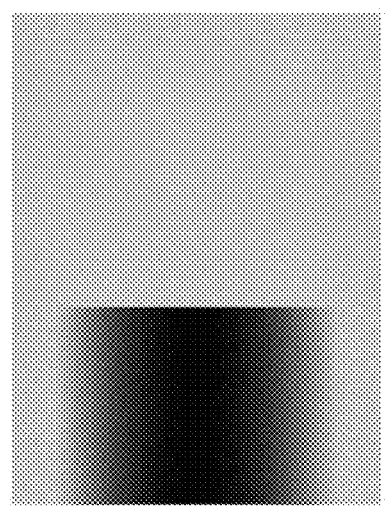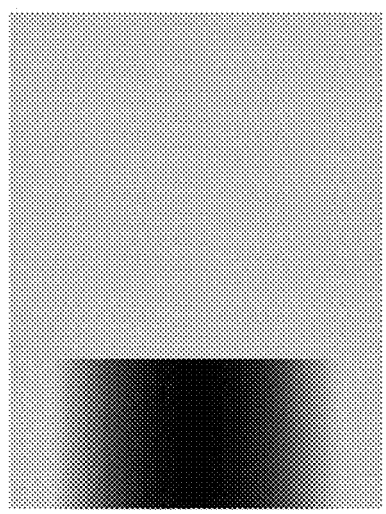
FIG. 7(e)
FIG. 7(f)

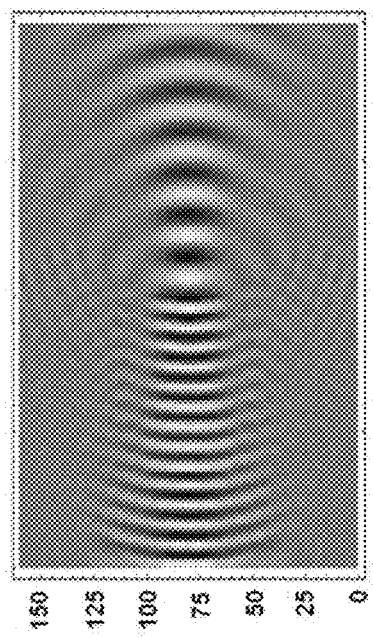
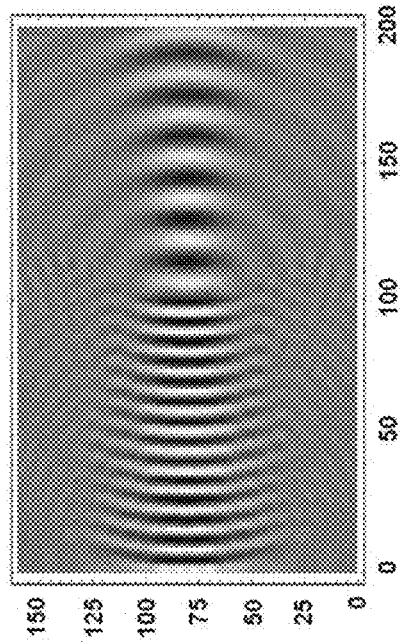
FIG. 8(a)
FIG. 8(b)

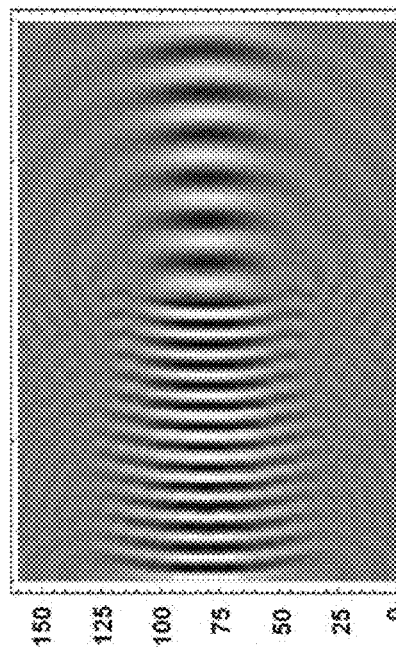
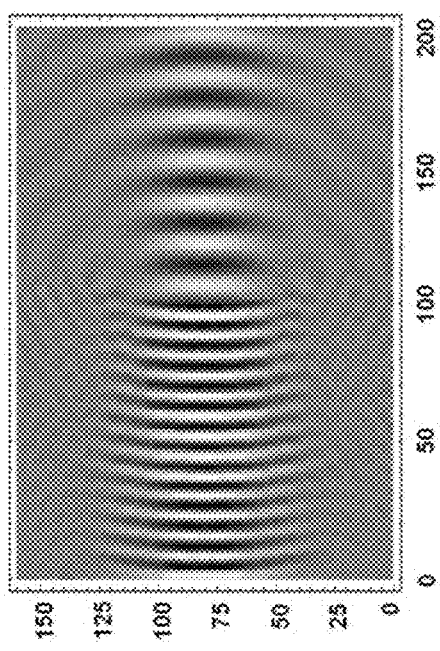
FIG. 8(c)
FIG. 8(d)

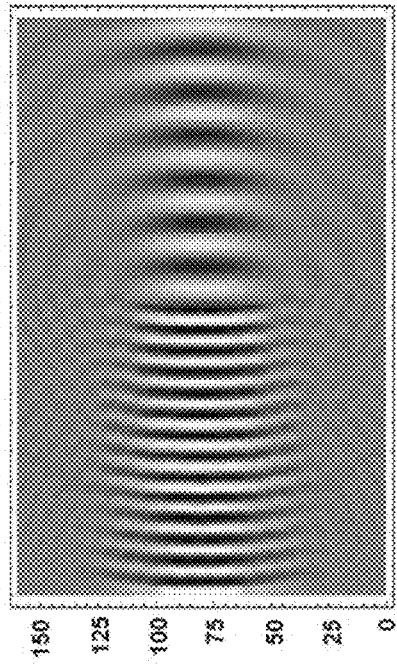
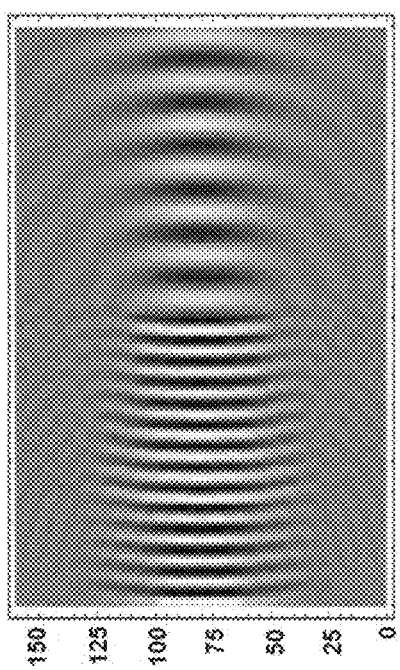
FIG. 8(e)
FIG. 8(f)
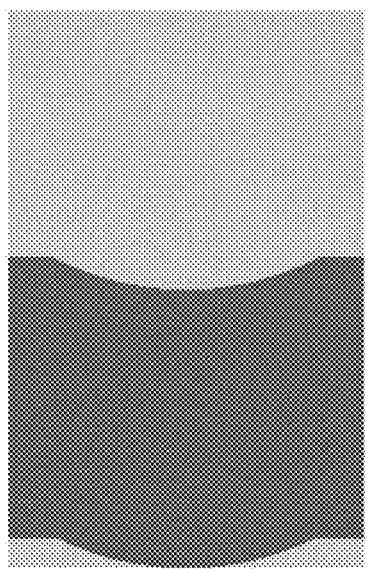
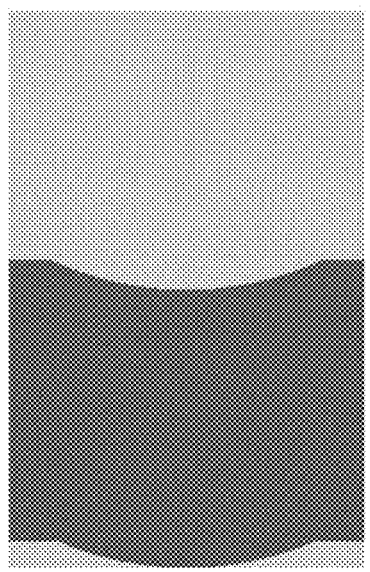

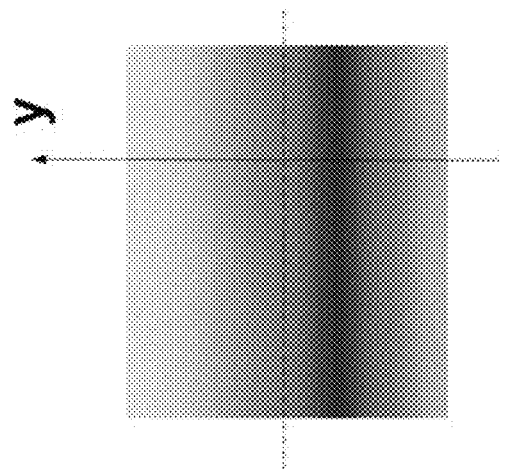
FIG. 9(d)
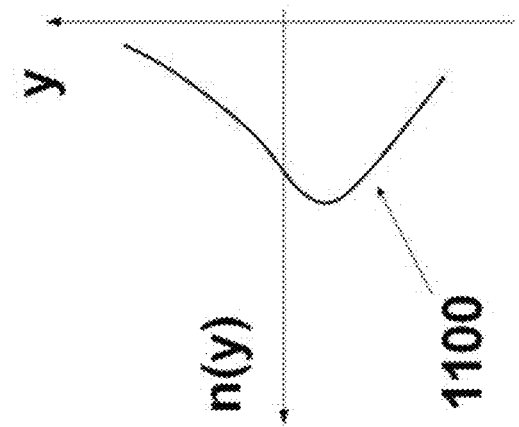
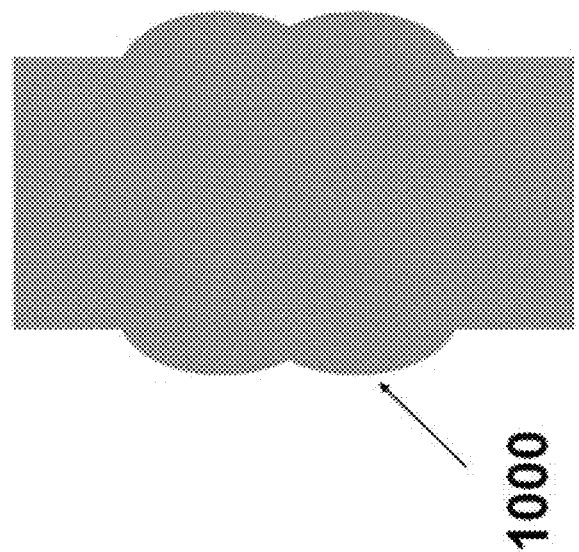
FIG. 9(c)

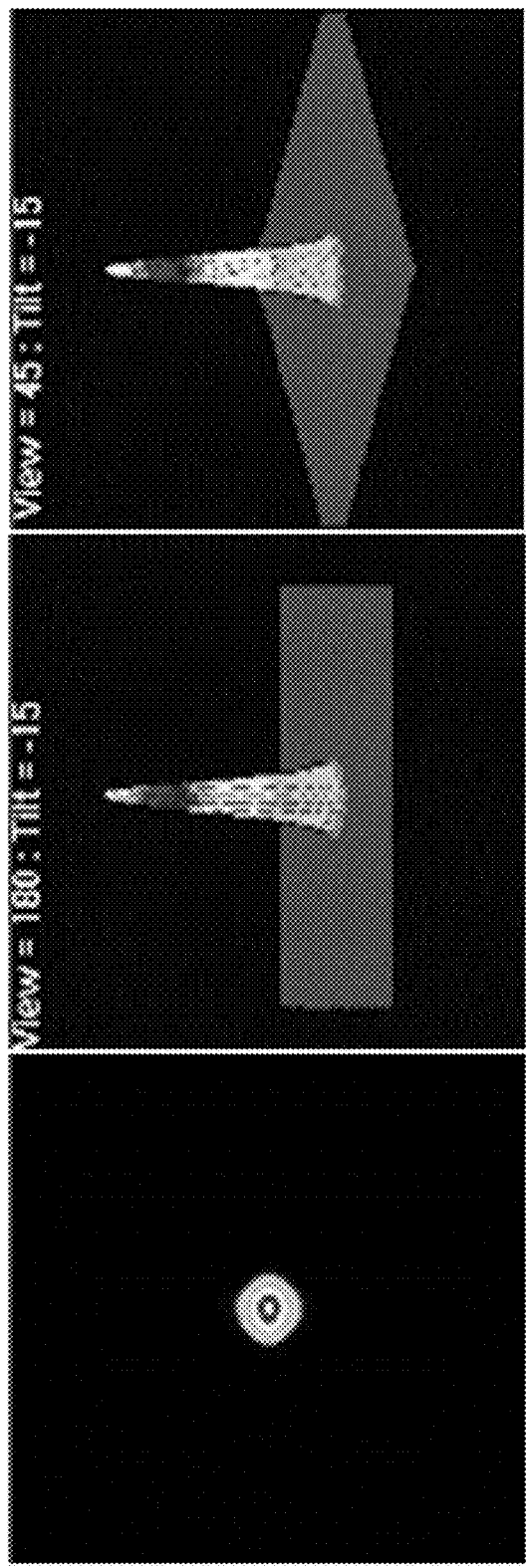

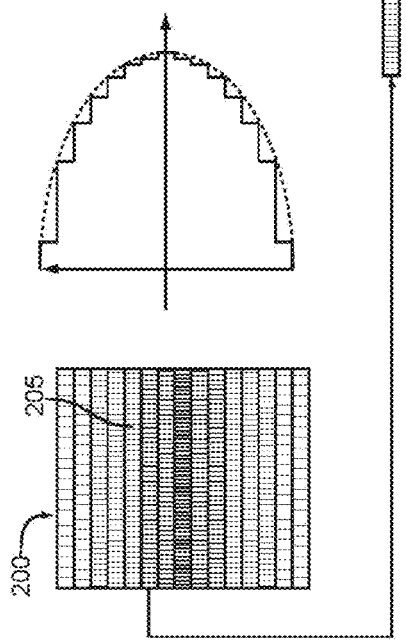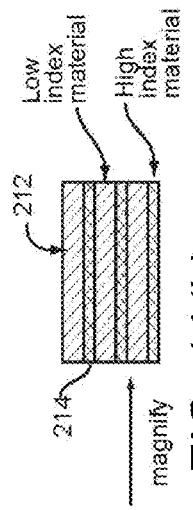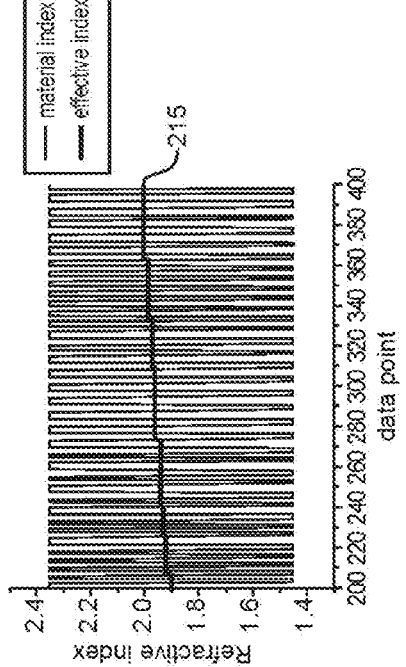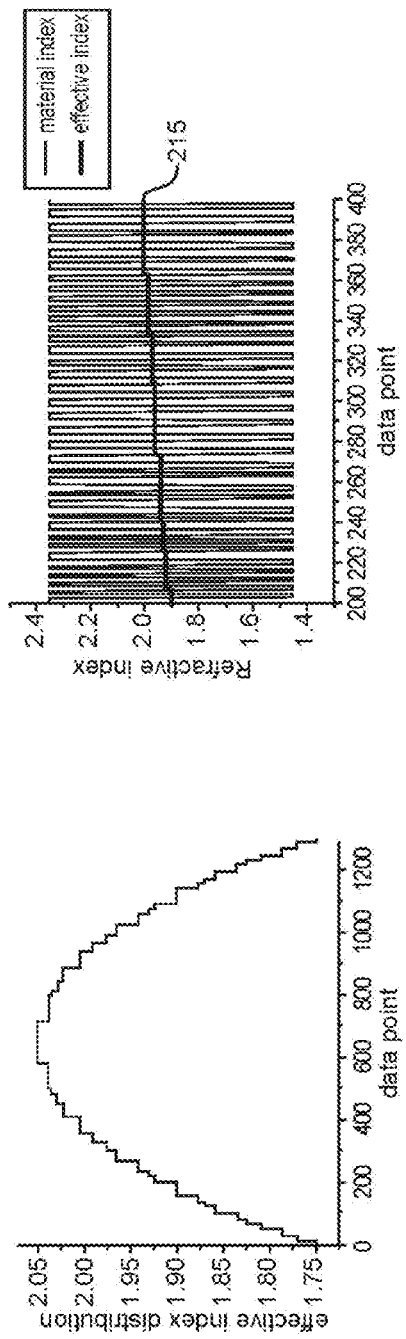
FIG. 11(a)
FIG. 11(b)
FIG. 11(c)
FIG. 11(d)

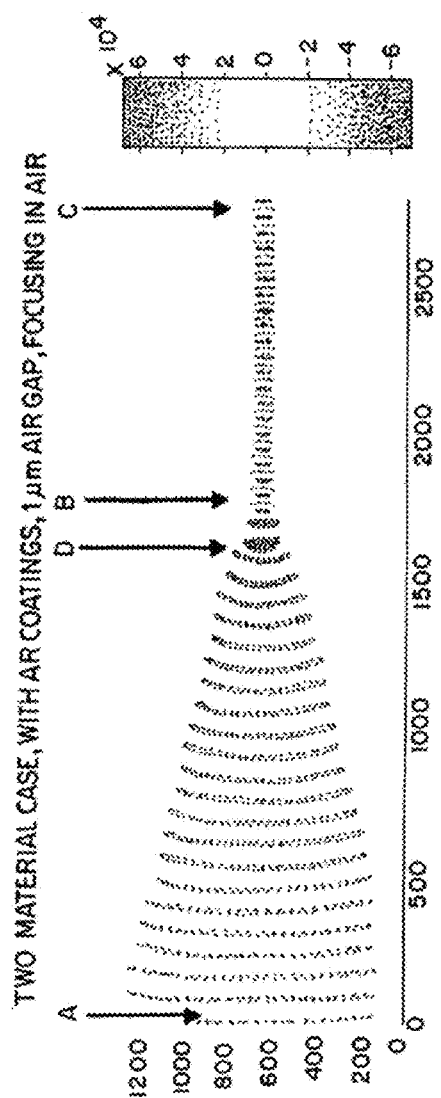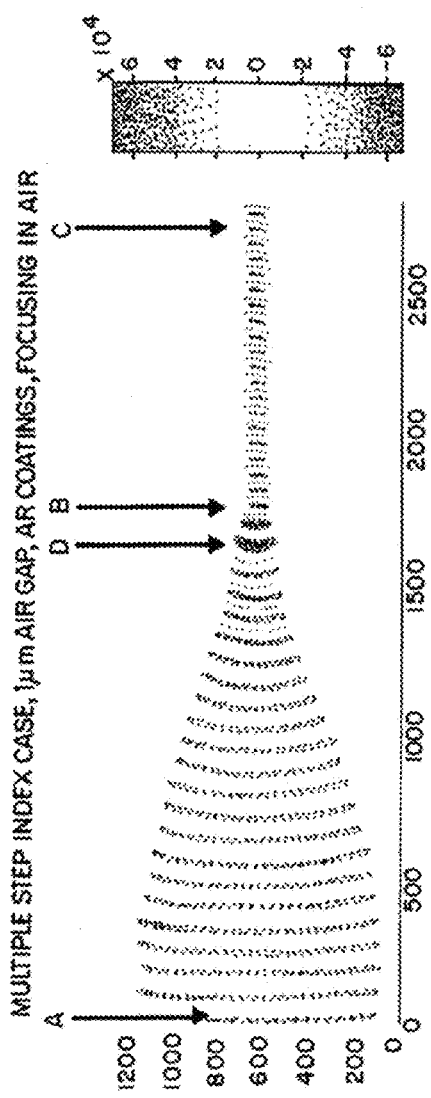
FIG. 14(a)
FIG. 14(b)

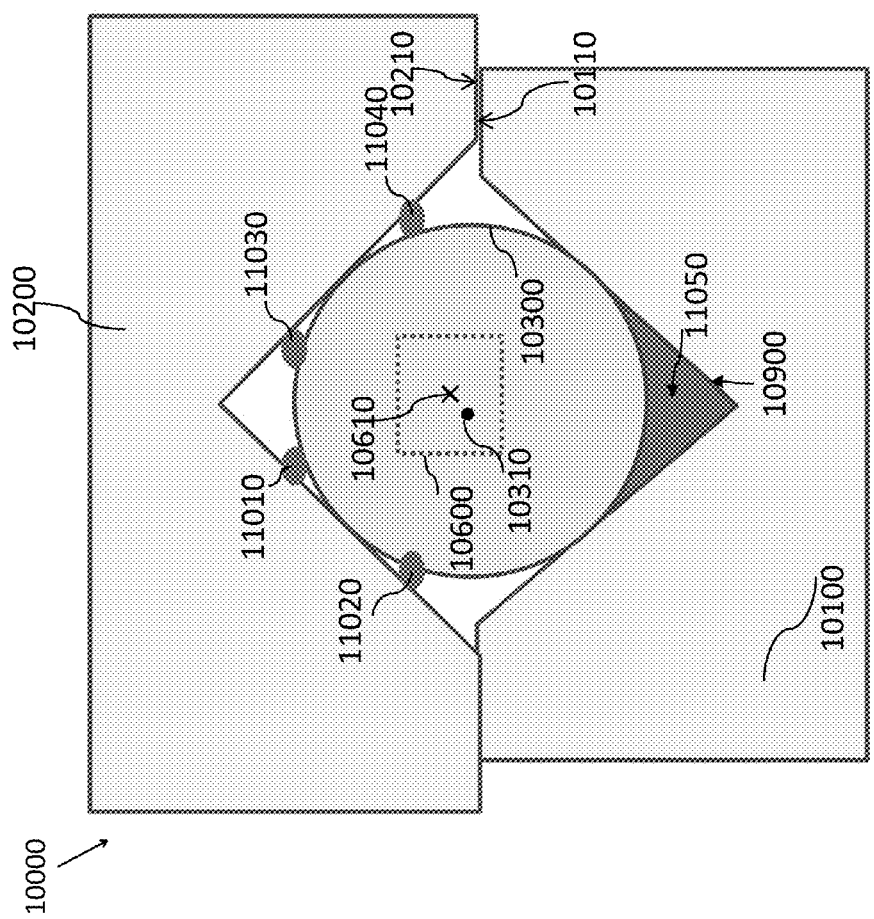

APPARATUS AND METHOD FOR PASSIVE ALIGNMENT OF OPTICAL DEVICES

RELATED APPLICATIONS

The present patent document is a continuation-in-part of U.S. Pat. No. 8,538,208, issued on Sep. 17, 2013, which is a continuation-in-part of U.S. Pat. No. 7,616,856, issued on Nov. 10, 2009, which is a division of U.S. patent application Ser. No. 10/652,269, filed Aug. 28, 2003, now U.S. Pat. No. 7,426,328, which claims the benefit of the filing date under 35 U.S.C. §119(e) of U.S. Provisional Patent Application Ser. No. 60/406,704, filed Aug. 28, 2002. U.S. Pat. No. 8,538,208 is also a continuation-in-part of U.S. Pat. No. 7,643,719, issued Jan. 5, 2010, which claims the benefit of the filing date under 35 U.S.C. §119(e) of U.S. Provisional Patent Application Ser. No. 60/454,806, filed Mar. 14, 2003. All of the foregoing patent documents are hereby incorporated by reference in their entirety.

TECHNICAL FIELD

The present disclosure is related generally to optical structures and more particularly to passive alignment of optical devices.

BACKGROUND

In the photonics chip industry, one of the basic processes is the transformation of a light beam from a large size to a small size (or vice versa) between two optical waveguides of different mode sizes. However, the light coupling efficiency between the two optical waveguides involved in this basic process is generally low. There are a few commonly used approaches in the present state of the art to make a lens structure that addresses the above needs.

One approach involves using the property of light refraction at an optical interface. By making an optical medium such as a glass into a certain shape such as a ball or sphere, a lens can be made to focus a light beam. U.S. Pat. No. 6,026,206, entitled "Optical Coupler Using Anamorphic Microlens," is an example of one such approach.

Another approach to address the needs is to create a GRIN distribution of an optical medium. Due to the GRIN distribution, the light beam bends as it travels inside the medium. This property is used in achieving light focusing. A commonly used example is an axially symmetric GRIN rod lens, which is used for collimating a light beam emitted from a single mode fiber. U.S. Pat. No. 6,267,915, entitled "Production Method for Objects with Radially-Varying Properties," U.S. Pat. No. 6,128,926, entitled "Graded Index Lens for Fiber Optic Applications and Technique of Fabrication," and U.S. Pat. No. 6,172,817, entitled "Graded Index Lens for Fiber Optic Applications and Technique of Fabrication," are a few examples of this approach.

For coupling of light between a single mode fiber and a semiconductor waveguide based device (such as a semiconductor laser), the most commonly used coupling optics is a lensed fiber. Such a lensed fiber is made by shaping the end of the fiber into a hemispherical or cylindrical lens using lapping and polishing and/or melting means. U.S. Pat. No. 5,845,024, entitled "Optical Fiber with Lens and Method of Manufacturing the Same," and U.S. Pat. No. 6,317,550, entitled "Lensed Optical Fiber," elaborate upon such optical fiber with lens.

However, there are a few problems associated with the above-mentioned lenses. For a symmetric lens element, such as a GRIN rod lens, or a ball lens or a tapered conical lensed fiber, the focused mode profile from a circular optical fiber is circular. As a semiconductor waveguide almost always has an elliptical mode profile, there is a large mode mismatch, which inherently results in low light coupling efficiency. Thus, the coupling efficiency for coupling light between a single mode fiber and a semiconductor waveguide based device cannot be very high. In fact, the coupling efficiency is only as high as about 80% for such lenses.

For reducing the problem of mode mismatch and subsequently increasing light coupling efficiency, wedge fibers can be used. There are generally two kinds of wedge fibers: single wedge fiber and double wedge fibers. Single wedge fibers have an elliptical focused beam spot with the long horizontal axis spot size basically equal to that of the circular single mode fiber spot size. However, as the horizontal axis mode spot size of a semiconductor waveguide (such as a laser diode) is typically only about 3 to 4 µm, and the beam spot size of a single mode fiber is about 6 to 10 µm, there remains a mismatch in the horizontal mode size. A double wedge fiber addresses the problem of mismatch in horizontal mode size. Using a double wedge fiber, the horizontal mode size can be made to match that of a semiconductor waveguide. However, the vertical spot size cannot be made to match with that of a semiconductor waveguide.

The above disadvantage of vertical spot size mismatch is present in all optical-interface-refraction based lenses (including those described above). This is due to the fact that the minimum vertical spot size for these lenses is about 1.5 µm (for the near infrared optical communication spectrum region) while the typical vertical mode size of a semiconductor waveguide is about 1 µm. In addition, for these lenses, especially lensed fibers, there is a large variation in the radius of curvature of the lens because each lens is made individually one at a time through processes, such as arcing or laser melting, that cannot guarantee high precision consistency. Thus, all the above-mentioned lenses will have a relatively low coupling efficiency, and there is a low consistency in the coupling efficiency.

Thus, what is needed in the photonics chip packaging industry is a superlens that can provide a focused beam spot size, and can independently achieve horizontal and vertical phase and/or wave-front matching with those of a semiconductor waveguide. In addition, the vertically focused spot size is preferably the order of about 1 µm in order to match with that of a typical semiconductor waveguide. Such a superlens may allow a light coupling efficiency well above 80% to become practically achievable.

BRIEF SUMMARY

An improved apparatus for passive alignment of optical devices is described herein.

The apparatus comprises a substrate including a trench in a top surface thereof, where the trench has a first end positioned at an edge of the substrate and a second end positioned at an interior region of the substrate, and a lens disposed on the top surface of the substrate adjacent to the second end of the trench. The apparatus further includes a top holder having a longitudinal indentation in a bottom surface thereof for mounting an optical fiber. The longitudinal indentation is sized to fit a top portion of the optical fiber such that a bottom portion of the optical fiber extends below the bottom surface of the top holder when the optical fiber is mounted therein. One or both of the substrate and the top holder include one or more spacer features configured for three-dimensional (3D)

alignment of the lens with the optical fiber when the top holder is brought into contact with the substrate.

A method for passive alignment of optical devices, the method includes: providing a substrate including a trench in a top surface thereof, the trench having a first end positioned at an edge of the substrate and a second end positioned at an interior region of the substrate, a lens being disposed on the top surface of the substrate adjacent to the second end of the trench; mounting an optical fiber in a top holder including a longitudinal indentation in a bottom surface thereof, the longitudinal indentation being sized to fit a top portion of the optical fiber such that a bottom portion of the optical fiber extends below the bottom surface of the top holder; and mounting the top holder on the substrate, the bottom portion of the optical fiber being suspended in the trench, wherein one or more spacer features on one or both of the substrate and the top holder induce three-dimensional (3D) alignment of the optical fiber with the lens during the mounting.

BRIEF DESCRIPTION OF THE DRAWINGS

FIG. 5(a) shows side view of vertically graded refractive index distribution and computer simulation of vertical focusing, FIG. 5(b) shows top view of horizontally curved surface lens and computer simulation of horizontal focusing and FIG. 5(c) shows a three-dimensional view of the invented lens structure;

FIG. 6(a) shows a computer simulation of vertical focusing using pure graded refractive index distribution to a focal length or a quarter of the pitch of the GRIN medium and FIG. 6(b) shows a computer simulation of horizontal focusing using a convex cylindrical input surface or sidewall;

FIG. 9(c) shows an arbitrary curved surfaces to realize arbitrary phase and intensity profile transformation in the horizontal direction for the input beam. FIG. 9(d) shows an arbitrary refractive index profile in vertical direction.

FIGS. 11(a)-11(b) are schematic diagrams representing the use of two materials to realize a parabolic effective refractive index distribution;

FIGS. 11(c)-11(d) are graphs of the effective index distribution as a function of position for the structure in FIGS. 11(a)-11(b);

FIGS. 14(a)-14(b) are graphs of simulated light coupling from a GRIN lens into a mode matched waveguide for a parabolic refractive index distribution realized with two materials and with multiple materials, respectively;

FIG. 33 shows a cross-sectional view of an exemplary alignment apparatus according to a seventh embodiment.

DETAILED DESCRIPTION OF THE DRAWINGS AND THE PRESENTLY PREFERRED EMBODIMENTS

The present disclosure relates to superlens for coupling light between input and output waveguides that allows a change in the vertical location of focus and/or in the mode size of the propagating light. The superlens is capable of providing a wide variety of functionalities by using different refractive index profiles, launching positions, and physical lens shapes. Structures described herein may enable electromagnetic beam transformation or spot size conversion between a large-mode-size and a small-mode-size. In particular, the present disclosure relates to optical structures having an effective graded refractive index (GRIN) distribution in the vertical direction perpendicular to the optical axis of light propagation.

The optical structures may further include a lens-shaped optical interface structure perpendicular to the direction of light propagation. An apparatus that can control the size and the phase of an electromagnetic beam and independently focus it in the vertical and/or horizontal directions is described.

Also described is an apparatus and method for the passive alignment of optical devices, such as an integrated lens and an optical fiber.

To improve the understanding of the present disclosure, fundamental concepts related to the invention are herein described.

As is known to those skilled in the art, an optical fiber guides optical beam in its inner core region as a guided beam mode. The size of a circularly symmetric optical beam mode measured in a direction perpendicular to the direction of beam propagation is typically measured in terms of the beam's radius. The mode radius may be defined as the radius at which the optical beam's intensity drops from its peak value at the beam's center to 1/e of its peak value, where e=2.71828. is known as the Euler's number. For a typical single-mode optical fiber beam mode at the optical communication wavelength of 1550 nm, the beam radius for the guided beam mode in the fiber is around 4 to 5 micrometers.

Fundamental Concepts:

An electromagnetic wave is characterized by a wavelength and a frequency with which it oscillates. Further, the electromagnetic wave travels at a speed that depends on the medium through which it is traveling. The speed of the electromagnetic wave decreases as it travels from vacuum to a medium. The ratio of the speed of electromagnetic wave in vacuum (c) and the speed in the medium (v) is a property of the medium and is referred to as the refractive index (n) of the medium.

When the electromagnetic wave travels through a medium, the frequency of the electromagnetic wave is unchanged while the wavelength is reduced from $\lambda_0$ in vacuum to $\lambda_{eff}=\lambda_0/n$ in the dielectric medium.

Figure 1:
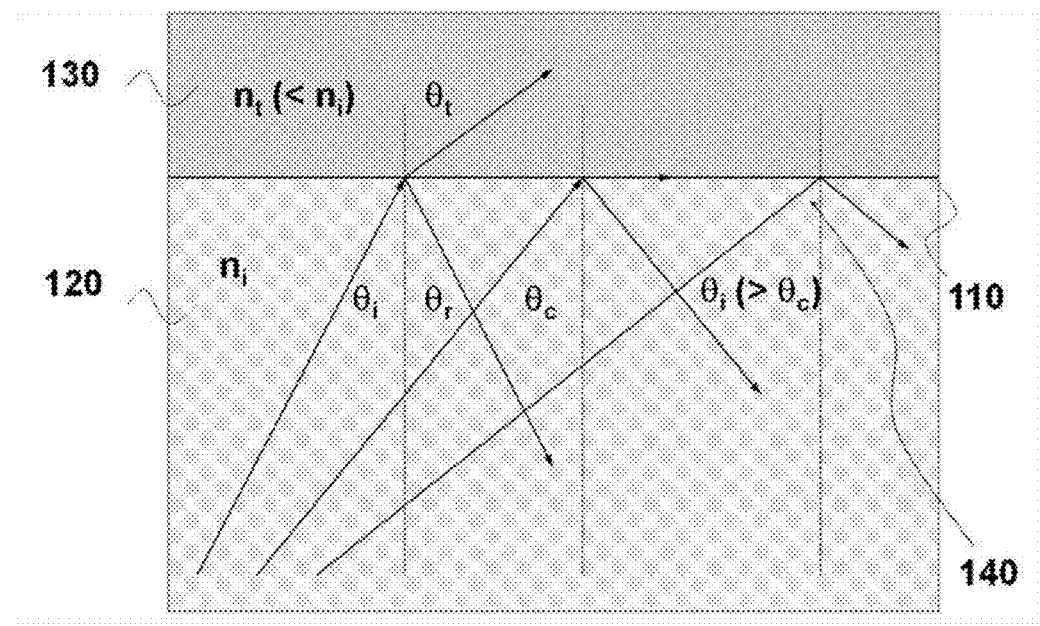
FIG. 1 illustrates the concept of light reflection, refraction and total internal reflection at an optical interface.

Electromagnetic wave can be assumed to be a ray traveling in a straight line within a medium of the same refractive index if the size of the medium (such as a lens) is much greater than (about ten times) the wavelength of the electromagnetic wave. The electromagnetic wave undergoes refraction as well as reflection when it travels from one medium to the other medium. For example, FIG. 1 shows an optical interface 110 between two media 120 and 130. Medium 120 has refractive index $n_i$ and medium 130 has refractive index $n_t$. An electromagnetic wave ray is reflected back into the first medium 120 and also refracted/transmitted into the second medium 130. According to the law of reflection, the angle of incidence ($\theta_i$) of the incident electromagnetic wave ray equals the angle of reflection ($\theta_r$) of the reflected electromagnetic wave ray. Further, Snell's law of refraction states that the refraction angle ($\theta_t$) is related to the incidence angle ($\theta_i$) through the equation $$n_i \sin \theta_i = n_t \sin \theta_t$$

Figure 2:
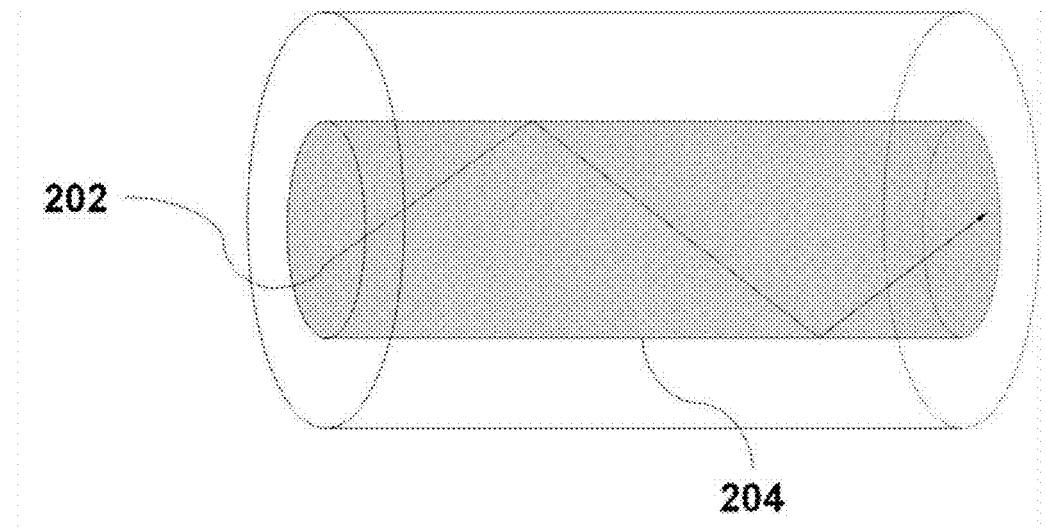
FIG. 2 shows the manner in which light is guided in a step refractive index waveguide, such as an optical fiber, through successive total internal reflection.

However, if $n_i > n_t$, as $\theta_i$ increases to a particular value called the critical angle, $\theta_t$ will reach 90°, and afterwards, the incident electromagnetic ray is totally reflected as is shown for electromagnetic ray 140. This phenomenon is referred to as total internal reflection. The concept of total internal reflection is used in various practical applications. For example, total internal reflection is used to guide electromagnetic wave through a step refractive index optical waveguide or fiber as shown in FIG. 2. In FIG. 2, incident electromagnetic wave 202 strikes the wall of optical waveguide 204 at an angle that is greater than the critical angle for the optical waveguide. Hence, the electromagnetic wave undergoes total internal reflection resulting in the transmission of the electromagnetic wave through the waveguide.

Figure 3:
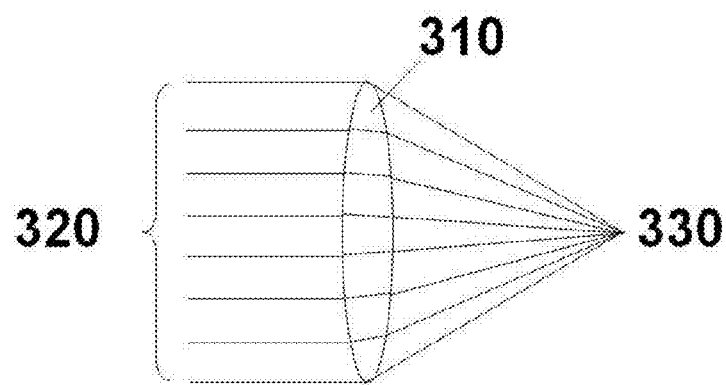
FIG. 3(a) shows ray optics picture of focusing a parallel light beam using a lens and FIG. 3(b) shows computer simulated wave picture of focusing a parallel light beam using a lens.
Figure 3:
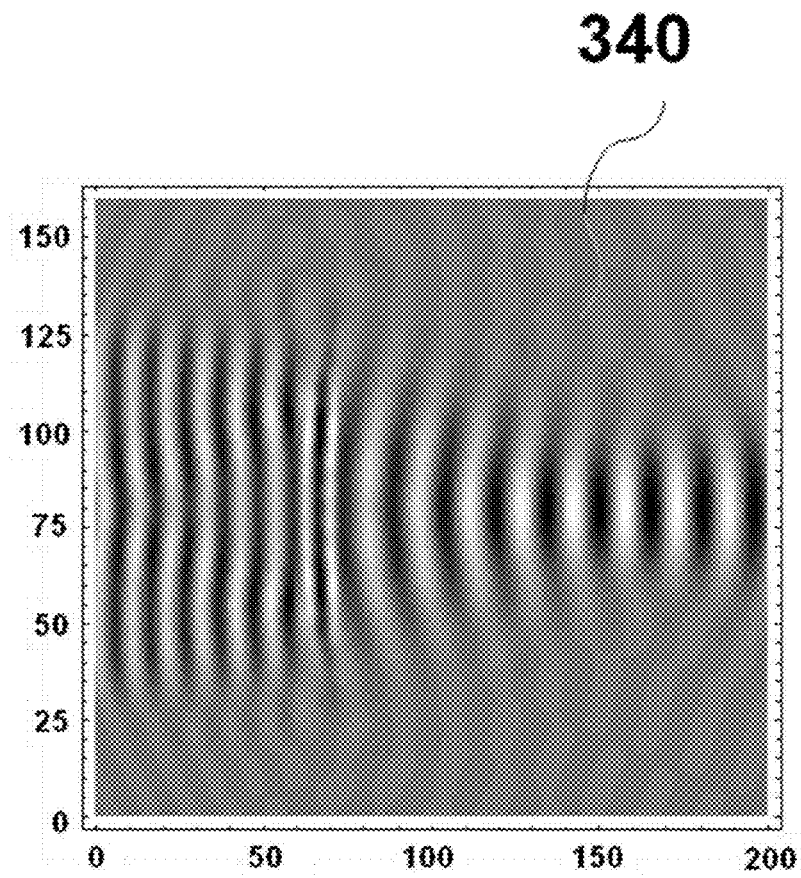

An optical interface between two media can be shaped into a curved surface. The curved surface so generated is also referred to as lens. For example, FIG. 3(a) shows a lens 310 that is constructed by shaping an optical interface into a convex or concave curved surface form. A parallel beam of electromagnetic wave can be regarded as being made up of a number of parallel rays 320. As shown in FIG. 3(a), curved surface lens 310 can be made to enable parallel incident rays 320 to focus to a single point 330 in space. This is because the outer rays are refracted more than the central rays as governed by Snell's law of refraction so that all the rays converge to one point.

However, Snell's law is based on the assumption that the electromagnetic wave has infinite wavelength. In reality, an electromagnetic wave has a finite wavelength; hence the focused electromagnetic wave beam cannot have an infinitely small spot size but a finite spot size. For example, FIG. 3(b) shows a computer simulation of a focusing lens based on the wave theory and it can be seen that the focused electromagnetic wave beam has a limited spot size 340 with a certain intensity distribution.

Figure 4:
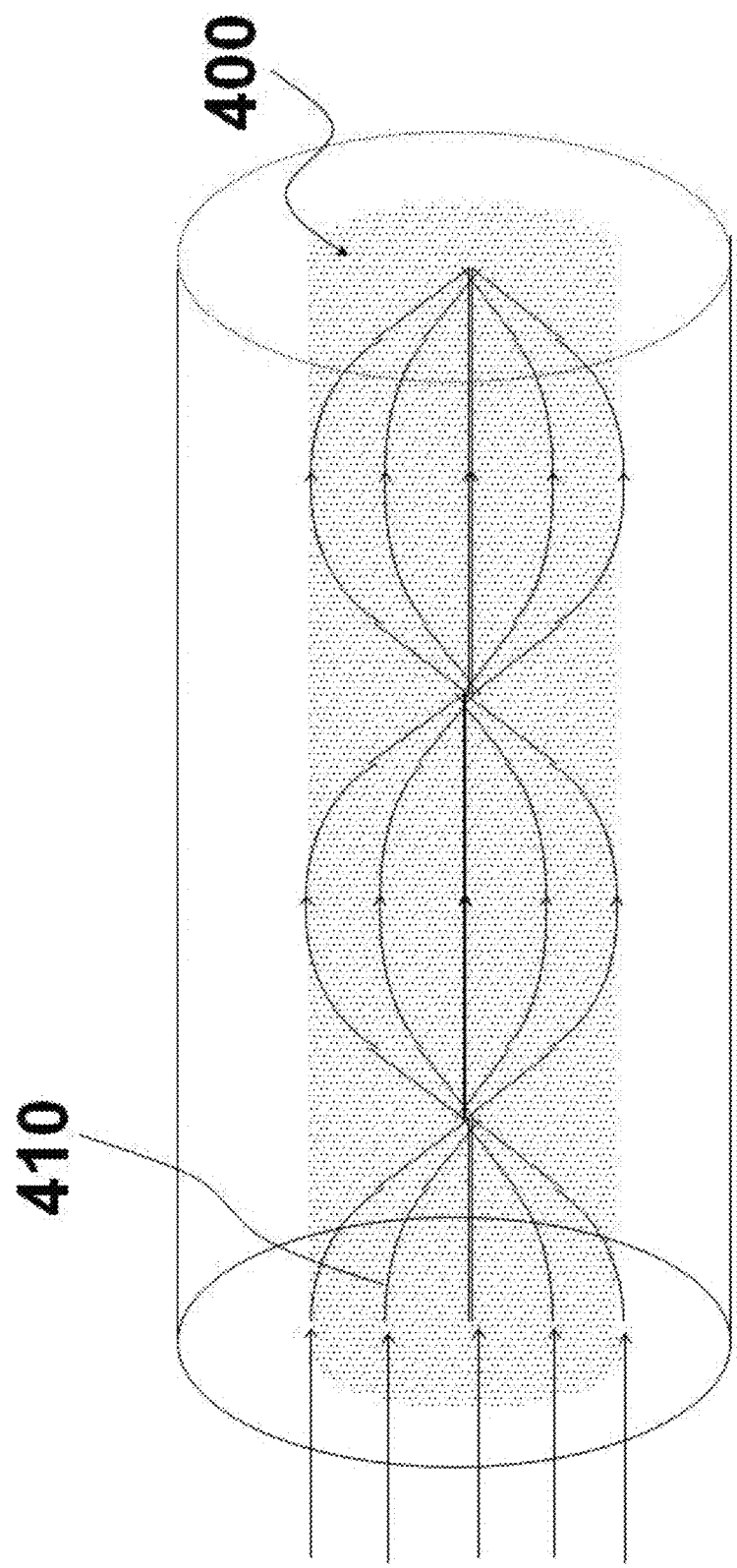
FIG. 4 shows ray optics picture of light beam propagation in a graded refractive index ("GRIN") optical medium.

The refractive index of a medium can be constant or varying from one point in the medium to the other. For example, FIG. 4 shows a graded refractive index ("GRIN") optical medium 400. The material of GRIN optical medium 400 has refractive index n(r) that decreases continuously from a value of $n_0$ at the central or middle axis (r=0) to a value of $n_b$ at the outside border (r=a). The distance r=a is defined as the distance from the central axis to the border of the GRIN medium. In this example, n(r) has a parabolic refractive index distribution given by the formula:

$$n(r) = n_o\left[1 - \Delta\left(\frac{r}{a}\right)^2\right],$$

where $$\Delta = \frac{n_0 - n_0}{n_0}.$$

This refractive index distribution causes electromagnetic wave rays 410 propagating longitudinally through GRIN optical medium 400 to bend towards the central axis and to be periodically refocused. If GRIN optical medium 400 is cut to the right length, the GRIN optical medium 400 can function as a lens to focus or expand and collimate a beam of electromagnetic wave. The focal length (f) (also called a quarter of the pitch) of such a GRIN medium is approximated by the following formula.

$$f = \frac{a\pi}{2\sqrt{2\Delta}}$$

In general, the focused spot size for any light beam or pulse is finite. The shorter the focal length of the lens, the smaller the focused spot size. Accordingly, a smaller focused spot size can be achieved by increasing Δ (which is dominated by the index change between the central axis and the outside border), by decreasing α (the distance between the central axis and the outside border), or both. At the same time, there is a physical diffraction limit; consequently, the smallest focused spot size of any wave will only be about the size of the wavelength in the medium where focusing occurs. In the case of a GRIN lens, the focused light beam is located near the central axis, where the refractive index is the highest. Hence, if a high refractive index material is used at the central axis, a much smaller diffraction limited beam spot size can be achieved because the wavelength of light in a material is equal to the vacuum wavelength divided by the refractive index of the material. If the focused light beam is coupled into another mode matched waveguide, a highly efficient light coupling between the GRIN lens and the waveguide can be achieved, as will be described further below.

For example, an apparatus may combine a vertically GRIN multilayer structure with a curved sidewall surface lens structure. This combination creates a two-dimensional lens that can independently focus an electromagnetic wave beam in the vertical and horizontal directions. In a preferred embodiment, the electromagnetic wave beam is a light beam. The combined structure may be referred to as a superlens. FIGS. 5(*a*), 5(*b*) and 5(*c*) show a preferred embodiment of the superlens. FIG. 5(*a*) shows the side view of a vertically GRIN lens structure. FIG. 5(*b*) gives the top view of the preferred horizontally curved surface cylindrical lens structure, and FIG. 5(*c*) shows a 3-dimensional view of the preferred lens structure.

The superlens may be used for simultaneous focusing of a light beam to the same focal plane along the optical axis in both the vertical direction and the horizontal direction. Independent control for focusing the light beam also allows a user to offset the vertical and horizontal focal planes. Further, the superlens allows the user to control the phase or wavefront of the incident light beam in such a way that the focused light beam can be deliberately made properly astigmatic. This may be used to match desired offset for some channel optical waveguide devices, such as some semiconductor lasers for which the vertical and horizontal beam waists are not at the same location along the optical axis. The method to control vertical and horizontal focusing is further described using FIG. 6(*a*) and FIG. 6(*b*).

FIG. 6(*a*) and FIG. 6(*b*) respectively show computer simulation of vertical focusing using a pure GRIN distribution and horizontal focusing using a convex cylindrical input surface or sidewall. For the sake of illustration, it is assumed that superlens 600 has a height of 12 μm and a width of 12 μm. Further, the light beam is circular in shape and has a diameter of 10 μm. The diameter of the light beam corresponds to a typical mode size of a standard single mode optical fiber at a wavelength of 1.55 μm in vacuum. Thickness of superlens 600 is assumed to be 16 μm, which is equal to the focal length of the vertical GRIN medium. This ensures that a parallel beam incident on superlens 600 is vertically focused with the vertical focal plane substantially close to the output or exit optical interface. Note that the example is chosen only for the purpose of illustration, and in no way should it be construed as limiting the scope of the invention, which, in turn, is determined by the appended claims.

Horizontal focusing using superlens 600 is done by creating a horizontal curved sidewall on the input side of superlens 600. The curved surface can be of various forms such as cylindrical, spherical, aspherical and toric. In a preferred embodiment, a convex cylindrical curved surface is used for the superlens. Further, the horizontal and vertical focusing are done in a common focal plane by proper selection of the radius of curvature $R_1$ of the cylindrical curved surface.

A feature of the horizontal and vertical focusing is that the depth of focus for the horizontal focusing is larger than that for the vertical case. This is because the vertical focusing power is higher than the horizontal one or the vertically focused spot size is smaller than the horizontal one.

The method of vertical and horizontal focusing is now further described. For the sake of illustration, assume that superlens 600 has a GRIN distribution $n(r)=n_0[1-\Delta(r/a)]$, where $\Delta=(n_0-n_b)/n_0$, $\delta n=n_0-n_b$ and vertical focal length (f) is $f=a\pi/(2\sqrt{2\Delta})$. Possible methods to independently control the spot size vertically as well as horizontally are described herein after.

One simple method to adjust the vertical focused spot size to a large value is to etch superlens 600 to a smaller total thickness (also called length) so that electromagnetic beam focusing occurs in the next uniform optical medium. In most practical cases, the next uniform optical medium is air with a refractive index of one. This method is further described using FIG. 7(*a*) to FIG. 7(*g*).

FIG. 7(*a*) to FIG. 7(*g*) show the computer simulation of an exemplary vertical GRIN medium with refractive index distribution $n(y)=2.05-0.3(y/6\,\mu m)^2$ with various total thickness and the computer simulation of light beam focusing for each case. This distribution is chosen only for the purpose of illustration, and there are numerous other distributions that achieve the same result. The parallel circular input light beam size is assumed to be 10 μm, which corresponds to the typical mode size of a standard single mode optical fiber. FIG. 7(a) to FIG. 7(g) show that with the reduction of the total length or thickness of the vertically GRIN medium from 16 μm to 4 μm, the vertically focused light beam spot size is monotonically increased. Additionally, the focal plane is also moved towards the input side of the GRIN medium.

There is a practical limit to the smallest total thickness of the lens, and as photolithography is used to make a dry etch mask, a reasonable thickness limit is about 4 μm. Since the vertically focused spot size increases as the lens thickness decreases, and also there is a limit to the practical lens thickness, one method to enhance the range of vertically focused spot size is to come up with a few standard vertical GRIN distributions. Some of the distributions have very strong focusing power and others have less focusing power. Further, each GRIN distribution may be etched into different lens thickness. For example, to cover a range of vertical spot size from 1 μm to 5 μm, two standard GRIN distributions are such that one has a smallest focused spot size of 1 μm and the other has a smallest focused spot size of 3 μm. Additionally, in FIG. 7(a) to FIG. 7(g), along with the decrease in the GRIN medium thickness, the focused spot size can actually be controlled to vary from around 1 μm to around 3 μm.

While vertical focusing may be controlled by controlling the thickness of the superlens, horizontal focusing may be controlled by giving proper shape to the curved sidewall. This control involves design and etching of the curved input and output sidewalls to adjust the sidewall surface profile. In one preferred embodiment, the design should be such that the horizontal focal plane coincides with the vertical focal plane and the horizontal focused spot size can be controlled to a desirable value. The method to control horizontal spot size is further explained using FIG. 8(a) to FIG. 8(g).

Figure 7A:
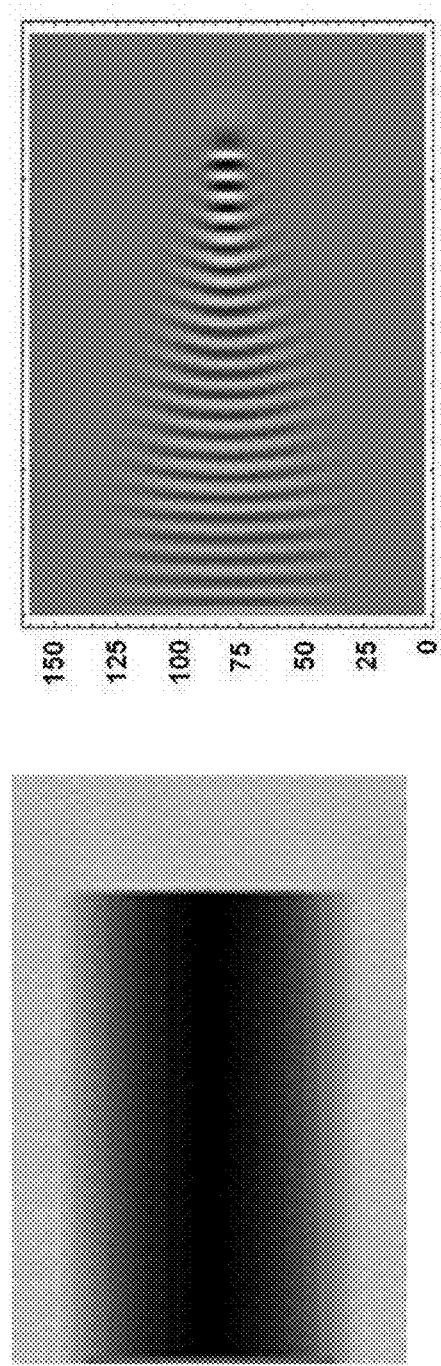
FIG. 7 shows computer simulation of vertical focusing (a) when the GRIN medium thickness is equal to 16 μm, which is just a quarter of the pitch of the GRIN distribution, (b) when the GRIN medium thickness is equal to 14 μm; (c) when the GRIN medium thickness is equal to 12 μm, (d) when the GRIN medium thickness is equal to 10 μm, (e) when the GRIN medium thickness is equal to 8 μm, (f) when the GRIN medium thickness is equal to 6 μm and (g) when the GRIN medium thickness is equal to 4 μm.
Figure 7B:
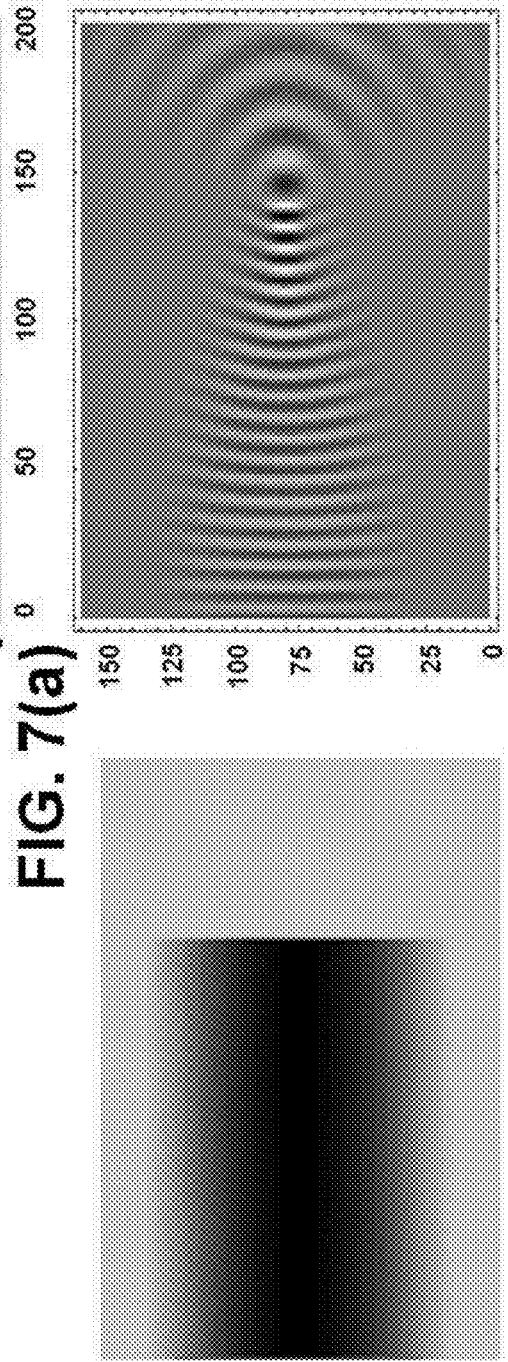
Figure 7C:
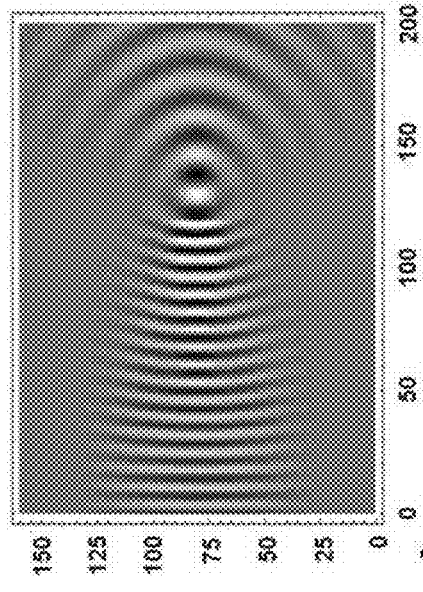
Figure 7D:
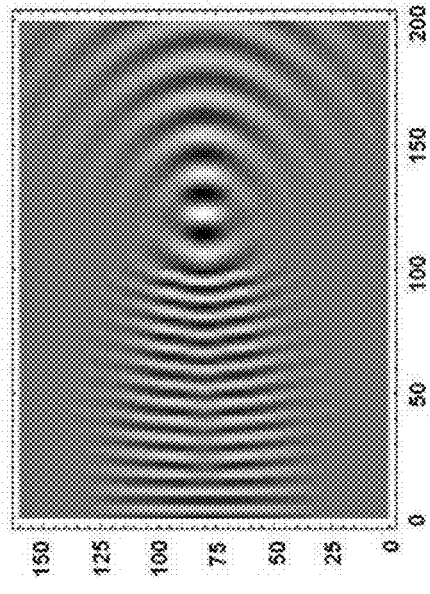
Figure 7G:
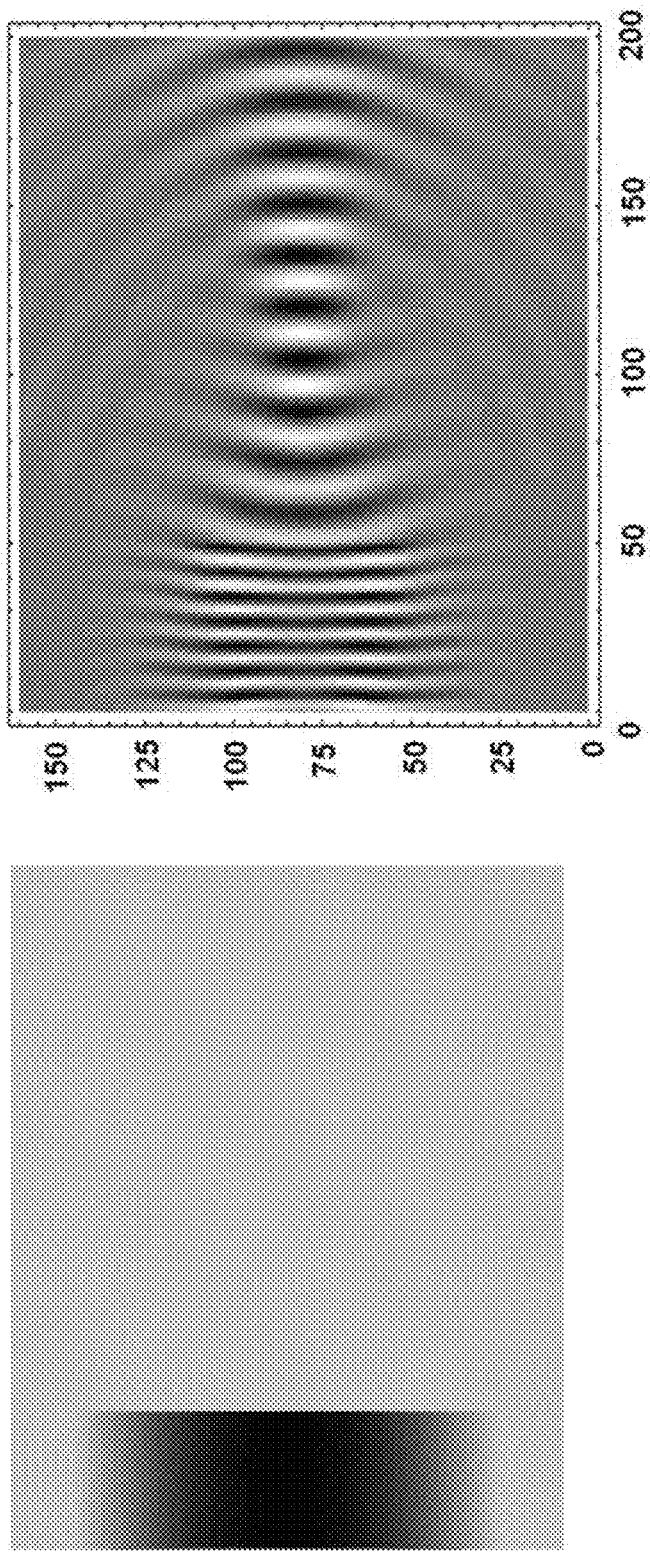
Figure 8G:
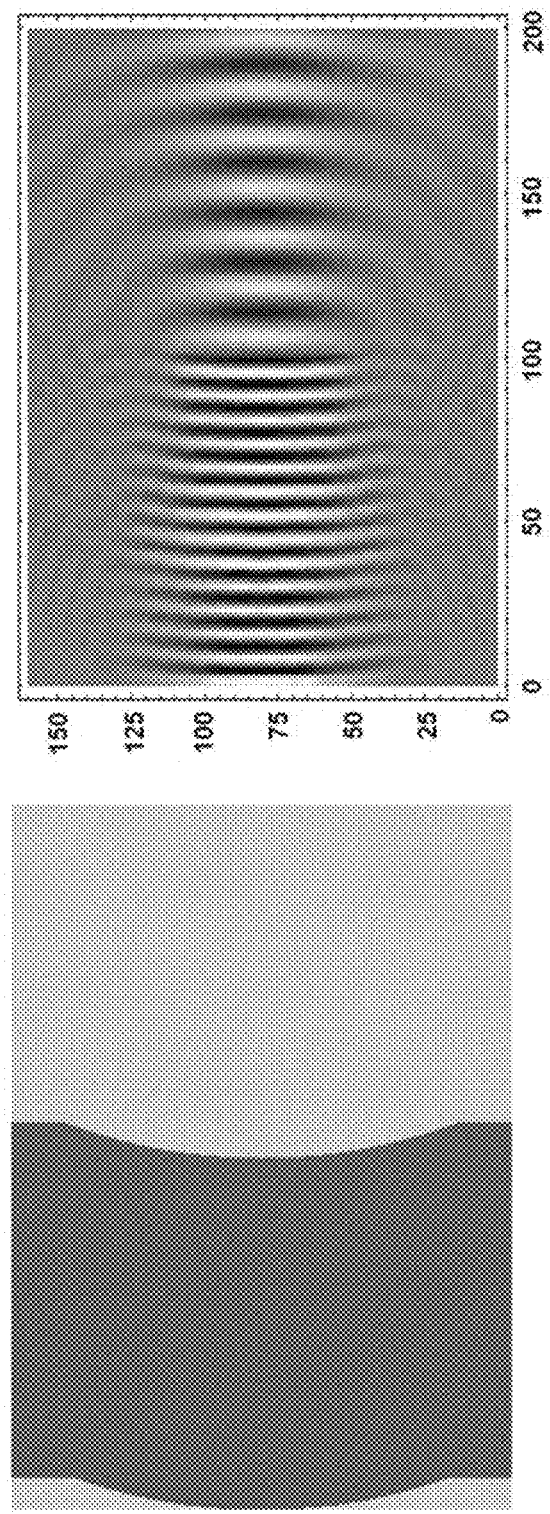
FIG. 8 shows horizontal cylindrical lens and their corresponding horizontally focused beam spot sizes for varying dimensions: (a) thickness T=10 μm, first radius R1=8 μm, second radius R2=8 μm, (b) thickness T=10 μm, first radius R1=10 μm, second radius R2=10 μm, (c) thickness T=10 μm, first radius R1=12 μm, second radius R2=12 μm, (d) thickness T=10 μm, first radius R1=14 μm, second radius R2=14 μm, (e) thickness T=10 μm, first radius R1=16 μm, second radius R2=16 μm, (f) thickness T=10 μm, first radius R1=18 μm, second radius R2=18 μm and (g) thickness T=10 μm, first radius R1=20 μm, second radius R2=20 μm.

FIG. 8(a) to FIG. 8(g) corresponds to the case of FIG. 7(d) in which the vertical GRIN medium has a thickness of 10 μm and the vertical focal plane is located at about 12 μm from the input side. Horizontal focusing is a function of the radius of curvature of the input and output cylindrical sidewalls. In this example, the first radius R1 of the input cylindrically convex surface is designed to be equal to second radius R2 of the output cylindrically concave surface. By keeping the two radii of curvature of the two sidewalls substantially equal to each other but with the first one convex and the second one concave, the focal plane is more or less maintained at the same location of about 12 μm from the input side of the superlens. FIG. 8(a) to FIG. 8(g) show that as the radius of curvature of the horizontally cylindrical sidewall is increased, the focused electromagnetic beam size also increases.

A point to note is that in the computer simulation the refractive index of the superlens medium is assumed to be equal to 2.05, which is the central refractive index of the assumed GRIN distribution. Central refractive index is chosen over the average refractive index for the GRIN distribution because most of the optical energy of a Gaussian electromagnetic beam (this is the case for an electromagnetic beam in an optical fiber or in a semiconductor channel waveguide) is located in the central region. Furthermore, in this case the optical axis of the input and output waveguides are aligned along the central axis of the superlens. In addition, since the GRIN distribution is assumed parabolic, a major part of the GRIN distribution has a refractive index that is close to the central refractive index.

Further, the vertically central portion of the beam is horizontally focused more strongly than the vertical non-border portion of the beam. This is due to the difference of the refractive index in the vertical direction as one moves from the central axis to the border. This slight deviation causes the focused electromagnetic beam not to be perfectly Gaussian in the horizontal direction. However, the computer simulation shows that the influence to the overall light coupling efficiency is minimal once the mode size and phase are matched for the central portion of the light beam. In an alternative embodiment, this problem can be overcome by etching the input and the output sidewalls of the lens into a three dimensional curved surface such that along with the departure from the vertical central region of the GRIN distribution, the horizontal radius of curvature is made to have a smaller value gradually to balance out the effect of the refractive index decrease. This ensures that the vertical border portion of the electromagnetic beam is focused by the same amount as the vertical central portion of the beam.

The input sidewall may be taken to be convex and output sidewall to be concave. However, the above method for horizontal and vertical focusing can also be applied for other shapes of sidewalls. Furthermore, if the thickness of the superlens is very small, the lens may achieve a relatively small horizontal focused spot size and at the same time keep the horizontal focal plane to coincide with the vertical focal plane. This feature is further highlighted using the example described in FIG. 9(a) and FIG. 9(b).

Figure 9A:
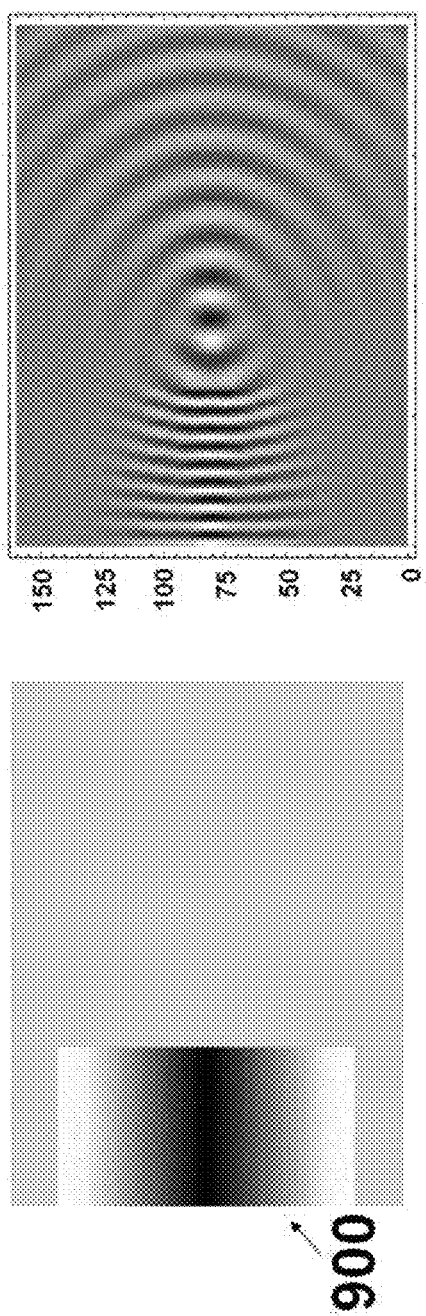
FIG. 9(a) shows computer simulation of vertical focusing when a strong focusing GRIN medium (with $n_0$=2.2 and $n_b$=1.5) has a thickness of 6 μm
Figure 9B:
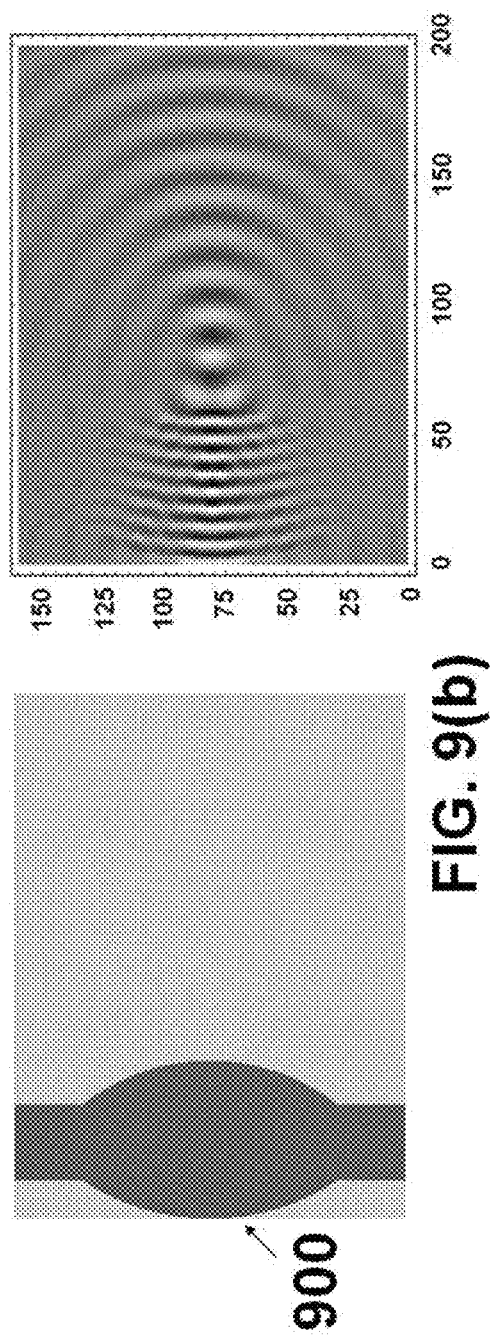
FIG. 9(b) shows computer simulation of horizontal focusing of a bi-convex cylindrical lens with refractive index n=2.2, first radius of curvature R1=10, second radius of curvature R2=-9 and lens thickness T=6 μm.
Figure 10A:
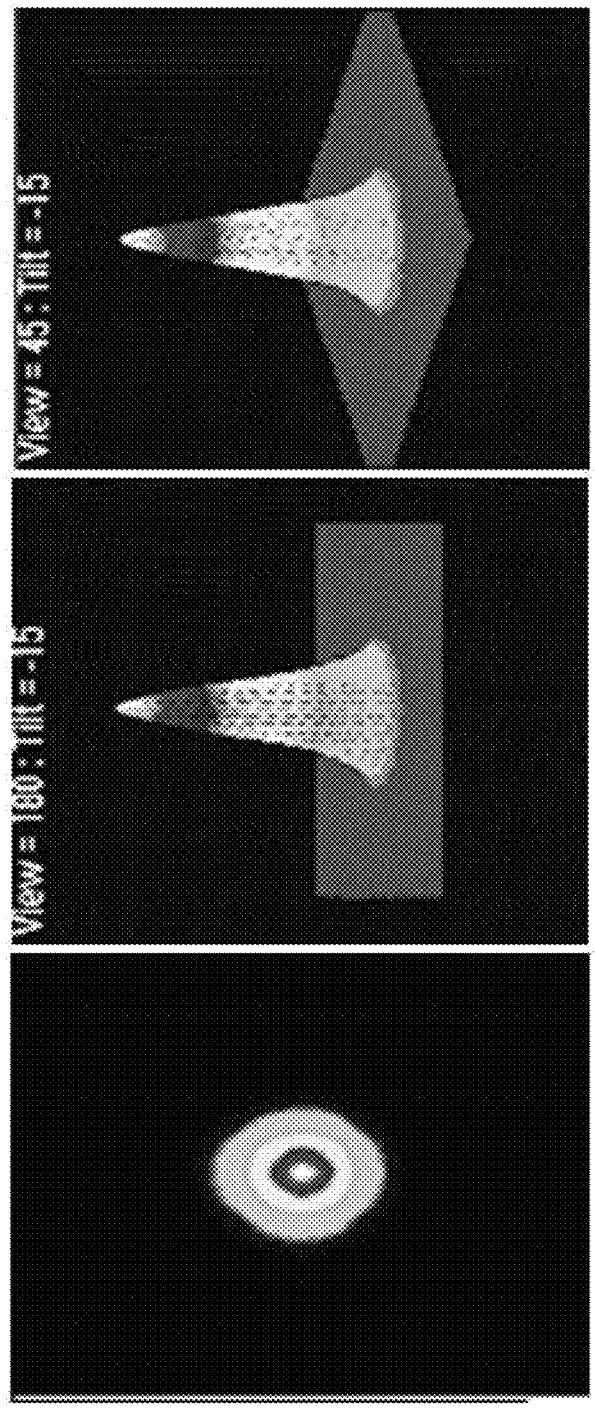
FIG. 10 shows measured focus spot sizes along with the corresponding optical device: (a) size of about 10 μm by 10 μm from a standard single mode fiber, (b) size of about 4 μm by 10 μm from a wedge fiber, (c) size of about 4 μm by 3.5 μm from a conical lensed fiber, (d) size of about 1 μm by 4 μm from our superlens and (e) size of about 1 μm by 3.5 μm from a semiconductor laser.
Figure 10B:
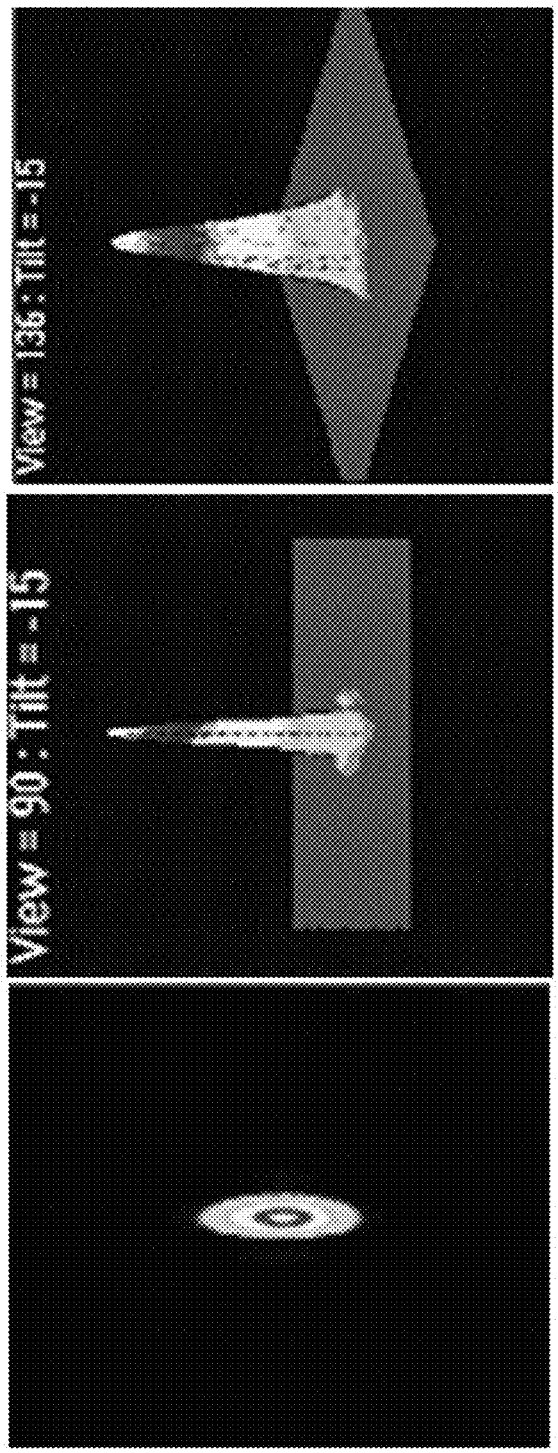
Figure 10D:
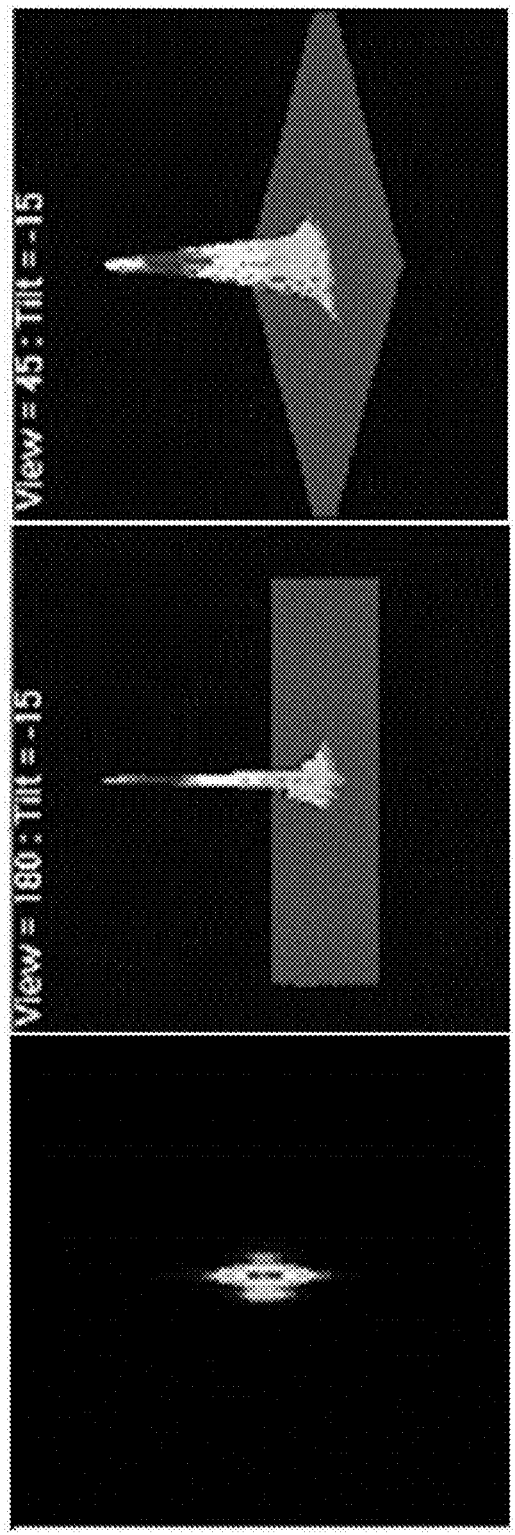
Figure 10E:
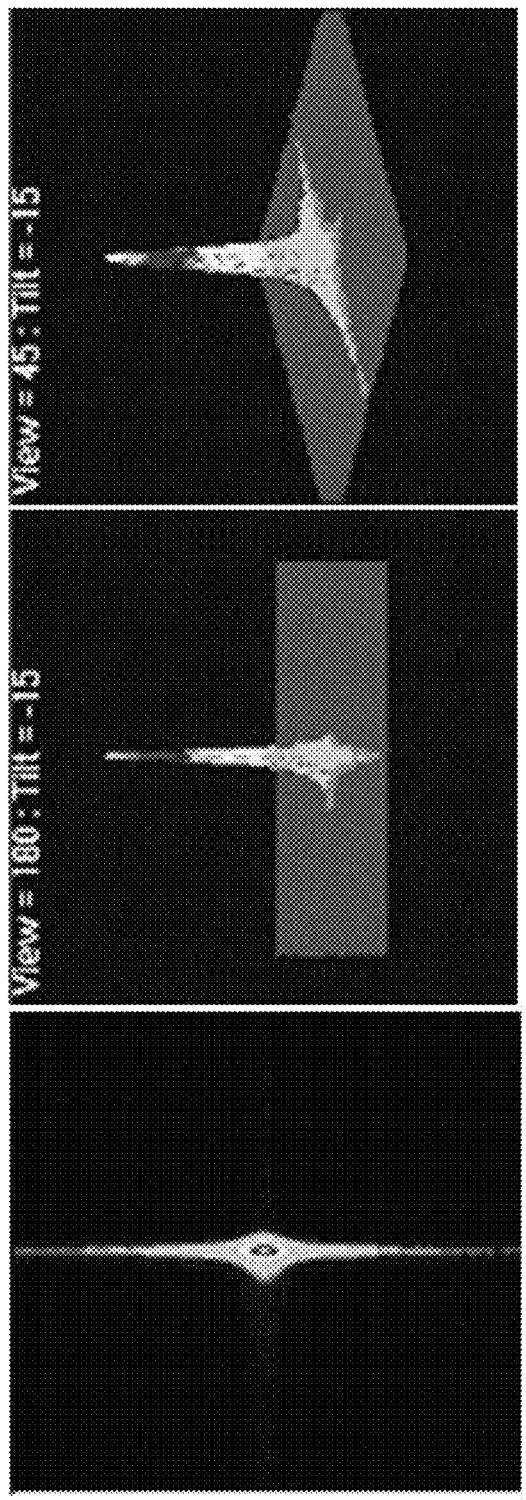

The example in FIG. 9(a) and FIG. 9(b) shows an alternate embodiment of a superlens 900 that has convex input and output sidewalls. In FIG. 9(a), the vertical parabolic GRIN medium has a relatively strong focusing power with refractive index at the center $n_0=2.2$ and refractive index at the border $n_b=1.5$ and the thickness of the lens T=6 μm. The vertical focal plane is located in air at about 8.5 μm from the input side of the superlens. FIG. 9(b) shows the horizontal structure of superlens 900 and the computer simulation of light propagation. The assumed values for the horizontal superlens curved surface are: refractive index n=2.2, first radius of curvature R1=10, second radius of curvature R2=−9 and superlens thickness T=6 μm. The computer simulation in FIGS. 9(a) and (b) shows that the 10 μm wide parallel incident light beam can be made to focus horizontally at the same distance from the input surface as that for the vertically focused beam. This example shows that in addition to the vertically GRIN distribution, both the first or input sidewall and the second or output sidewall can be made to have different sidewall surface profiles to accommodate various requirements and applications.

The method of horizontal and vertical focusing described above allows transformation of an electromagnetic beam to various circular or elliptical or other desirable intensity profiles. Furthermore, the method also accommodates various phase matching needs. For example, in the case of beam size transformation from a single mode fiber to a semiconductor channel waveguide, the vertically focused beam size can be controlled to vary from 0.5 μm to 10 μm, and the horizontally focused beam size can be controlled to vary from 2 μm to 10 μm. Such a wide range is beneficial to the current photonics chip packaging industry simply because other lenses known in the art cannot focus a light beam to less than 1.5 μm in the vertical direction, and the required vertically focused beam size is about 1 μm, which can be easily achieved with superlens described herein. As the horizontal curved surfaces are defined by lithography and etching, arbitrary curved surfaces can be formed to realize arbitrary phase and intensity profile transformation in the horizontal direction for the input beam.

An example of such arbitrary profile is illustrated in FIG. 9(c), wherein the front and back curve surfaces of the lens have curvilinear shape shown in 1000. Likewise, as the graded refractive index profile can be fabricated by material deposition, an arbitrary refractive index profile can be formed to realize arbitrary phase and intensity profile transformation in the vertical direction for the input beam. An example of such arbitrary profile is illustrated in FIG. 9(d), wherein the refractive index is peaked at a location below the middle of the lens with the varying refractive index profile n (y) shown in 1100.

The advantage of the improved technology over the existing technology is further highlighted using FIG. 10. FIG. 10 gives a comparison of the measured light output spot size from a single mode fiber as shown in FIG. 10(a), a wedge fiber as shown in FIG. 10(b), a conical lensed fiber as shown in FIG. 10(c), an exemplary superlens as shown in FIG. 10(d) and a standard semiconductor laser as shown in FIG. 10(e). The focused spot size from the superlens shown in FIG. 10(d) matches very well with the spot size of the measured semiconductor laser, while there is a relatively large mismatch for either the wedge fiber or the conically tapered lensed fiber. Furthermore, the superlens also achieves a coupling efficiency that is about 10 to 20% higher than the existing commercially available conical lensed fibers or wedge fibers.

The optical medium on the left of the superlens is assumed to be the same as the optical medium on the right of the superlens. However, the optical medium on the left of the superlens can also be different from the optical medium on the right of the superlens. This optical medium may be an optical fiber. Further, there can be a small air gap between the optical fiber end face and the superlens input sidewall.

An anti-reflection coating may be deposited on both the left and the right sidewall of the superlens to substantially reduce reflection at the two optical interfaces. For example, on the left side, if there is a small air gap between the optical fiber end face and the superlens input sidewall, then an anti-reflection coating can be deposited on both the fiber-to-air interface and the air-to-superlens interface to increase light transmission and therefore increase light coupling efficiency. The anti-reflection coating design depends on the refractive index distribution of the superlens, and may be based on either the central refractive index or the average refractive index or an optimized equivalent refractive index that will lead a maximum light transmission.

The light transmission efficiency can be further improved by filling the air gap with a third optical medium. Such a medium can be properly selected to have a refractive index that matches the fiber core refractive index. The matching of refractive index between the fiber core and third optical medium ensures that there is only one optical interface between the fiber core and the superlens material. The anti-reflection coating can then be properly designed to maximize light transmission across this interface.

Similarly, on the right side of the lens, a semiconductor waveguide can be butt-joined to the superlens with a tiny air gap. Again, anti-reflection coatings can be deposited on either the superlens sidewall, or the semiconductor end face (depending on whether this is needed) or on both surfaces. In a similar way, the air gap can be filled with another optical medium, which may or may not need to serve any index matching purposes. For example, a fiber can be placed on the left side of the superlens and a photonic chip on the right side of the superlens. In this case both the left air gap and the right air gap are filled with the same optical medium such as an optical gel or a transparent optical polymer that is refractive index matched to the fiber core. The anti-reflection coating can then be deposited on the required surfaces to maximize light transmission.

The GRIN distribution is not limited to parabolic distribution but includes half-parabolic and other asymmetric or arbitrary distributions. For example, a proper choice of the GRIN distribution (not necessarily parabolic) can used to match a focused light intensity profile that is not Gaussian. Further, the electromagnetic wave spectrum covers all wavelength regions such as visible, infrared, radio frequency (RF), and TeraHertz waves.

It will also be appreciated that GRIN devices may allow for fine control and tuning of the refractive index and refractive index distribution to achieve a precise, arbitrary refractive index profile, thereby allowing precise shaping of the optical spot size and mode (wavefront) profile of transmitted light. Thus, such multilayer devices are also suitable for use in a variety of optical applications, including applications where the difference in refractive index is small (e.g., less than 0.2).

In principle, a graded refractive index distribution can be constructed from multiple thin layers of optical media with different refractive indices. If the layer thickness is small enough, there is a negligible difference in the focusing effect between a continuously graded refractive index distribution and a step graded refractive index distribution provided by multiple thin layers of materials with different refractive indices. For example, a parabolic refractive index distribution can be produced by depositing multiple thin layers of different materials selected so that the refractive index decreases with distance from the central axis.

Two (or more) materials having a relatively large refractive index difference may be employed to create a structure having a graded refractive index (e.g., a parabolic distribution). By using a high refractive index material such as silicon (n=3.4), the refractive index at the central axis of the parabolic GRIN structure can be made quite high, and hence the spot size of the focused light beam can be quite small (e.g., less than 0.5 µm for light having a wavelength of 1.5 µm in air).

When an optical medium with a dimension that is substantially smaller than the effective wavelength of light is embedded in another optical medium of a different refractive index, the result is an effective refractive index with a value between those of the two optical media. FIGS. 11(a)-11(d) illustrate the principle. A medium 200 provides an approximately continuous parabolic refractive index distribution by using multiple layers 205 of materials having different refractive indexes as shown in FIG. 11(a). Each layer 205 is constructed from a number of thin layers 212, 214 of two materials of different refractive indices, as shown in FIG. 11(b). Each material's optical thickness is substantially less than the effective wavelength of light in the material. The effective refractive index 215, illustrated in FIGS. 11(c)-11(d), is approximately $$n_{\mathit{eff}} = \frac{n_1 L_1 + n_2 L_2}{L_1 + L_2},$$

where $n_1$ and $n_2$ are the refractive indexes of the two materials respectively, and $L_1$ and $L_2$, are the total thickness of the respective materials within a local region larger than the effective wavelength of the light. This can be generalized to a medium with a mixture of two particles with different refractive indices, in which $$n_{eff} = \frac{n_2\left[\frac{V_1}{V_2}\frac{n_1}{n_2} + 1\right]}{\left[\frac{V_1}{V_2} + 1\right]},$$

in which $V_1$ and $V_2$ are the volumes of the first and second materials. Other layers in medium 200 are made of the same materials, but with different thicknesses $L_1$ and $L_2$, thereby providing different $n_{eff}$.

There are concerns about the effectiveness of using two materials to achieve the effect of a real continuous refractive index distribution. One concern is the light transmission efficiency through the many optical interfaces of the structure. A second concern is how effectively this structure focuses light. A third concern is the total amount of light that will be lost when light is focused using this structure. These concerns are now addressed.

Figure 12:
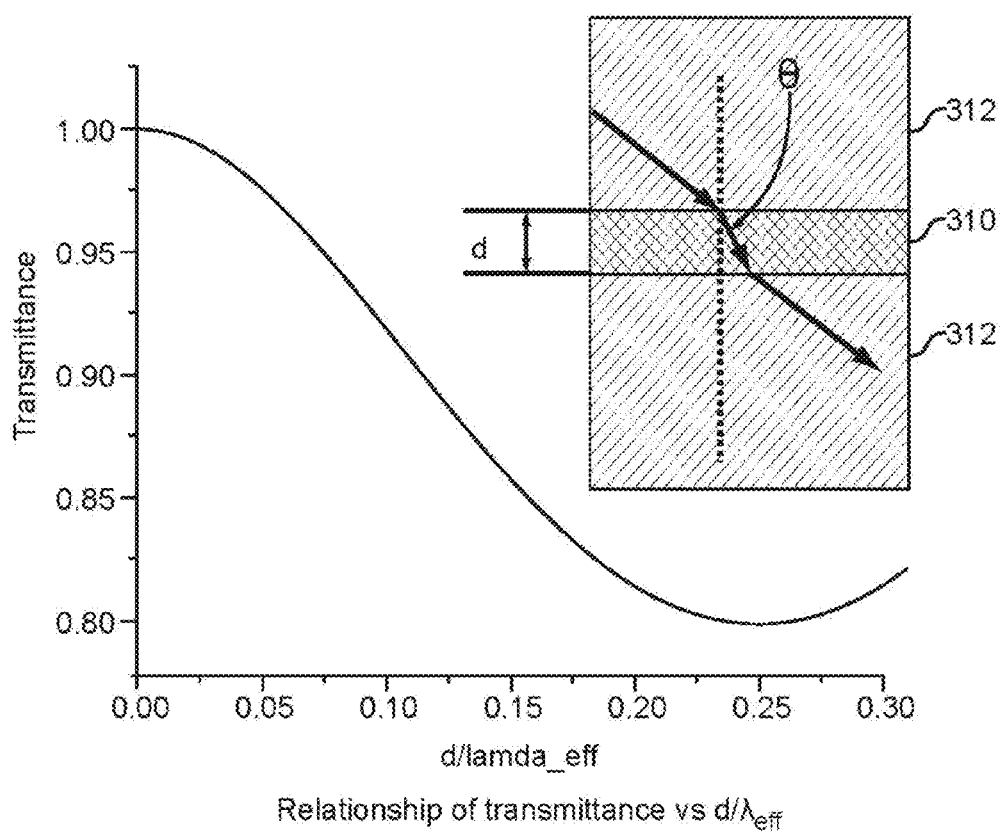
FIG. 12 is a graph of transmittance as a function of the normalized thickness of a thin layer of one optical medium sandwiched in another optical medium.

High light transmission efficiency can be provided by using sufficiently thin layers of the two materials. As is generally known in the art and illustrated in FIG. 12, when a light beam shines through a thin film 310 of thickness d, having a refractive index $n_2$, sandwiched in another optical medium 312, the light transmittance (defined as the amount of light energy transmitted through the film divided by the amount of light energy incident onto the film) is given by where $$T(d) = \frac{I_{trans}}{I_{inc}} = \frac{(1-R)^2}{(1-R)^2 + 4R\sin^2(k_\perp d)}$$

$$k_\perp = \frac{2\pi}{\lambda_{eff}} = \frac{2\pi n_2}{\lambda}\cos\theta,$$

with $\lambda$ being the wavelength of light in vacuum, $\theta$ being the angle of refraction in the thin film 310, and R being the reflectance of the thin film. FIG. 12 shows the transmittance of light as a function of $d/\lambda_{eff}$ for a light beam traveling from silica ($SiO_2$, $n_1$=1.45) through a very thin film (thickness d) of titania ($TiO_2$, $n_1$=2.35) into silica again. It can be seen that when $d/\lambda_{eff}$ is less than 0.1, more than 90% of the light will be transmitted. Hence, a general guideline is that when the thickness of the thin film is less than about $$\frac{\lambda}{10n_2\cos\theta},$$

more than 90% of the light will pass through the film. If the light beam shines onto the film at normal incidence (i.e. $\theta$=0°), the single layer film thickness is advantageously chosen to be less than $$\frac{\lambda}{10n_2},$$

which is about 66 nm for $TiO_2$ and about 100 nm for $SiO_2$. In GRIN-lens focusing applications, the light wave travels paraxially along the central axis, so that the angle $\theta$ varies from 90° to about 60°. Accordingly, the fraction of light transmitted is generally more than 95% if single layer thicknesses less than $$\frac{\lambda}{10n_2}$$

are used.

Figure 13A:
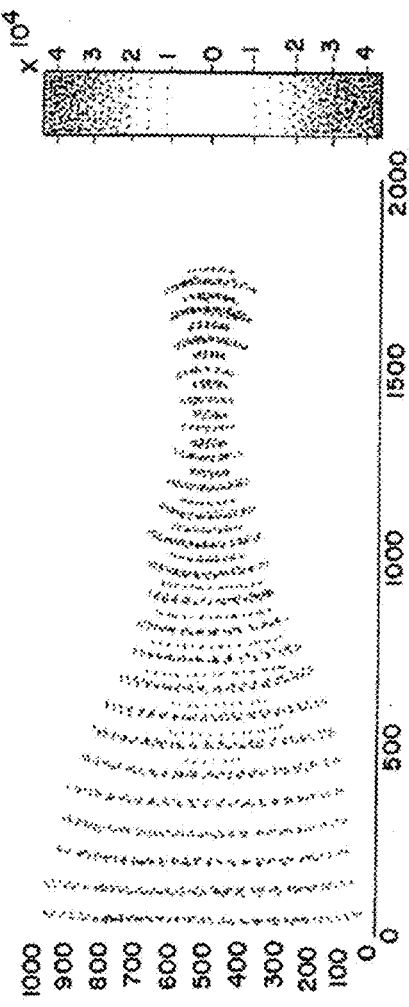
FIGS. 13(a)-13(b) are graphs of a computer simulation of light propagation through a parabolic refractive index distribution realized with multiple materials and with two materials, respectively.
Figure 13B:
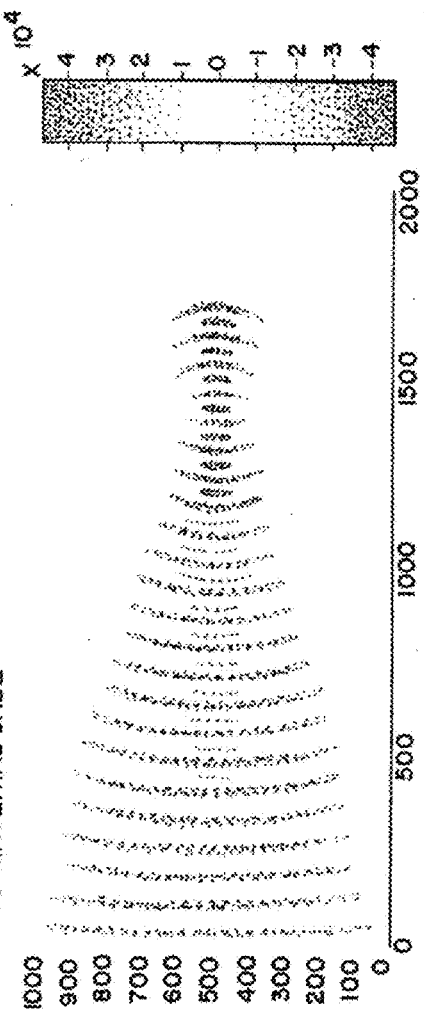

To evaluate the focusing power of the GRIN device, light wave propagation was simulated for a first GRIN lens having a parabolic refractive index distribution made up of thin layers of numerous different materials, substantially approximating a continuous index distribution, and for a second GRIN lens made up of layers of only two materials. FIGS. 13(a)-13(b) show the simulation result for a parabolic refractive index distribution of $$n(r) = n_0\left[1 - \Delta\left(\frac{r}{a}\right)^2\right],$$

with a=5 µm, $n_0$=1.75 and $n_b$=1.45. FIG. 13(a) shows results for a substantially continuous GRIN lens, and FIG. 13(b) shows results for a two-material GRIN lens. As can be seen, both GRIN lenses have similar focal lengths and focused spot sizes.

To evaluate the energy loss for light propagating longitudinally through the device, the optical energy flow was calculated based on integration over space of the standard electromagnetic energy flow vector $\vec{S}=\vec{E}\times\vec{H}$, where $\vec{E}\times\vec{H}$ are the electric and magnetic fields. FIGS. 14(a)-14(b) show simulation results for a two-material GRIN lens and a many-material GRIN lens, respectively. In both simulations, it has been assumed that there is no material absorption of light and all the interfaces are perfect. Each GRIN lens extends from point A to point D, so that the focal point is just outside the GRIN lens. A semiconductor waveguide made of indium phosphide (InP), with its mode matched to the focused beam profile, extends from point B to point C, leaving an air gap of 1 µm between the GRIN lens and the semiconductor waveguide. Antireflection coatings have been included on both the GRIN lens end face and on the InP waveguide end face. Table 1 shows light energy transmission efficiency for each GRIN lens. The two-material case is not significantly different from the substantially continuous case.

TABLE 1

|  | Two-material case | Substantially Continuous case |
|---|---|---|
| Fraction of light energy passed through the GRIN lens from A to B | 99.9% | 98.8% |
| Fraction of light energy passed from B to C (including mode matching) | 99.7% | 99.5% |
| Fraction of light energy within the InP waveguide at C (i.e., within 3x width of the waveguide) | 95.6% | 98.2% |
| Overall coupling efficiency | 95.3% | 97.7% |

The foregoing analyses indicate that a GRIN device made up of alternating layers of two or more different materials can provide high transmission efficiency, a short focal length, a small focused spot size, and acceptably low energy loss when coupling to a small mode size waveguide or other optical components.

The physical size of the GRIN device can also be varied. For example, a two-material device could be constructed for coupling light between a semiconductor laser or detector and a standard multimode fiber, which typically has a mode size of about 50 to 65 microns. It can also be used to couple light from a one dimensional or two dimensional semiconductor laser array or laser bar into a single mode fiber, e.g., for optically pumping an erbium doped fiber amplifier.

In one example, a large number (e.g., 306) of alternating thin layers of silica ($SiO_2$) and titania ($TiO_2$) may be deposited on a flat silicon substrate. The thickness of each layer (in nm) for this embodiment is listed in Table 2. A thicker buffer layer of $SiO_2$ (1 μm) is deposited first in order to separate the GRIN device from the substrate material so that light will not leak into the substrate. Aside from the buffer layer, the thicknesses of the silica layers range from 20 nm to 70 nm, and the thicknesses of the titania layers range from 20 nm to 80 nm. In regions where the effective index of refraction is high, titanic layers are near their thickest while silica layers are near their thinnest; in regions where the effective index is low, the reverse applies.

Figure 15:
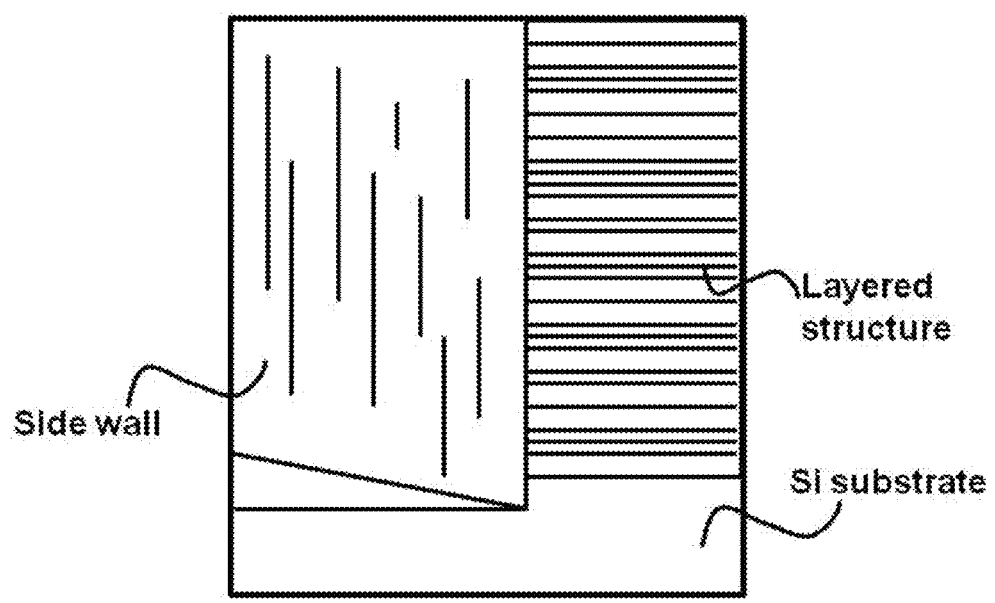
FIG. 15 is a scanning electron microscope (SEM) image of a GRIN structure realized by depositing alternating thin layers of two materials of different layer thickness on a flat silicon substrate.
Figure 16A:
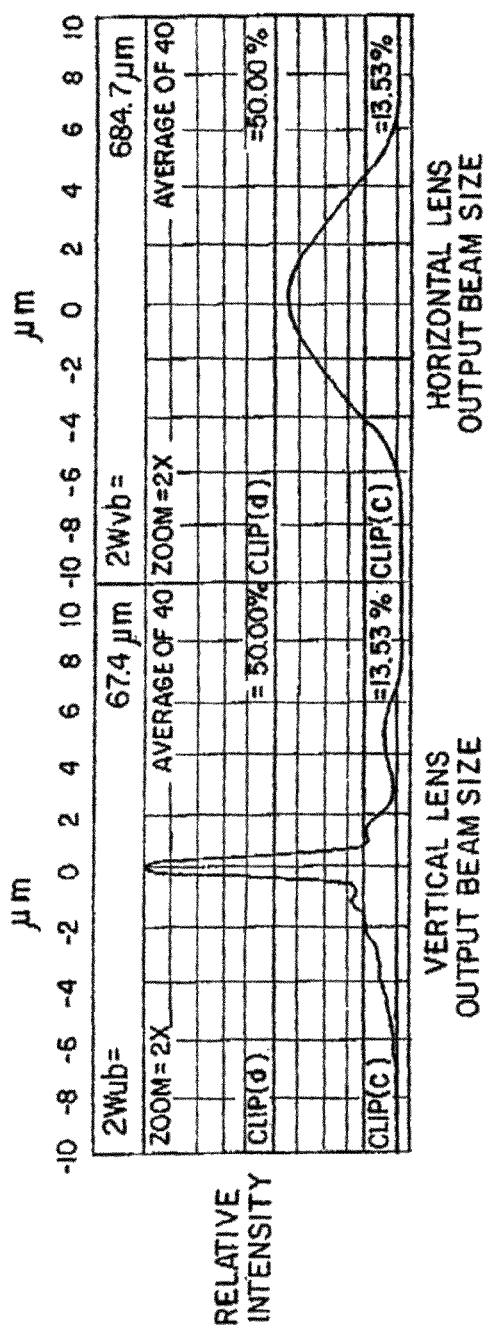
FIGS. 16(a)-16(b) are graphs showing the measured focused spot profile and input spot profile for a one dimensional GRIN lens realized using $SiO_2$ and $TiO_2$.
Figure 16B:
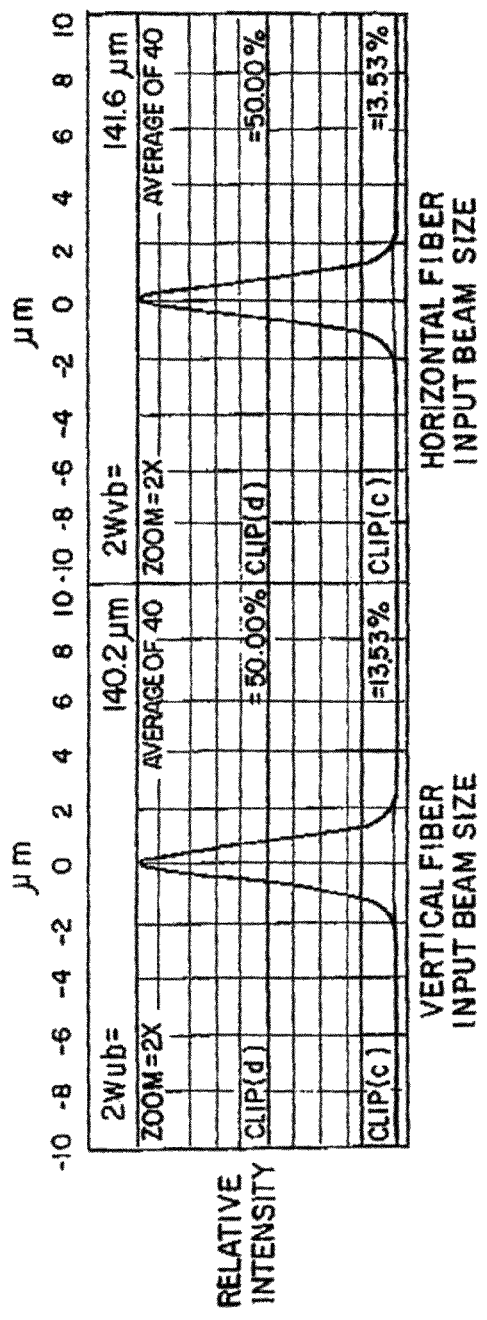

FIG. 15 shows an scanning electron microscope (SEM) image of such a structure deposited on a flat Si substrate, and FIG. 16(a) shows the measurement result of such a structure acting as a one dimensional GRIN lens to focus a light beam from a standard single mode fiber into an elliptical beam; as a comparison the output beam profile from a standard single mode fiber is shown in FIG. 16(b).

It should be noted that a planar layered structure may focus light only in the direction transverse to the plane of the layers (the vertical direction for horizontal layers on a substrate). In the lateral or horizontal direction, light beam size transformation can be achieved using tapered waveguide structures.

TABLE 2

| Mtl | nm |
| --- | --- |
| TiO2 | 60 |
| SiO2 | 20 |
| TiO2 | 50 |
| SiO2 | 20 |
| TiO2 | 60 |
| SiO2 | 20 |
| TiO2 | 50 |
| SiO2 | 20 |
| TiO2 | 60 |
| SiO2 | 20 |
| TiO2 | 50 |
| SiO2 | 20 |
| TiO2 | 60 |
| SiO2 | 20 |
| TiO2 | 50 |
| SiO2 | 20 |
| TiO2 | 80 |
| SiO2 | 30 |
| TiO2 | 80 |
| SiO2 | 30 |
| TiO2 | 80 |
| SiO2 | 30 |
| TiO2 | 80 |
| SiO2 | 30 |
| TiO2 | 80 |
| SiO2 | 30 |
| TiO2 | 80 |
| SiO2 | 30 |
| TiO2 | 80 |
| SiO2 | 30 |
| TiO2 | 50 |
| SiO2 | 20 |
| TiO2 | 80 |
| SiO2 | 30 |
| TiO2 | 50 |
| SiO2 | 20 |
| TiO2 | 50 |
| SiO2 | 20 |

TABLE 2-continued

| Mtl | nm |
| --- | --- |
| TiO2 | 50 |
| SiO2 | 20 |
| TiO2 | 50 |
| SiO2 | 20 |
| TiO2 | 50 |
| SiO2 | 20 |
| TiO2 | 50 |
| SiO2 | 20 |
| TiO2 | 50 |
| SiO2 | 20 |
| TiO2 | 50 |
| SiO2 | 20 |
| TiO2 | 50 |
| SiO2 | 20 |
| TiO2 | 70 |
| SiO2 | 30 |
| TiO2 | 80 |
| SiO2 | 20 |
| TiO2 | 70 |
| SiO2 | 30 |
| TiO2 | 70 |
| SiO2 | 30 |
| TiO2 | 70 |
| SiO2 | 30 |
| TiO2 | 80 |
| SiO2 | 20 |
| TiO2 | 40 |
| SiO2 | 20 |
| TiO2 | 80 |
| SiO2 | 20 |
| TiO2 | 40 |
| SiO2 | 20 |
| TiO2 | 70 |
| SiO2 | 30 |
| TiO2 | 40 |
| SiO2 | 20 |
| TiO2 | 70 |
| SiO2 | 30 |
| TiO2 | 40 |
| SiO2 | 20 |
| TiO2 | 70 |
| SiO2 | 30 |
| TiO2 | 40 |
| SiO2 | 20 |
| TiO2 | 40 |
| SiO2 | 20 |
| TiO2 | 40 |
| SiO2 | 20 |
| TiO2 | 40 |
| SiO2 | 20 |
| TiO2 | 40 |
| SiO2 | 20 |
| TiO2 | 40 |
| SiO2 | 20 |
| TiO2 | 40 |
| SiO2 | 20 |
| TiO2 | 40 |
| SiO2 | 20 |
| TiO2 | 40 |
| SiO2 | 20 |
| TiO2 | 80 |
| SiO2 | 30 |
| TiO2 | 40 |
| SiO2 | 20 |
| TiO2 | 50 |
| SiO2 | 30 |
| TiO2 | 40 |
| SiO2 | 20 |
| TiO2 | 80 |
| SiO2 | 30 |
| TiO2 | 40 |
| SiO2 | 20 |
| TiO2 | 30 |
| SiO2 | 20 |

TABLE 2-continued

| Mtl | nm |
|---|---|
| TiO2 | 40 |
| SiO2 | 20 |
| TiO2 | 30 |
| SiO2 | 20 |
| TiO2 | 40 |
| SiO2 | 20 |
| TiO2 | 40 |
| SiO2 | 30 |
| TiO2 | 40 |
| SiO2 | 20 |
| TiO2 | 40 |
| SiO2 | 30 |
| TiO2 | 40 |
| SiO2 | 20 |
| TiO2 | 40 |
| SiO2 | 30 |
| TiO2 | 30 |
| SiO2 | 20 |
| TiO2 | 30 |
| SiO2 | 20 |
| TiO2 | 30 |
| SiO2 | 20 |
| TiO2 | 30 |
| SiO2 | 20 |
| TiO2 | 30 |
| SiO2 | 20 |
| TiO2 | 30 |
| SiO2 | 20 |
| TiO2 | 30 |
| SiO2 | 20 |
| TiO2 | 30 |
| SiO2 | 20 |
| TiO2 | 40 |
| SiO2 | 30 |
| TiO2 | 40 |
| SiO2 | 30 |
| TiO2 | 40 |
| SiO2 | 30 |
| TiO2 | 40 |
| SiO2 | 30 |
| TiO2 | 40 |
| SiO2 | 30 |
| TiO2 | 40 |
| SiO2 | 30 |
| TiO2 | 40 |
| SiO2 | 30 |
| TiO2 | 20 |
| SiO2 | 20 |
| TiO2 | 40 |
| SiO2 | 30 |
| TiO2 | 20 |
| SiO2 | 20 |
| TiO2 | 40 |
| SiO2 | 30 |
| TiO2 | 20 |
| SiO2 | 20 |
| TiO2 | 40 |
| SiO2 | 30 |
| TiO2 | 20 |
| SiO2 | 20 |
| TiO2 | 20 |
| SiO2 | 20 |
| TiO2 | 40 |
| SiO2 | 30 |
| TiO2 | 20 |
| SiO2 | 20 |
| TiO2 | 20 |
| SiO2 | 20 |
| TiO2 | 20 |
| SiO2 | 20 |
| TiO2 | 20 |
| SiO2 | 20 |

TABLE 2-continued

| Mtl | nm |
|---|---|
| TiO2 | 20 |
| SiO2 | 20 |
| TiO2 | 20 |
| SiO2 | 20 |
| TiO2 | 20 |
| SiO2 | 20 |
| TiO2 | 20 |
| SiO2 | 20 |
| TiO2 | 20 |
| SiO2 | 20 |
| TiO2 | 20 |
| SiO2 | 20 |
| TiO2 | 20 |
| SiO2 | 20 |
| TiO2 | 20 |
| SiO2 | 20 |
| TiO2 | 20 |
| SiO2 | 20 |
| TiO2 | 20 |
| SiO2 | 40 |
| TiO2 | 30 |
| SiO2 | 20 |
| TiO2 | 20 |
| SiO2 | 20 |
| TiO2 | 20 |
| SiO2 | 40 |
| TiO2 | 30 |
| SiO2 | 20 |
| TiO2 | 20 |
| SiO2 | 20 |
| TiO2 | 20 |
| SiO2 | 40 |
| TiO2 | 30 |
| SiO2 | 20 |
| TiO2 | 30 |
| SiO2 | 40 |
| TiO2 | 30 |
| SiO2 | 40 |
| TiO2 | 30 |
| SiO2 | 40 |
| TiO2 | 30 |
| SiO2 | 40 |
| TiO2 | 30 |
| SiO2 | 40 |
| TiO2 | 20 |
| SiO2 | 30 |
| TiO2 | 20 |
| SiO2 | 30 |
| TiO2 | 20 |
| SiO2 | 30 |
| TiO2 | 20 |
| SiO2 | 30 |
| TiO2 | 20 |
| SiO2 | 30 |
| TiO2 | 30 |
| SiO2 | 50 |
| TiO2 | 20 |
| SiO2 | 40 |
| TiO2 | 30 |
| SiO2 | 50 |
| TiO2 | 20 |
| SiO2 | 40 |
| TiO2 | 30 |
| SiO2 | 50 |
| TiO2 | 20 |
| SiO2 | 40 |
| TiO2 | 20 |
| SiO2 | 40 |
| TiO2 | 20 |
| SiO2 | 40 |

TABLE 2-continued

| Mtl | nm |
| --- | --- |
| TiO2 | 20 |
| SiO2 | 40 |
| TiO2 | 20 |
| SiO2 | 40 |
| TiO2 | 20 |
| SiO2 | 80 |
| TiO2 | 20 |
| SiO2 | 40 |
| TiO2 | 20 |
| SiO2 | 50 |
| TiO2 | 20 |
| SiO2 | 50 |
| TiO2 | 20 |
| SiO2 | 50 |
| TiO2 | 20 |
| SiO2 | 80 |
| TiO2 | 20 |
| SiO2 | 80 |
| TiO2 | 20 |
| SiO2 | 60 |
| TiO2 | 20 |
| SiO2 | 60 |
| TiO2 | 20 |
| SiO2 | 60 |
| TiO2 | 20 |
| SiO2 | 70 |
| TiO2 | 20 |
| SiO2 | 70 |
| TiO2 | 20 |
| SiO2 | 70 |
| TiO2 | 20 |
| SiO2 | 20 |
| SiO2 | 1000 |

Figure 17A:
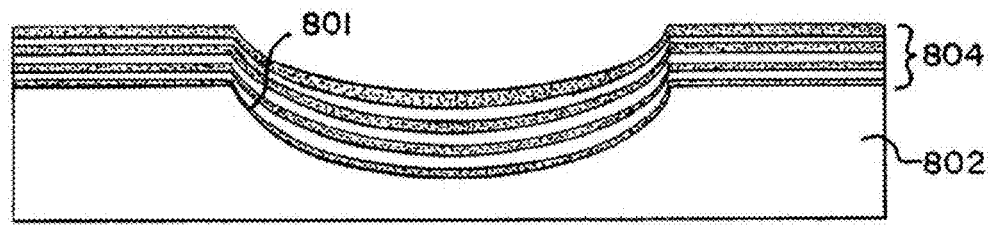
FIGS. 17(a)-17(d) are schematic diagrams illustrating process steps for fabricating a GRIN device from curved layers of two materials.
Figure 17B:
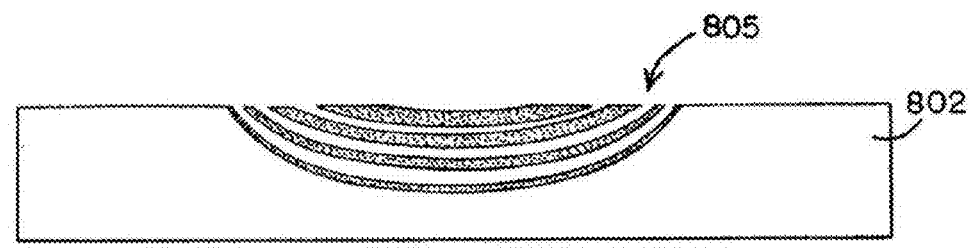
Figure 17C:
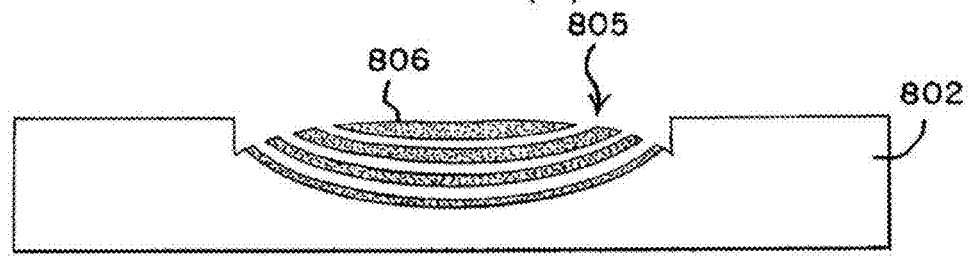
Figure 17D:
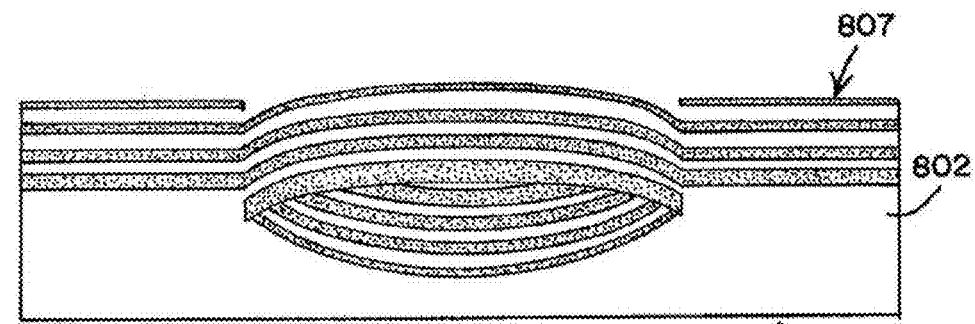

In an alternative embodiment, multiple thin layers may be deposited on a non-planar substrate surface. There are various ways to reshape a flat substrate surface into other kinds of surface profiles. For example, known micro machining techniques can be used to create a curved surface. Gray scale masks can also be used to create a surface relief pattern on a photoresist film, and such a pattern can be transferred downward to another material below the photoresist film. As is illustrated in FIG. 17(a), a U-shaped groove 801 can be created in a substrate 802, and a multilayer film 804 made of alternating layers of two materials can be deposited in the U groove. A planarization processing step can be used to create the bottom half 805 of a two-dimensional GRIN lens (FIG. 17(b)). A gray scale mask can be used to make a convex surface profile 806 on the existing half-GRIN structure 805 (FIG. 17(c)), and more layers 807 can be deposited on top of the convex surface to make a two-dimensional GRIN lens 808 (FIG. 17(d)) for light focusing applications in which focusing light in both the horizontal and vertical directions is desired. Gray scale mask techniques are used in microlens fabrication and are described in the above-referenced co-pending U.S. patent application Ser. No. 10/083,674.

It should be noted that structures other than alternating layers of two materials could be used. For instance, a third material (or more) could be added in some alternative embodiments. In another alternative embodiment, small size grains or dots of one material are embedded in another material with the grains or dots having different density and/or grain size distributions in different parts of the material. Also, wires of one material can be embedded into another material, with the wires having a desired distribution of density or size. In addition, a combination of embedded grains and wires could be used, and this could be further combined with thin layers. Thus, any mixture of small size structures may be used to create graded refractive index devices suitable for various applications.

A variety of materials can also be used, including amorphous and polycrystalline materials. For example, silica ($SiO_2$ n=1.45) and titania ($TiO_2$, n=2.35) are in common use for making thin film filters for optical fiber communication applications. Due to their relatively large refractive index difference (about 0.9), they can be used to create effective graded refractive index devices for many light focusing applications. A number of other materials may also be used, such as tantalum pentoxide ($Ta_2O_5$), zirconium oxide ($ZrO_2$), niobium pentoxide ($Nb_2O_5$), hafnium oxide ($HfO_2$), zinc oxide (ZnO), germanium oxide ($GeO_2$), lead oxide (PbO), yttrium oxide ($Y_2O_3$), aluminum oxide ($Al_2O_3$), silicon carbide (SiC), titanium carbide (TiC), titanium nitride (TiN), chromium nitride (CrN), carbon nitride (CN), carbon boride (CB), aluminum nitride (AlN), zinc selenide (ZnSe), barium fluoride ($BaF_2$), magnesium fluoride ($MgF_2$), diamond like carbon (DLC), silicon (Si), germanium (Ge), polyimide, bisbenzocyclobutene (BCB) and cyclized transparent optical polymer (CYTOP). It should be noted that the refractive index of some of these materials is quite large (e.g., for silicon, n=3.4). The choice of materials can be varied, depending on the particular application.

One advantageous choice of materials is silicon (Si) and silica ($SiO_2$). When Si is combined with $SiO_2$, the effective refractive index of the resulting medium can vary by as much as about 1.9. This large variation, combined with the high refractive index of silicon, may be useful in some applications because of the short focal length and small spot size (0.4 μm in one simulation) that can be achieved.

The superlens described herein can be used for any electromagnetic beam size (not necessarily 10 μm beam size). For example, the electromagnetic beam size can be of the order of about 50 μm or 62.5 μm to cover the case of standard multimode fibers. The superlens structure can be accordingly changed to enable efficient light coupling between such a multimode fiber and a semiconductor waveguide device.

In the above embodiments, it has been assumed that a parallel electromagnetic beam is incident from the left and is focused in another optical medium to the right of the superlens. However, electromagnetic beam can propagate in either direction. An example of electromagnetic beam being incident from the right is the case of light coupling from a semiconductor laser to a single mode fiber. For this case, light should travel in the reverse direction, i.e., from right to left.

In addition to the fact that the total distance of light propagation in the superlens medium can be made much less than in previous devices (of the order of about 10 μm), there are also no waveguide-related sidewalls; as a result, light propagation loss is substantially reduced.

Further, total thickness of the superlens need not be less than or equal to one focal length (a quarter of the GRIN medium pitch). If the superlens has a thickness that is between one quarter and half the pitch of the GRIN medium, a parallel incident beam emerges in the vertical direction from the output surface in a divergent or collimated manner. Similarly, if the superlens has a thickness between half and three quarter the pitch of the GRIN medium, a parallel incident beam emerges from the output surface in a convergent manner in the vertical direction. Hence, the effect in vertical direction is similar to the case when the superlens thickness is within a quarter of the pitch. However, the horizontal focusing is different since the thickness has changed. This argument can be further extended to even larger values of the superlens thickness and the present invention covers all such cases. In general, for a superlens with pitch f, if the superlens has thickness between $[(2n-1)/4]f$ and $nf/2$, where n is a natural number, then a parallel incident beam emerges in the vertical direction from the output surface in a divergent or collimated manner. If the superlens has thickness between nf/2 and [(2n+1)/4]f, where n is a natural number, then a parallel incident beam emerges in the vertical direction from the output surface in a convergent manner.

As discussed above, when the length of the superlens is about half of the GRIN pitch, the superlens will transform light from one focal point to another focal point. In an exemplary embodiment shown in FIGS. 18(a)-(d), an input beam 1805 is introduced by an input waveguide 1810 at an output end location 1815 of the input waveguide and is coupled into an output waveguide 1820 at an input end location 1825 of the output waveguide. In other embodiments, the input beam can also be introduced by a free-space beam at location 1815. Likewise, the output beam can also go into free-space propagation at location 1825. Furthermore, both the input and output beams can originate from free-space propagation at location 1815 and go into free-space propagation at location 1825. The presence of one or both waveguides, while preferred in some situations, does not typically alter the nature of beam transformation through the superlens. In some other situations, however, they could shape the beam wavefront and intensity profiles in combination with the superlens such as in the case of a tapered waveguide inside the superlens.

Figure 18A:
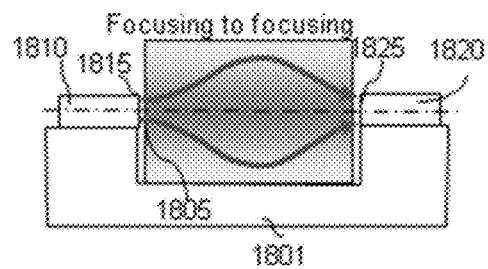
FIGS. 18(a)-18(e) show various embodiments of the superlens with (a) light transformed from one focus point to another with launching at the middle optical axis of the superlens; (b) light transformed from one focus point to another with launching at a position vertically offset from the middle optical axis of the superlens; (c) a superlens with a half-parabolic index profile that transforms light to a larger mode size; (d) surface emission from a superlens with an output surface at an oblique angle to the superlens middle optical axis; and (e) a superlens spaced apart from input and output waveguides.
Figure 18B:
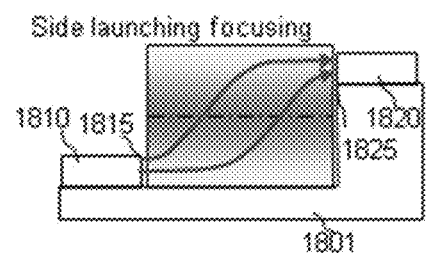

The middle optical axis of the superlens is at a midheight location of the superlens' physical structure and is oriented in a direction perpendicular to the direction of the refractive index variation of the superlens' refractive index profile at the mid height location. In FIG. 18(a) the input waveguide 1810 and output waveguide 1820 share the same optical axis so there is no vertical position change. In an exemplary embodiment, the vertically graded refractive index profile of the lens has a maximum refractive index value at the point where the optical axis of the input and output waveguides lie. In another exemplary embodiment, this point coincides with the middle optical axis of the superlens. In a case where the input waveguide 1810 and output waveguide 1820 may not share the same optical axis, the super lens may focus the light beam from one focal point to another focal point while changing the vertical location of the focus, as shown in FIG. 18(b). In an exemplary embodiment, the vertically graded refractive index profile of the lens has a maximum refractive index value at the vertical mid-point (i.e., at the middle optical axis of the superlens). The optical axis of the input waveguide 1810 lies below this middle optical axis and the optical axis of the output waveguide 1820 lies above this middle optical axis. The embodiments described are for the purpose of illustration and not limitation.

Figure 18C:
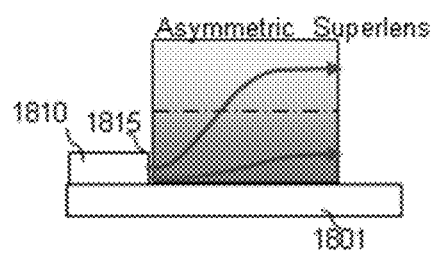

Referring to FIG. 18(c), the length of the superlens may be about one-quarter of the GRIN pitch, and thus the superlens may transform parallel incident light into a focal point. The refractive index profile of the superlens may be asymmetric with respect to the middle optical axis of the superlens. For example, it may have a low refractive index on the top (away from an underlying substrate) and a high refractive index on the bottom (near to an underlying substrate). The light incident from a small input waveguide 1810 at the bottom may exit the superlens parallel to the incident light but with a vertical position change.

Figure 18D:
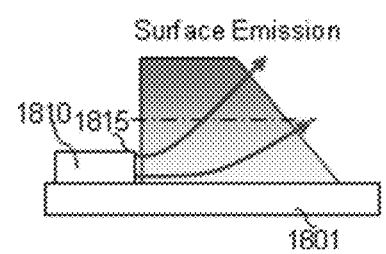

Referring to FIG. 18(d), the input waveguide may be aligned with the bottom (base) of the superlens positioned on a substrate 1801 and below the middle optical axis of the superlens. The superlens may have a GRIN structure and may be asymmetric with a high refractive index on top (away from an underlying substrate) and a low refractive index at the base (near to an underlying substrate). The input surface of the superlens may be perpendicular to the middle optical axis of the superlens, and the output surface of the superlens may have an oblique angle (e.g., <90 degrees) with the middle optical axis of the superlens. In this example, the wavefront passing through the output surface of the superlens moves nonparallel with the middle optical axis of the superlens.

Figure 18E:
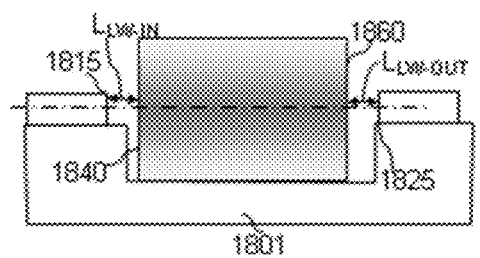

In one embodiment, the refractive index profile may be half-parabolic, i.e., $n(y)=A(B-y)^2$ with the peak of the profile (y=0) at the substrate and with B as a constant chosen so that $n(y=0)=A*B$ and $n(H)=A*(B-H)^2$, where H is the height of the superlens, n(0) is the refractive index of the superlens at a bottom layer of the lens near the substrate surface, and n(H) is the refractive index of the superlens at the top layer of the lens, where y is a vertical direction substantially perpendicular to the middle optical axis of the superlens. In FIG. 18(a), FIG. 18(b), FIG. 18(c), and FIG. 18(d), the output end 1815 of the input waveguide 1810 can be away from, touching, or penetrating into the lens. As illustrated by FIG. 18(e), the distance of the lens surface 1840 to the input waveguide end 1815 is $L_{Lw-IN}$. $L_{Lw-IN}$ is zero if the input waveguide end touches the lens surface. $L_{LW-IN}$ is positive if the input waveguide end penetrates the lens surface. $L_{LW-IN}$ is negative if the input waveguide end is away from and does not touch the lens surface.

Likewise, as illustrated in FIG. 18(e), the input end 1825 of the output waveguide 1820 can be away from, touching, or penetrating into the lens. The distance of the lens output surface 1860 to the output waveguide end 1825 is $L_{Lw-OUT}$. $L_{Lw-OUT}$ is zero if the output waveguide end touches the lens surface. $L_{Lw-OUT}$ is positive if the output waveguide end penetrates the lens surface. $L_{Lw-OUT}$ is negative if the output waveguide end is away from and does not touch the lens surface.

In an exemplary embodiment, the input waveguide may be an optical waveguide with a step refractive index, and the waveguide material may be semiconductor (e.g., a silicon-on-insulator waveguide) and the output waveguide may be a single mode optical fiber. In general, the input or output waveguide may be any optical waveguide, such as those with multiple-layers of refractive-index variation, as long as the waveguide guides propagating optical beam energy. The highest refractive index of the center waveguiding region is called the refractive index of the waveguide core $n_{co}$. The refractive index away from the waveguiding region, where the intensity of the guided beam is small compared to its peak intensity and is monotonically decreasing, as is known to those skilled in the art as the evanescence wave region, is called the refractive index of the waveguide cladding $n_{cl}$. The superlens may have a GRIN structure with a low index $n_a$ on top and a high index $n_b$ at the bottom. The input waveguide 1901 may be aligned with the bottom of the superlens, as shown in FIG. 19. The input waveguide 1901 may be a silicon-on-insulator waveguide with a silicon waveguide core size of 0.3 μm in the vertical direction, and the refractive index profile of the superlens may be parabolic with n=3.6 at the bottom to n=1.5 at the top. The strong lensing effect in the superlens may result in an output beam of greater than about 6 μm in diameter over less than 20 μm of propagation through the superlens, and the wavefront may be bent, giving a flat wavefront at the output surface of the superlens.

Figure 19A:
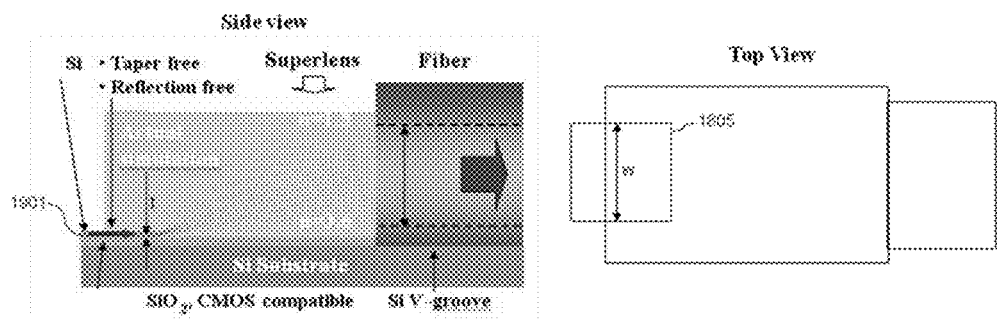
FIGS. 19(a)-19(e) shows side and top views of an optical apparatus including a superlens coupling a semiconductor waveguide and an optical fiber according to several embodiments.

In one embodiment illustrated in FIG. 19(a), the input waveguide end 1805 or the output waveguide end 1825 has a constant height "t" vertically and constant width "w" horizontally (vertical is in a direction substantially perpendicular to the surface of the substrate and horizontal is in a direction substantially parallel to the surface of the substrate). In one preferred embodiment, the wavelength of light is λ=1500 nm, the input waveguide is a silicon waveguide where the silicon dioxide cladding and the silicon waveguide core penetrate into the superlens. The refractive index of the input waveguide core $n_{co}$ is 3,4, the refractive index of the cladding is $n_{cl}=1.5$. Let $n_{wg}=(n_{co}^2-n_{cl}^2)^{0.5}$, where t is around $\lambda/(2n_{wg})$ such as t=300 nm, and w is slightly larger than the full-width half-maximum (FWHM) mode width of a single-mode optical fiber so that w is around 12 micrometers. The output waveguide is an optical fiber with fiber end slightly away from the output surface of the superlens.

Figure 19B:
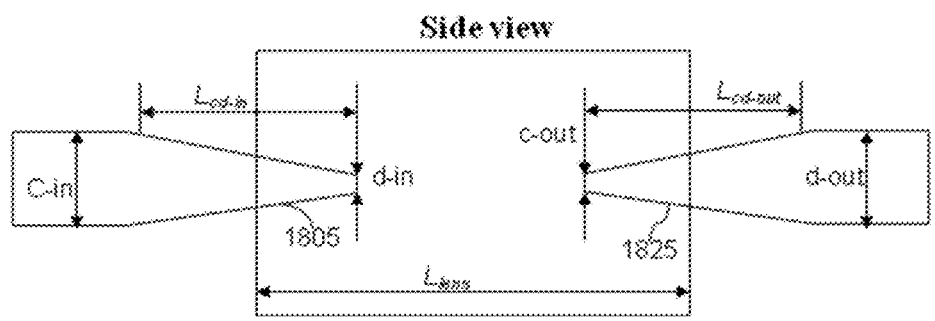

In another embodiment illustrated in FIG. 19(b), the input waveguide end 1805 or the output waveguide end 1825 has a variable vertical size along its length. For example, it may be tapered from a vertical height of c-in or c-out to a smaller vertical height of d-in or d-out over a length $L_{cd-in}$ to $L_{cd-out}$ along the direction of the superlens. When the size of an end of the waveguide is small enough so the light can no longer be confined strongly inside the waveguide, the mode size of the light propagating in the waveguide becomes larger as the size of the waveguide drops. As a result, the guided optical mode size may be enlarged at the waveguide end. In one preferred embodiment, the wavelength of light is $\lambda=1500$ nm, the input waveguide is a silicon waveguide with a thin layer of silicon dioxide cladding where the silicon waveguide core and the silicon dioxide cladding penetrate into the superlens. The thickness of the silicon dioxide cladding layer is 100 nm, c-in is 300 nm, d-in is 5 nm, and $L_{cd-in}$ is 20 micrometers with the entire $L_{cd-in}$ inside the superlens. The output waveguide is an optical fiber with a fiber end slightly away from the output surface of the superlens.

Figure 19C:
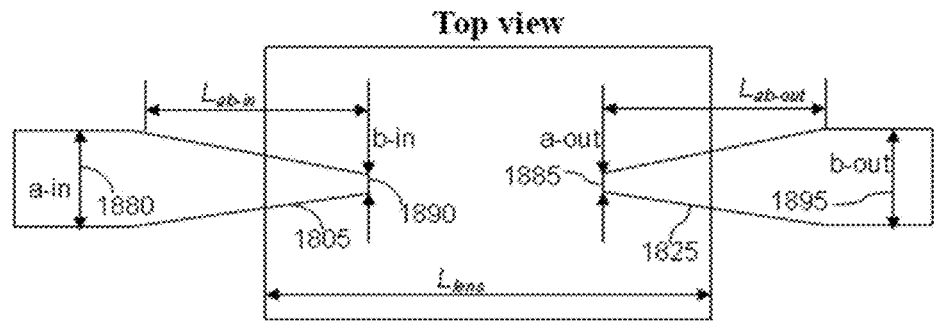

In yet another embodiment illustrated in FIG. 19(c), the input waveguide end 1805 or the output waveguide end 1825 has a variable horizontal size along its length. For example, it may be tapered down from a horizontal size of a-in 1880 or a-out 1885 to a smaller horizontal size b-in 1890 or b-out 1895 over a length $L_{ab-in}$ to $L_{ab-out}$ along the direction of the superlens. In one embodiment, the down taper reduces the size of the guided optical mode at the small waveguide end 1890 or 1895 compared to the size of the guided optical mode at the larger section of the waveguide 1880 or 1885. In one preferred embodiment, the wavelength of light is $\lambda=1500$ nm, the input waveguide is a silicon waveguide with a thin layer of silicon dioxide cladding where the silicon waveguide core and the silicon dioxide cladding penetrate into the superlens. The thickness of the silicon dioxide cladding layer is 100 nm, a-in is 12 micrometers, b-in is 8 micrometers, and $L_{ab-in}$ is 50 micrometers with a portion of $L_{cd-in}$ outside the superlens. The output waveguide is an optical fiber having a fiber end slightly away from the output surface of the superlens.

However, in another embodiment, when the size of an end of the waveguide is small enough (smaller than $\lambda/2n_{wg}$, where $n_{wg}=(n_{co}^2-n_{cl}^2)^{0.5}$ with $n_{co}$ being the refractive index of the waveguide core and $n_{cl}$ being the refractive index of the cladding material around the waveguide core) so that light can no longer be confined strongly inside the waveguide, the down taper increases the size of the guided optical mode at the small waveguide end 1890 or 1895 compared to the size of the guided optical mode at the larger section of the waveguide 1880 or 1885. In one preferred embodiment, the wavelength of light is $\lambda=1500$ nm, the input waveguide is a silicon waveguide with a thin layer of silicon dioxide cladding where the silicon waveguide core and the silicon dioxide cladding penetrate into the superlens. The thickness of the silicon dioxide cladding layer is 100 nm, a-in is 300 nm, b-in is 5 nm, and $L_{ab-in}$ is 10 micrometers with the entire $L_{cd-in}$ inside the superlens. The output waveguide is an optical fiber having a fiber end slightly away from the output surface of the superlens.

Figure 19D:
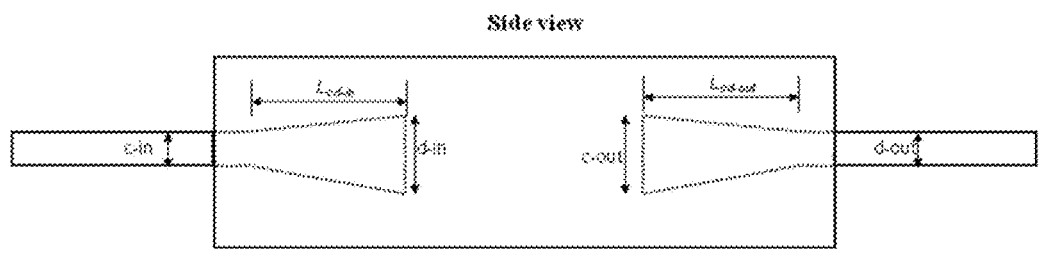

Alternatively, in another embodiment shown in FIG. 19(d) the optical waveguide may be tapered vertically to a larger size at the waveguide end, and the size of the optical mode inside the waveguide may be enlarged at the waveguide end. The input waveguide may be vertically tapered up from c-in to d-in and/or the output waveguide may be vertically tapered up from c-out to d-out. In one preferred embodiment, the wavelength of light is $\lambda=1500$ nm, the input waveguide is a silicon waveguide with a thin layer of silicon dioxide cladding where the silicon waveguide core and the silicon dioxide cladding penetrate into the superlens. The thickness of the silicon dioxide cladding layer is 100 nm, c-in is 300 nm and d-in is 1 micrometer. The output waveguide is an optical fiber with fiber end slightly away from the output surface of the superlens.

Figure 19E:
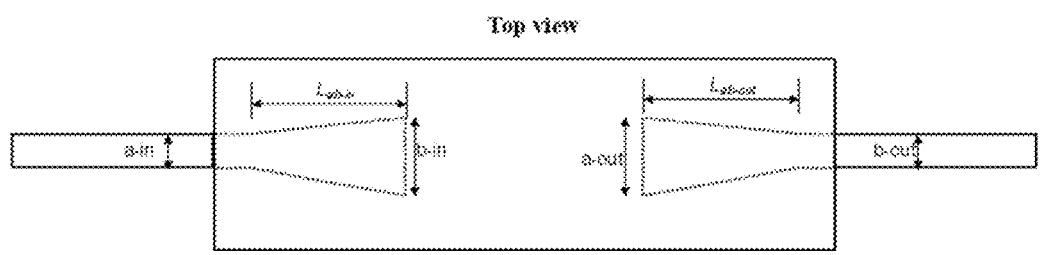

Likewise, in another embodiment shown in FIG. 19(e), the optical waveguide may be tapered horizontally to a larger size at the waveguide end, and the size of the optical mode inside the waveguide may be enlarged at the waveguide end. The input waveguide may be horizontally tapered up from a-in to b-in and/or the output waveguide may be horizontally tapered up from a-out to b-out. In one preferred embodiment, the wavelength of light is $\lambda=1500$ nm, the input waveguide is a silicon waveguide with a thin layer of silicon dioxide cladding where the silicon waveguide core and the silicon dioxide cladding penetrate into the superlens. The thickness of the silicon dioxide cladding layer is 100 nm, a-in is 300 nm and a-out is 12 micrometers. The output waveguide is an optical fiber with fiber end slightly away from the output surface of the superlens.

Figure 19F:
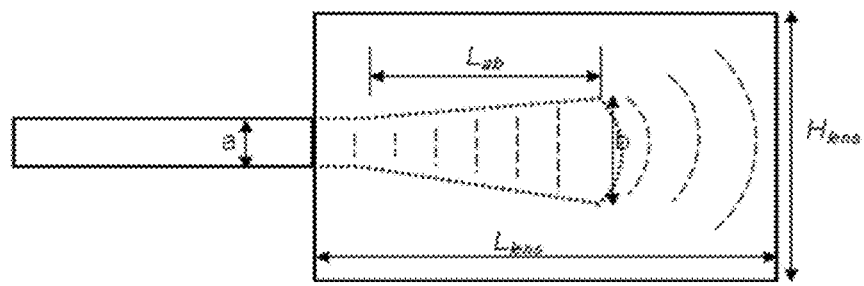
FIGS. 19(f)-19(h) show input and/or output waveguides having (f) concave, (g) convex and (h) arbitrarily shaped curvilinear surfaces.
Figure 19G:
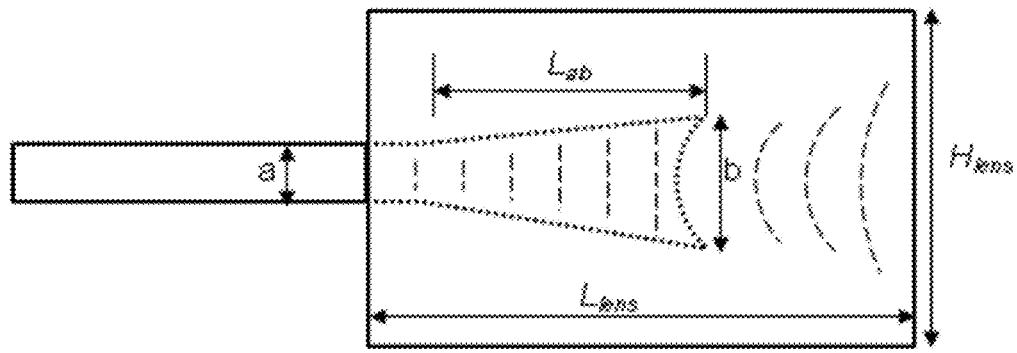
Figure 19H:
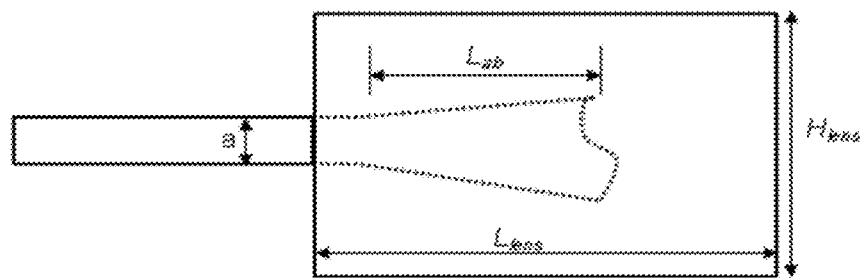

In another embodiment shown in FIG. 19(f), the end of the input and/or output waveguide may have a concave-curved surface towards the waveguide to change the curvature of the wavefront for the beam exiting and/or entering the waveguide. In yet another embodiment shown in FIG. 9(g), the end of the input and/or output waveguide may have a convex-curved surface. In yet another embodiment shown in FIG. 9(h), the end of the input and/or output waveguide may have an arbitrary curvilinear surface. The curved surfaces mentioned above may be of curvilinear shapes in either the vertical, or the horizontal, or both the vertical and horizontal directions. Additionally, the end of the waveguide may taper up, taper down, or extend straight in either the vertical or horizontal direction. In one preferred embodiment, the wavelength of light is $\lambda=1500$ nm, the input waveguide is a silicon waveguide with a thin layer of silicon dioxide cladding where the silicon waveguide core and the silicon dioxide cladding penetrate into the superlens. The thickness of the silicon dioxide cladding layer is 100 nm, the input waveguide end has a width of about 2 micrometers and has a concave horizontal shape towards the waveguide with a radius of curvature of about 10 micrometers. The output waveguide is an optical fiber with fiber end slightly away from the output surface of the superlens.

Figure 19I:
FIGS. 19(i)-19(m) show a superlens having planar, convex, concave, or arbitrarily shaped curvilinear input and/or output surfaces according to several embodiments.
Figure 19J:
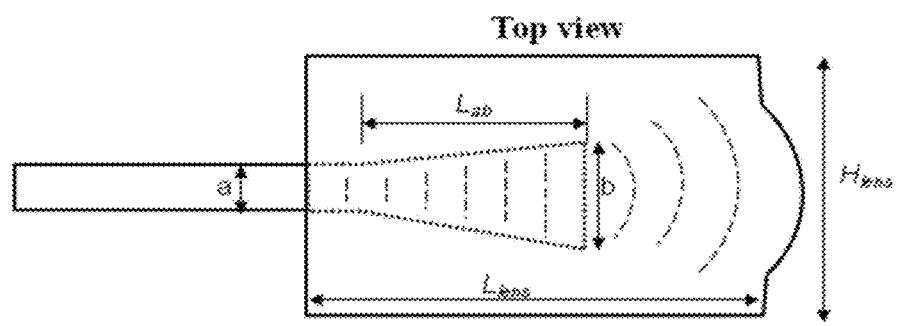
Figure 19K:
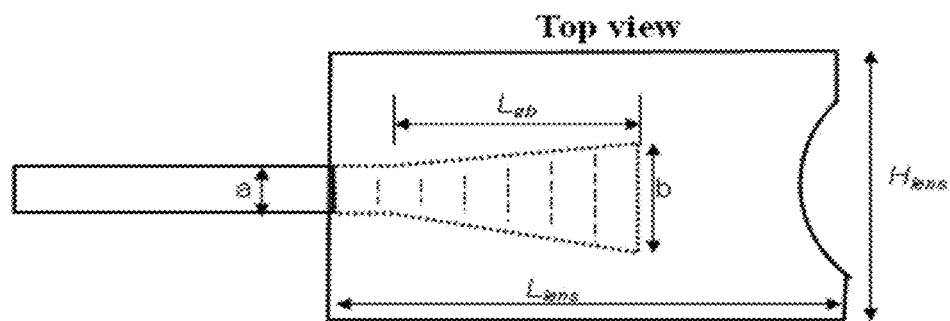
Figure 19L:
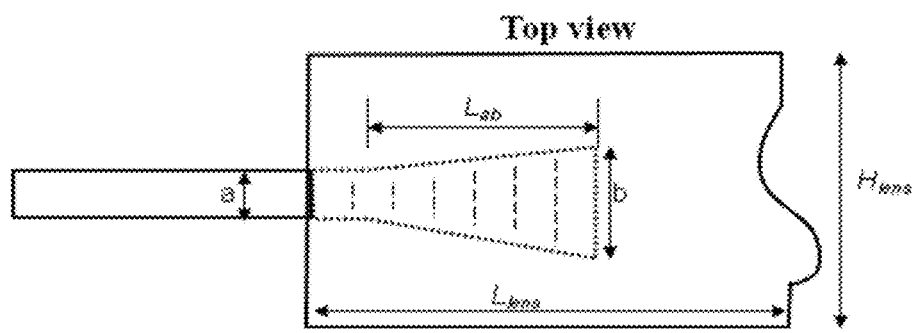

In yet another embodiment shown in FIG. 19(i), the input surface and/or output surface of the superlens may be a planar surface. In yet another embodiment shown in FIG. 19(j), the input surface and/or output surface of the superlens may be a curved surface to change the curvature of the wavefront for the beam exiting and/or entering the superlens, and the curve may be of various concave (see FIG. 19(j)) or convex (see FIG. 19(k)) or arbitrary curvilinear shapes (see FIG. 19(l)) in either the vertical, or the horizontal, or both the vertical and horizontal directions. FIG. 19(j), FIG. 19(k), and FIG. 19(l) give illustrations for the cases in which the superlens output surface has curvature in the horizontal direction.

Figure 19M:
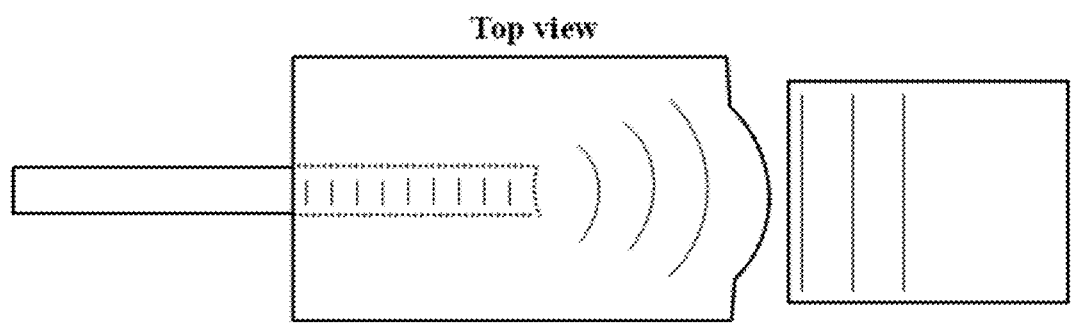

In one preferred embodiment shown in FIG. 19(m), the wavelength of light is λ=1500 nm, the input waveguide is a silicon waveguide with a thin layer of silicon dioxide cladding where the silicon waveguide core and the silicon dioxide cladding penetrate into the superlens. The thickness of the silicon dioxide cladding layer is 100 nm, the input waveguide end has a width of about 2 micrometers and convex horizontally towards the waveguide with a radius of curvature of about minus 10 micrometers to generate a diverging wavefront from the incident plane wavefront. The input surface of the superlens is a planar surface. The output surface of the superlens is horizontally concave towards the lens having a radius of curvature of about 10 micrometers to recollimate the beam by generating a planar wavefront. The output waveguide is an optical fiber with fiber end slightly away from the output surface of the superlens.

In one embodiment in which the input waveguide end penetrates into the lens, the refractive index of the superlens material immediately surrounding the waveguide is of a lower value than the refractive index of the waveguide. In another embodiment in which the input waveguide end penetrates into the lens, at least part of the tapering is outside the superlens. In another embodiment in which the input waveguide end penetrates into the lens, the entire tapering is outside the superlens.

In one embodiment in which the output waveguide end penetrates into the lens, the refractive index of the superlens material immediately surrounding the waveguide is of a lower value than the refractive index of the waveguide. In another embodiment in which the output waveguide end penetrates into the lens, at least part of the tapering is outside the superlens. In another embodiment in which the output waveguide end penetrates into the lens, the entire tapering is outside the superlens.

An exemplary superlens structure includes a large number (e.g., more than 30 and up to a few hundred) of alternating thin layers of silica ($SiO_2$) and silicon (Si) on a flat silicon-on-insulator substrate. The thickness of each layer (in nm) is provided in Table 3. The thicknesses of the silica layers range from 20 nm to 70 nm, and the thicknesses of the silicon layers range from 20 nm to 80 nm. In regions where the effective index of refraction is high, silicon layers are near their thickest while silica layers are near their thinnest; in regions where the effective index is low, the reverse applies.

TABLE 3

| Mtl | nm |
|---|---|
| Si | 60 |
| SiO2 | 20 |
| Si | 50 |
| SiO2 | 20 |
| Si | 60 |
| SiO2 | 20 |
| Si | 50 |
| SiO2 | 20 |
| Si | 60 |
| SiO2 | 20 |
| Si | 50 |
| SiO2 | 20 |
| Si | 60 |
| SiO2 | 20 |
| Si | 50 |
| SiO2 | 20 |
| Si | 80 |
| SiO2 | 30 |
| Si | 80 |
| SiO2 | 30 |
| Si | 80 |
| SiO2 | 30 |
| Si | 80 |
| SiO2 | 30 |
| Si | 80 |
| SiO2 | 30 |
| Si | 80 |
| SiO2 | 30 |
| Si | 80 |
| SiO2 | 30 |
| Si | 80 |
| SiO2 | 30 |
| Si | 50 |
| SiO2 | 20 |
| Si | 80 |
| SiO2 | 30 |
| Si | 50 |
| SiO2 | 20 |
| Si | 50 |
| SiO2 | 20 |
| Si | 50 |
| SiO2 | 20 |
| Si | 50 |
| SiO2 | 20 |
| Si | 50 |
| SiO2 | 20 |
| Si | 50 |
| SiO2 | 20 |
| Si | 50 |
| SiO2 | 20 |
| Si | 50 |
| SiO2 | 20 |
| Si | 50 |
| SiO2 | 20 |
| Si | 70 |
| SiO2 | 30 |
| Si | 80 |
| SiO2 | 20 |
| Si | 70 |
| SiO2 | 30 |
| Si | 70 |
| SiO2 | 30 |
| Si | 70 |
| SiO2 | 30 |
| Si | 50 |
| SiO2 | 20 |
| Si | 40 |
| SiO2 | 20 |
| Si | 80 |
| SiO2 | 20 |
| Si | 40 |
| SiO2 | 20 |
| Si | 70 |
| SiO2 | 30 |
| Si | 40 |
| SiO2 | 20 |
| Si | 70 |
| SiO2 | 30 |
| Si | 40 |
| SiO2 | 20 |
| Si | 70 |
| SiO2 | 30 |
| Si | 40 |
| SiO2 | 20 |
| Si | 40 |
| SiO2 | 20 |
| Si | 40 |
| SiO2 | 20 |
| Si | 40 |
| SiO2 | 20 |
| Si | 40 |
| SiO2 | 20 |
| Si | 40 |
| SiO2 | 20 |
| Si | 40 |
| SiO2 | 20 |

TABLE 3-continued

| Mtl | nm |
|---|---|
| Si | 40 |
| SiO2 | 20 |
| Si | 40 |
| SiO2 | 20 |
| Si | 50 |
| SiO2 | 30 |
| Si | 40 |
| SiO2 | 20 |
| Si | 50 |
| SiO2 | 30 |
| Si | 40 |
| SiO2 | 20 |
| Si | 50 |
| SiO2 | 30 |
| Si | 40 |
| SiO2 | 20 |
| Si | 30 |
| SiO2 | 20 |
| Si | 40 |
| SiO2 | 20 |
| Si | 30 |
| SiO2 | 20 |
| Si | 40 |
| SiO2 | 20 |
| Si | 40 |
| SiO2 | 30 |
| Si | 40 |
| SiO2 | 20 |
| Si | 40 |
| SiO2 | 30 |
| Si | 40 |
| SiO2 | 20 |
| Si | 40 |
| SiO2 | 30 |
| Si | 30 |
| SiO2 | 20 |
| Si | 30 |
| SiO2 | 20 |
| Si | 30 |
| SiO2 | 20 |
| Si | 30 |
| SiO2 | 20 |
| Si | 30 |
| SiO2 | 20 |
| Si | 30 |
| SiO2 | 20 |
| Si | 30 |
| SiO2 | 20 |
| Si | 30 |
| SiO2 | 20 |
| Si | 40 |
| SiO2 | 30 |
| Si | 40 |
| SiO2 | 30 |
| Si | 40 |
| SiO2 | 30 |
| Si | 40 |
| SiO2 | 30 |
| Si | 40 |
| SiO2 | 30 |
| Si | 40 |
| SiO2 | 30 |
| Si | 40 |
| SiO2 | 30 |
| Si | 20 |
| SiO2 | 20 |
| Si | 40 |
| SiO2 | 30 |
| Si | 20 |
| SiO2 | 20 |
| Si | 40 |
| SiO2 | 30 |
| Si | 20 |
| SiO2 | 20 |
| Si | 40 |
| SiO2 | 30 |

TABLE 3-continued

| Mtl | nm |
|---|---|
| Si | 20 |
| SiO2 | 20 |
| Si | 20 |
| SiO2 | 20 |
| Si | 40 |
| SiO2 | 30 |
| Si | 20 |
| SiO2 | 20 |
| Si | 20 |
| SiO2 | 20 |
| Si | 20 |
| SiO2 | 20 |
| Si | 20 |
| SiO2 | 20 |
| Si | 20 |
| SiO2 | 20 |
| Si | 20 |
| SiO2 | 20 |
| Si | 20 |
| SiO2 | 20 |
| Si | 20 |
| SiO2 | 20 |
| Si | 20 |
| SiO2 | 20 |
| Si | 20 |
| SiO2 | 20 |
| Si | 20 |
| SiO2 | 20 |
| Si | 20 |
| SiO2 | 20 |
| Si | 20 |
| SiO2 | 20 |
| Si | 20 |
| SiO2 | 20 |
| Si | 20 |
| SiO2 | 20 |
| Si | 20 |
| SiO2 | 20 |
| Si | 20 |
| SiO2 | 40 |
| Si | 30 |
| SiO2 | 20 |
| Si | 20 |
| SiO2 | 20 |
| Si | 20 |
| SiO2 | 40 |
| Si | 30 |
| SiO2 | 20 |
| Si | 20 |
| SiO2 | 20 |
| Si | 20 |
| SiO2 | 40 |
| Si | 30 |
| SiO2 | 20 |
| Si | 30 |
| SiO2 | 40 |
| Si | 30 |
| SiO2 | 40 |
| Si | 30 |
| SiO2 | 40 |
| Si | 30 |
| SiO2 | 40 |
| Si | 30 |
| SiO2 | 40 |
| Si | 20 |
| SiO2 | 30 |
| Si | 20 |
| SiO2 | 30 |
| Si | 20 |
| SiO2 | 30 |
| Si | 20 |
| SiO2 | 30 |
| Si | 20 |
| SiO2 | 30 |
| Si | 20 |
| SiO2 | 30 |

TABLE 3-continued

| Mtl | nm |
|---|---|
| Si | 20 |
| SiO2 | 30 |
| Si | 30 |
| SiO2 | 80 |
| Si | 20 |
| SiO2 | 40 |
| Si | 30 |
| SiO2 | 80 |
| Si | 20 |
| SiO2 | 40 |
| Si | 30 |
| SiO2 | 80 |
| Si | 20 |
| SiO2 | 40 |
| Si | 20 |
| SiO2 | 40 |
| Si | 20 |
| SiO2 | 40 |
| Si | 20 |
| SiO2 | 40 |
| Si | 20 |
| SiO2 | 40 |
| Si | 20 |
| SiO2 | 80 |
| Si | 20 |
| SiO2 | 40 |
| Si | 20 |
| SiO2 | 50 |
| Si | 20 |
| SiO2 | 50 |
| Si | 20 |
| SiO2 | 50 |
| Si | 20 |
| SiO2 | 80 |
| Si | 20 |
| SiO2 | 80 |
| Si | 20 |
| SiO2 | 60 |
| Si | 20 |
| SiO2 | 60 |
| Si | 20 |
| SiO2 | 60 |
| Si | 20 |
| SiO2 | 70 |
| Si | 20 |
| SiO2 | 70 |
| Si | 20 |
| SiO2 | 70 |
| Si | 20 |
| SiO2 | 20 |

The fabrication methods for the superlens structure described above exist in the prior art. The GRIN film can be deposited using a variety of well-established technologies; for example, existing technologies for fabricating thin film dense wavelength division multiplexing (DWDM) filters for optical communications by depositing successive layers of materials can be adapted to fabricating GRIN devices. Deposition methods that may be employed to create the structure include sputtering, chemical vapor deposition, electron beam and thermal evaporation, ion beam deposition or dual ion beam deposition (also called ion assisted deposition, or IAD), sol gel spin or dip coating and others.

Figure 20:
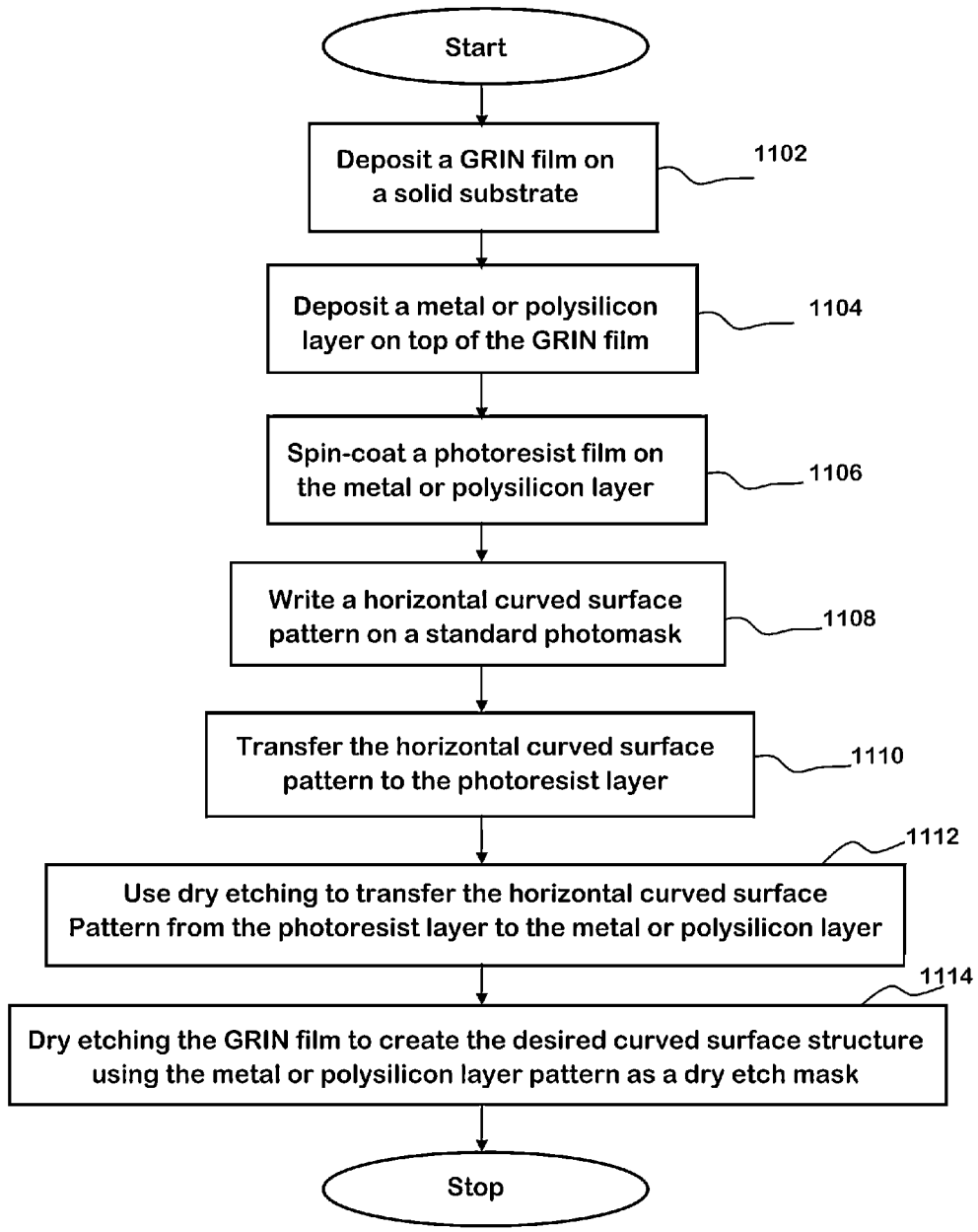
FIG. 20 is a flowchart depicting the method of fabricating a superlens.

The curved input and output sidewall surface formations are achieved through photolithography and etching. This method is illustrated using a flowchart in FIG. 20. The fabrication step begins with the deposition of GRIN film as shown in step 1102. In step 1104, a metal layer or a polysilicon layer, which is later used as dry etch mask, is deposited on top of the GRIN film. A photoresist film is then spin-coated on the metal or polysilicon film in step 1106. The horizontal curved surface pattern is then made on a standard photomask in step 1108. The pattern is then transferred to the photoresist layer using UV exposure with the help of a standard mask aligner in step 1110. After the development of the photoresist, dry etching is employed to transfer the horizontal pattern from the photoresist to the metal or polysilicon in step 1112. Finally, in step 1114, dry etching of the GRIN film creates the desired curved surface structure by using the metal or polysilicon pattern as a dry etch mask. The curved sidewall profile is controlled by varying the plasma processing parameters such as temperature, induction coupled plasma power or RF power, DC biased voltage, chamber pressure and gas mixture.

Figure 21:
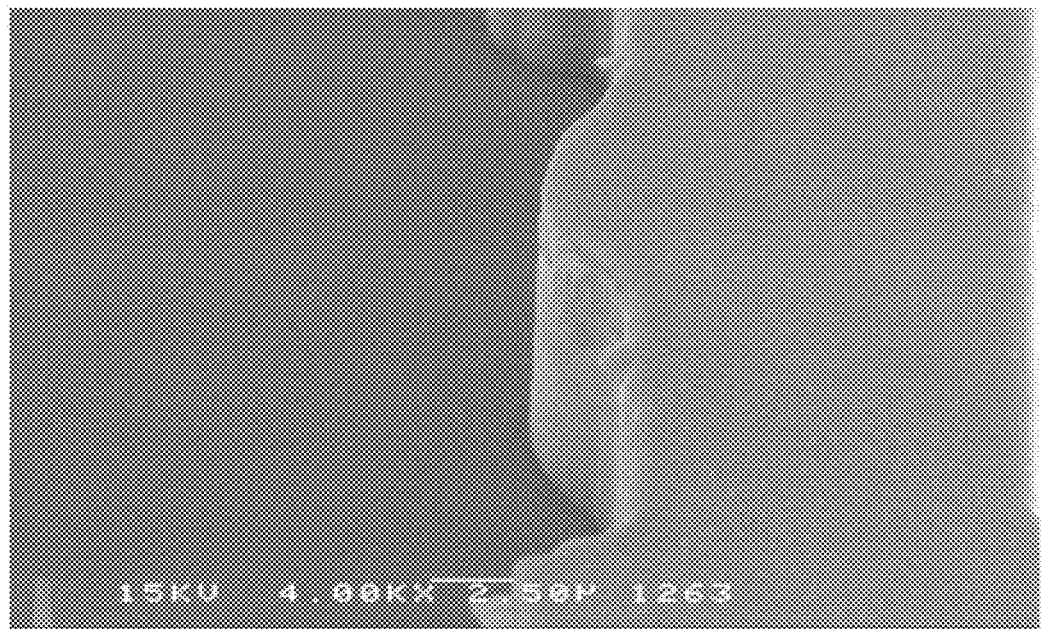
FIG. 21 shows a scanning electron microscope (SEM) image of the dry etched vertical input sidewall of a superlens.
Figure 22:
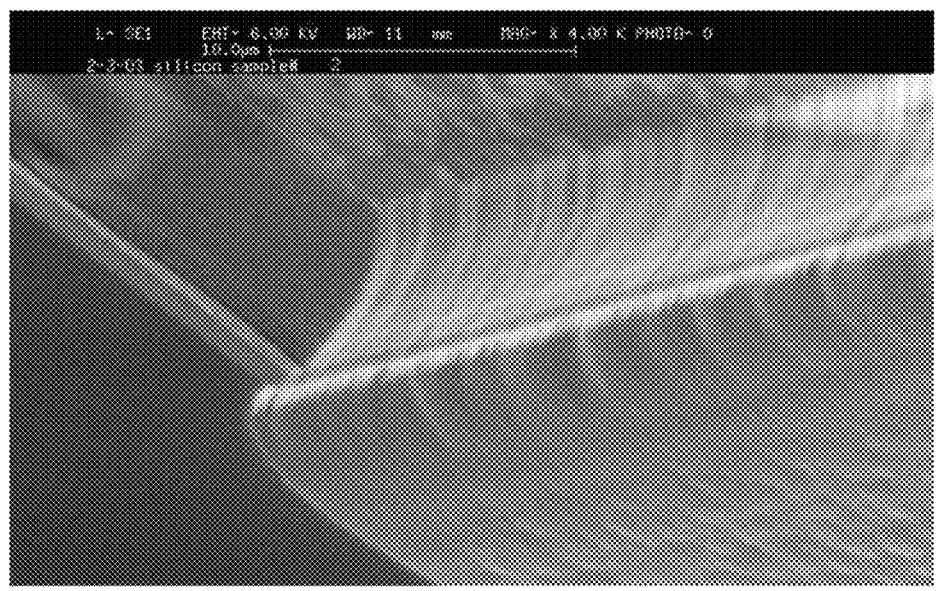
FIG. 22 shows a scanning electron microscope (SEM) image of the dry etched curved sidewall surface.

An example of the dry etched vertical input sidewall of a superlens is shown in FIG. 21. While FIG. 21 shows a scanning electron microscope image of a vertical straight input sidewall, it is also possible to create vertically curved sidewall. This can be done by changing the plasma processing parameters, or by combining dry etching with wet etching. FIG. 22 shows such a case. The present invention also allows the use of dry or wet etching process to create desirable sidewall surface profiles of the superlens according to the needs.

The superlens structure of the present invention can be fabricated on any solid substrate. For example, the superlens can be directly fabricated on a Si, or GaAs, or InP substrate together with photonic and electronic ICs as well as fiber positioning grooves such as V or U-groove. In such a case, the connection between a superlens and channel waveguide is defined using photolithography, which provides inherent high precision alignment. Further, such a structure can be used in the same way as a lensed fiber. The superlens can also be fabricated on a substrate next to a flip-chip bonding area. This ensures that when a photonic chip is flip-bonded next to the superlens, its output beam is circularized. As a combination of the above two case, a superlens can be fabricated in between a fiber positioning V-groove and a flip-chip bonding region. The combined structure enables one to achieve completely passive fully automated photonic chip packaging and fiber pig-tailing.

Figure 23:
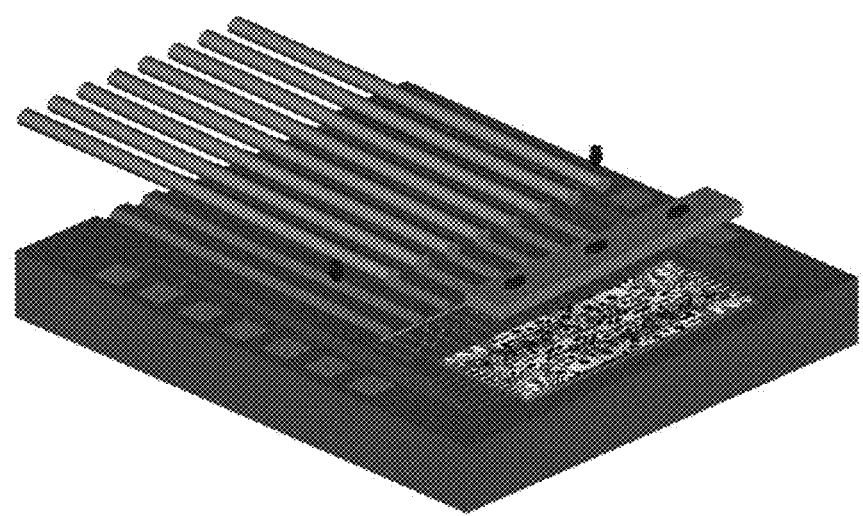
FIG. 23 illustrates the idea of simultaneous multi-channel light coupling using a superlens array-packaging platform.

Further, the superlens can also be fabricated in an array form. The array form superlens can then be applied to multi-channels light coupling into or out of a multi-port photonic chip. This is very difficult to achieve using individual lensed fibers. An example of array form superlens coupled to multi-port photonic chip is shown in FIG. 23.

As a further extension, the substrate material can be Si with microelectronic circuits for driving the photonic chip as well as for signal processing. The superlens can be fabricated on the Si substrate next to the photonic flip-chip bonding region. An advantage of such an arrangement is that the short distance between the photonic chip and the electronics circuits improves high-speed communication between optics and electronics.

While the preferred embodiment of the present invention is applicable to electromagnetic beam focusing, it can also be used in other applications. One example is in near-field optics for the transformation of an electromagnetic beam to a small mode size. In the existing technology, the transformation is achieved by tapering the fiber to a small tip (e.g., tens of nanometers) at one end and coating the outside of the tapered region with a metal film to prevent light from escaping. However, by this method, most of the light (as much as 99.99%) is lost during the electromagnetic beam size transformation process. Replacing such tapered fibers with the superlens of the present invention can improve the transmission efficiency substantially.

Another application relates to optical data storage, where the storage density can be limited by the spot size of light beams used to record and/or read the data. In existing optical storage devices, discrete optical elements (prisms, lenses, wave plates, etc.) are used to make the optical head and to focus a light beam from a semiconductor laser to a spot size of a few microns. Using a GRIN device, the focused spot size may be made much smaller, and the storage density may be substantially increased. In addition, discrete optical elements can also be replaced with planar light wave circuit based integrated optics.

GRIN devices may be used in any application where there is a need to focus a light beam into a small spot size. For example, such couplers can be used to focus light from a single mode optical fiber into a III-V semiconductor waveguide, in place of objective lenses or lens tipped fibers. Through proper selection of the refractive index distribution, mode matching to the fiber and the semiconductor waveguide can be achieved. Such devices can be fabricated on a substrate as part of an integrated coupler structure that includes a U-groove or V-groove for holding an optical fiber and a photonic chip mounting recess for holding the semiconductor waveguide.

In addition to light beam focusing, GRIN devices can also be used in other applications. For instance, in many near field optics applications, transformation of a light beam from a mode profile corresponding to a standard single mode optical fiber to a smaller mode size is generally achieved by tapering the fiber to a small tip (e.g., tens of nanometers) at one end and coating the outside of the tapered region with a metal film to prevent light from escaping. In general, most of the light (as much as 99.99%) is lost during this beam size transformation process. Replacing such tapered fibers with GRIN devices can improve the transmission efficiency substantially.

Apparatus and Method for Passive Alignment of Optical Devices

Figure 24:
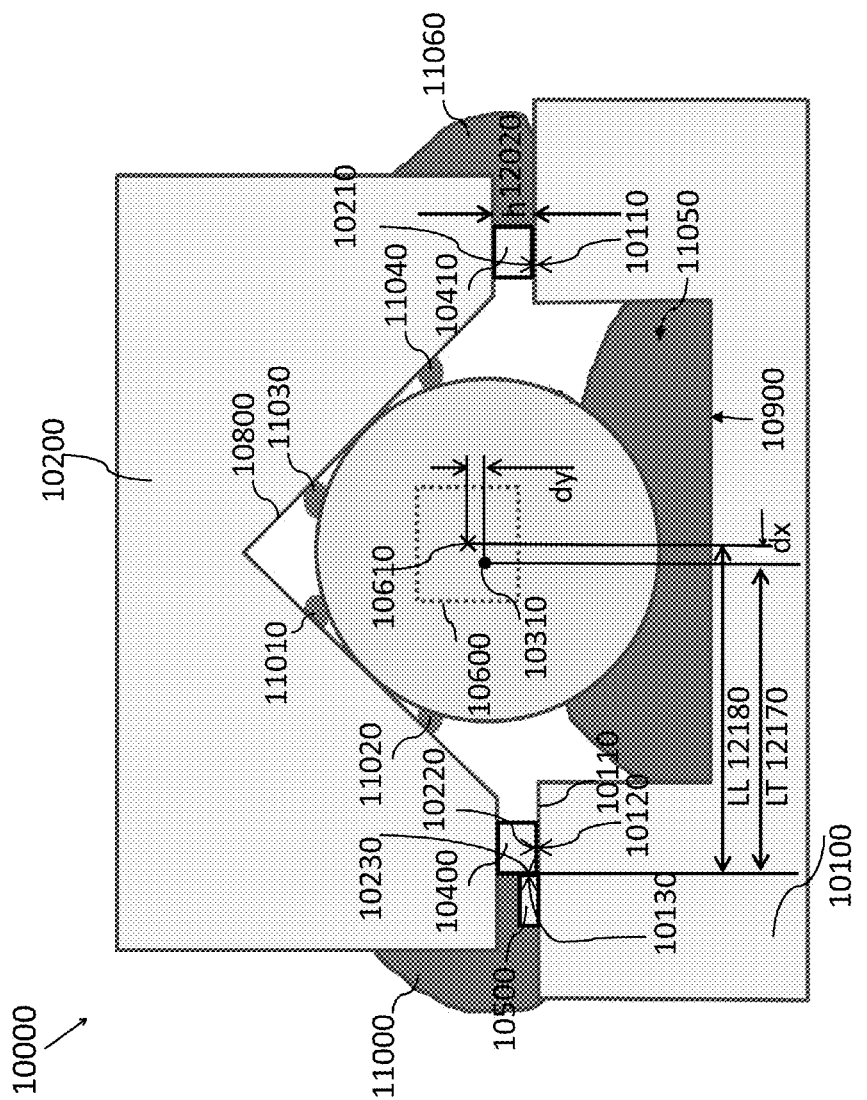
FIG. 24 shows a cross-sectional view of an exemplary alignment apparatus according to a first embodiment for the passive alignment of a lens and an optical fiber.

FIG. 24 provides a cross-sectional view of an exemplary apparatus 10000 for mounting an optical fiber 10300 in front of or behind an optical lens (e.g., a superlens) 10600 that has been fabricated on a substrate 10100. The mounting apparatus 10000 is designed to enable three-dimensional passive alignment of the optical fiber 10300 with the lens 10600 so that an optical beam may be passed through the lens 10600 and the optical fiber 10300 with optimal optical efficiency. A three-dimensional perspective view of the apparatus 10000 that is illustrated in cross-section in FIG. 24 is shown in FIG. 25A-25C.

Referring to FIGS. 24 and 25A-25C, a substrate 10100 is fabricated to include a coupling lens 10600 on a top surface 10110 thereof. The lens 10600 has an optical axis (lens' optical axis) 10610 along which a beam exits the lens 10600, as denoted by a cross ("x"). An optical fiber 10300 may be pre-mounted in a longitudinal indentation 10800 on a bottom surface of a top holder 10200 that is sized to fit a top portion of the optical fiber 10300. The optical fiber 10300 includes an optical axis (fiber's optical axis) 10310 along which a light beam enters the optical fiber 10300, as denoted by a circular dot in FIG. 24. One end 10300a of the optical fiber 10300 has an output facet that may be mounted in front of the lens 10600 so that light can couple efficiently between the lens 10600 and the optical fiber 10300. To achieve this, a top surface 10110 of the substrate 10100 includes a trench 10900 that may have dimensions sufficient to accommodate a bottom portion of the optical fiber 10300 without contacting the optical fiber 10300. While FIGS. 24 and 25A show that the top holder 10200 includes a longitudinal indentation 10800 having a V-shape cross-section, other cross-sectional geometries are possible, as described further below. The optical fiber may be held within the longitudinal indentation 10800 by any of a variety of adhesives, bonding agents, or solder, as shown schematically by several bonding points 11020, 11010, 11030, and 11040.

The apparatus 10000 includes a number of structural features discussed below that enable passive alignment of the lens 10600 and the optical fiber 10300. In other words, due to the design of the apparatus, the optical fiber may be aligned with the lens in three-dimensions in a passive mounting process that does not require use of a laser beam and a photodetector to monitor and optimize the coupling efficiency (active alignment).

Generally speaking, the apparatus 10000 for passive alignment of optical devices comprises a substrate 10100 having a trench 10900 in a top surface 10110 thereof, where the trench 10900 has a first end 10900a positioned at an edge of the substrate 10100 and a second end 10900b positioned at an interior region of the substrate 10100. A lens 10600 is positioned (e.g., fabricated) on the top surface 10110 of the substrate 10100 adjacent to the second end 10900b of the trench 10900. The apparatus 10000 further includes a top holder 10200 for mounting an optical fiber 10300. The top holder 10200 includes a longitudinal indentation 10800 in a bottom surface 10210 thereof. The longitudinal indentation 10800 is sized to fit a top portion of the optical fiber 10300 such that a bottom portion of the optical fiber 10300 extends below the bottom surface 10210 of the top holder 10200 and into the trench 10900 when mounted. The bottom portion of the optical fiber 10300 may or may not contact a surface of the trench 10900 when mounted.

One or both of the substrate 10100 and the top holder 10200 include one or more spacer features (e.g., 10400,10410,10500) configured for three-dimensional (3D) alignment of the lens 10600 with the optical fiber 10300 when the top holder 10200 is brought into contact with (or "mounted on") the substrate 10100.

According to one embodiment, all of the spacer features may be attached to the top holder 10200 prior to mounting the top holder 10200 on the substrate. According to another embodiment, all of the spacer features may be attached to the substrate 10100 prior to mounting. Alternatively, at least one of the spacer features may be attached to the top holder 10200, and at least one of the spacer features may be attached to the substrate 10100 prior to mounting. The phrase "attached to" may encompass "being integrally formed with."

The one or more spacer features of the apparatus may include one or more vertical spacer features configured for vertical alignment of the fiber's optical axis with the lens' optical axis. Specifically, the one or more vertical spacer features attached to the substrate (or to the top holder) may extend a height h from the top surface of the substrate (or from the bottom surface of the top holder). Due to the presence of the vertical spacer features, when the top holder is brought into contact with the substrate, the bottom surface of the top holder and the top surface of the substrate have a vertical separation h.

Referring again to FIG. 24, since the perpendicular distance of the lens' optical axis 10610 from the top surface 10110 of the substrate 10100 is known from the design and fabrication of the lens 10600, two vertical spacer features or pedestals 10400,10410, each having a predetermined height h 12020, are prefabricated in this example on the bottom surface 10210 of the top holder 10200. Accordingly, when the top holder 10200 is mounted on surface 10110 of the substrate 10100, a bottom surface 10220,10210 of each of the spacer features 10400,10410 comes into contact with a top surface 10110 of the substrate 10100. In this vertically aligned configuration, a vertical distance dy between the lens' optical axis (denoted by a dot in the figure) and the fiber's optical axis (denoted by a cross in the figure) has a small value compared to the mode size of the optical beam in the optical fiber (e.g. smaller than one mode radius of the optical fiber). For example, if the optical mode diameter is about 8 microns, dy may be smaller than about 4 microns. In more stringent applications, it would be desirable that dy may be smaller than about ¼ of the mode radius. For example, if the optical mode diameter is about 8 microns, dy may be smaller than about 1 micron.

The height h 12020 of the vertical spacer features 10400, 10410 can be controlled quite precisely by using thin film deposition for fabrication. For example, a desired thickness of silicon dioxide may be deposited to determine the height h of the one or more vertical spacer features, followed by photolithography to define the desired lateral shape and size and then dry etching to form the finished vertical spacer features. This approach may be used to fabricate any of the spacer features described herein.

The one or more spacer features of the apparatus may also include one or more horizontal spacer features configured for horizontal alignment of the fiber's optical axis with the lens' optical axis. (The term "horizontal" as used here refers to a direction substantially parallel to the top surface of the substrate and substantially perpendicular to the optical axes of the lens and fiber.) Each of the one or more horizontal spacer features on the substrate may have a first surface positioned a perpendicular distance LL from the lens' optical axis, and each of the one or more horizontal spacer features on the top holder may have a second surface positioned a perpendicular distance LT from the fiber's optical axis. When the top holder is brought into contact with the substrate, the first and second surfaces come into contact as mating surfaces. Accordingly, the fiber's optical axis and the lens' optical axis may be aligned such that a horizontal distance dx between the lens' optical axis and the fiber's optical axis (LL-LT) has a small value compared to the mode size of the optical beam in the optical fiber (e.g. smaller than one mode radius of the optical fiber). For example, if the optical mode diameter is about 8 microns, dx may be smaller than about 4 microns. In more stringent applications, it would be desirable that dx may be smaller than about ¼ of the mode radius. For example, if the optical mode diameter is about 8 microns, dx may be smaller than about 1 micron.

Figure 25:
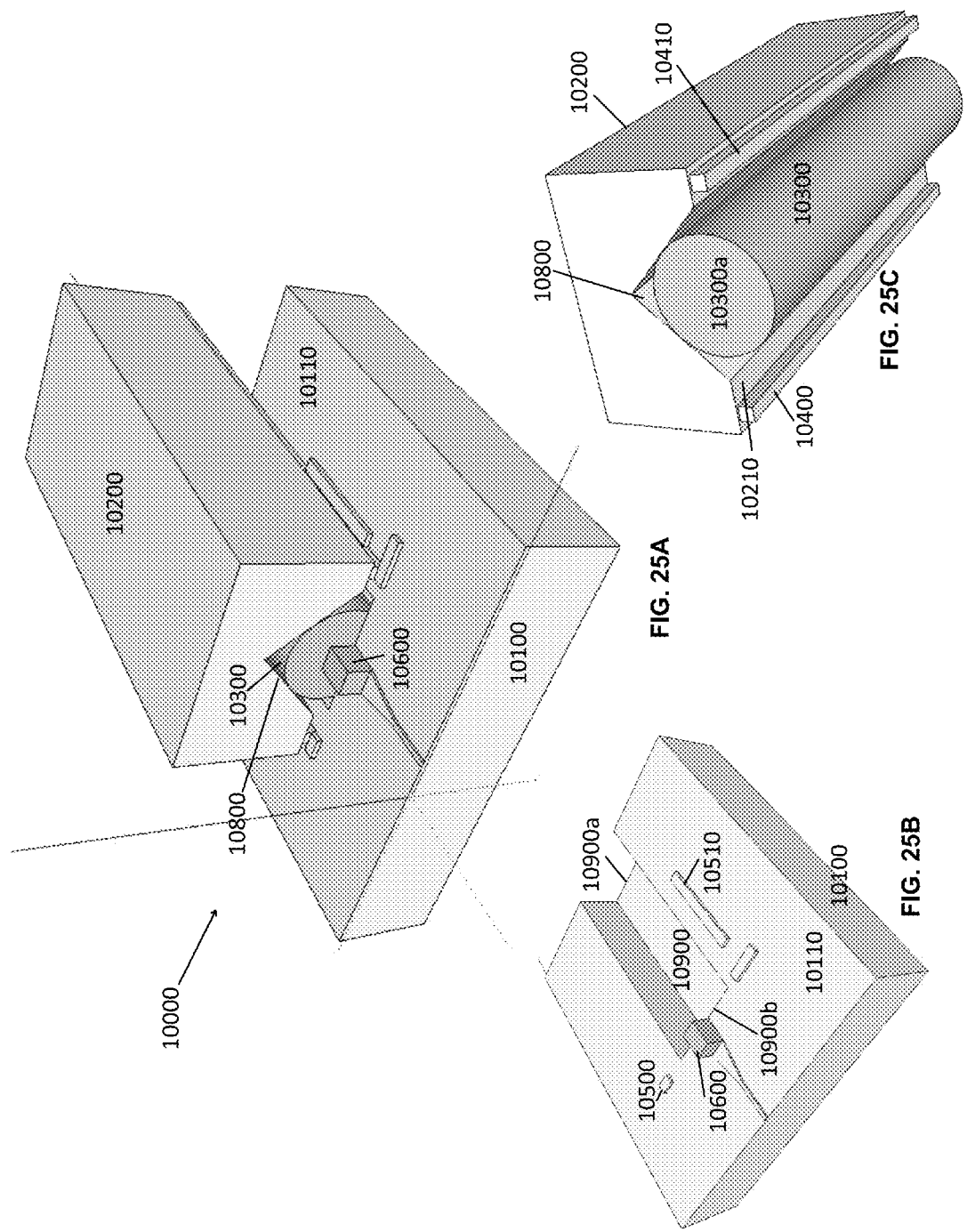
FIG. 25A shows a perspective view of the exemplary alignment apparatus that includes, before assembly, a substrate supporting a lens (FIG. 25B) and a top holder for mounting an optical fiber (FIG. 25C)

FIGS. 25 and 25A-25B show exemplary prefabricated horizontal spacer features on the surface of the substrate. For example, in the direction transverse to the optical axis of the lens, a horizontal spacer feature 10500 is fabricated as shown on the top surface 10110 of the substrate 10100. The horizontal distance from the right side ("first surface") 10130 of the horizontal spacer feature 10500 to the lens' optical axis 10610, denoted by LL 12180, can be well defined by optical lithography and etching. Similarly, a horizontal spacer feature 10400 is fabricated on the bottom surface 10210 of the top holder 10200. (In this example, the vertical spacer feature described above also serves as one of the horizontal spacer features described here.) The horizontal distance from the left side ("second surface") 10230 of the horizontal spacer feature 10400 to the fiber's optical axis 10310, denoted by LT 12170, can be well defined by optical lithography and etching. When the top holder 10200 is brought into contact with the substrate 10100, the first surface 10130 mates with the second surface 10230 to determine the horizontal alignment of the fiber's optical axis 10310 and the lens' optical axis 10610.

The one or more spacer features of the apparatus may include one or more longitudinal spacer features configured for alignment of an end of the lens with respect to an end of the optical fiber. (The term "longitudinal" refers to a direction substantially parallel to the top surface of the substrate and substantially parallel to the optical axes of the lens and fiber.) Each of the one or more longitudinal spacer features on the substrate may have a first surface positioned a perpendicular distance L from the end of the lens, and each of the one or more longitudinal spacer features on the top holder may have a second surface positioned at the second end of the top holder, which also corresponds to an end of the optical fiber. When the top holder is brought into contact with the substrate, the first and second surfaces come into contact as mating surfaces. Accordingly, the end of the lens and the end of the fiber may be aligned such that a longitudinal distance $dz=L$ between the two is about a mode radius of the optical fiber or less. It is also contemplated that the second surface on the top holder may be positioned at a distance $+/-L1$ from the end of the top holder, such that the longitudinal distance dz is equal to $(L-L1)$ when the top holder is mounted on the substrate. L is kept small compared to the wavelength of the optical beam in the optical fiber (e.g., if the wavelength is 1.5 microns, then L may be smaller than a few wavelengths or a few micrometers). The distances L and L1 can be well defined by optical lithography and etching methods known in the art.

Figure 26:
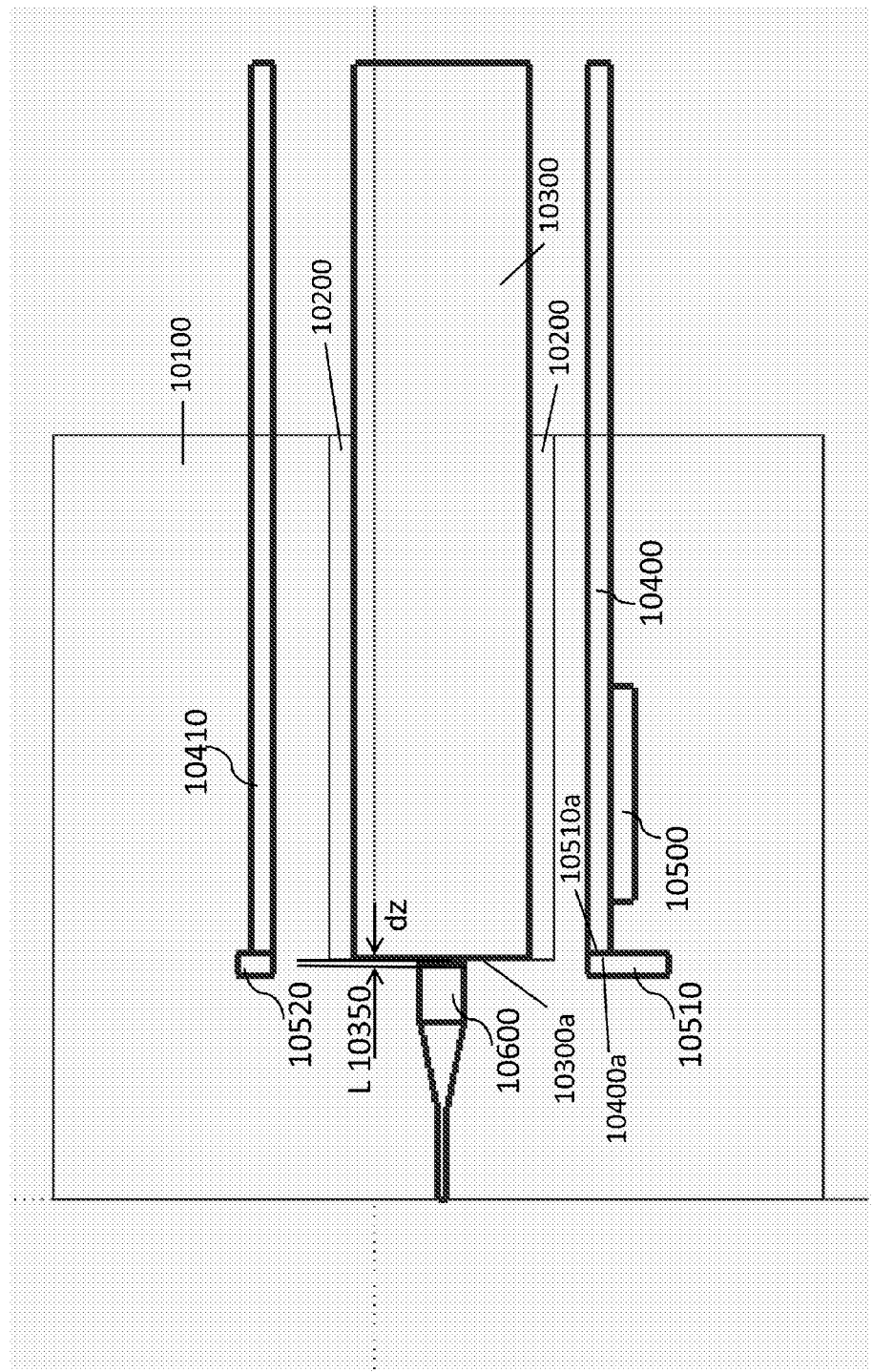
FIG. 26 shows a top view of the exemplary alignment apparatus.

For example, as shown in the top view of FIG. 26, a longitudinal spacer feature 10510 having a first surface 10510a positioned a distance L 10350 from the end of the lens may be fabricated as shown on the substrate 10100. When the top holder 10200 is brought into contact with the substrate 10100, the second surface 10400a of the longitudinal spacer feature 10400 on the top holder mates with the first surface 10510a of the longitudinal spacer feature 10510 on the substrate and is thereby prevented from further longitudinal motion in the direction of the lens. Accordingly, the end 10300a of the fiber 10300 may be mounted a desired distance away from the end of the lens 10600. FIG. 26 also illustrates an additional longitudinal spacer feature 10520 on the substrate.

After the mounting, the top holder 10200 can be fixed to the substrate 10100 removably or permanently by a bonding agent such as adhesive, solder or another material that may comprise a polymer (e.g., epoxy), metal or ceramic. The bonding agent may be deposited as shown for example in FIG. 24, where the bonding agent 11000,11060 is applied to sides of the top holder 10200. The bonding agent 11050 may also be present under the optical fiber 10300 at the bottom of the trench 10900. It is also contemplated that contact and/or mating surfaces (e.g., surfaces 10210 and 10110) may be removably or permanently attached together by metal bonding, solder, epoxy or another bonding agent or method.

Figure 27:
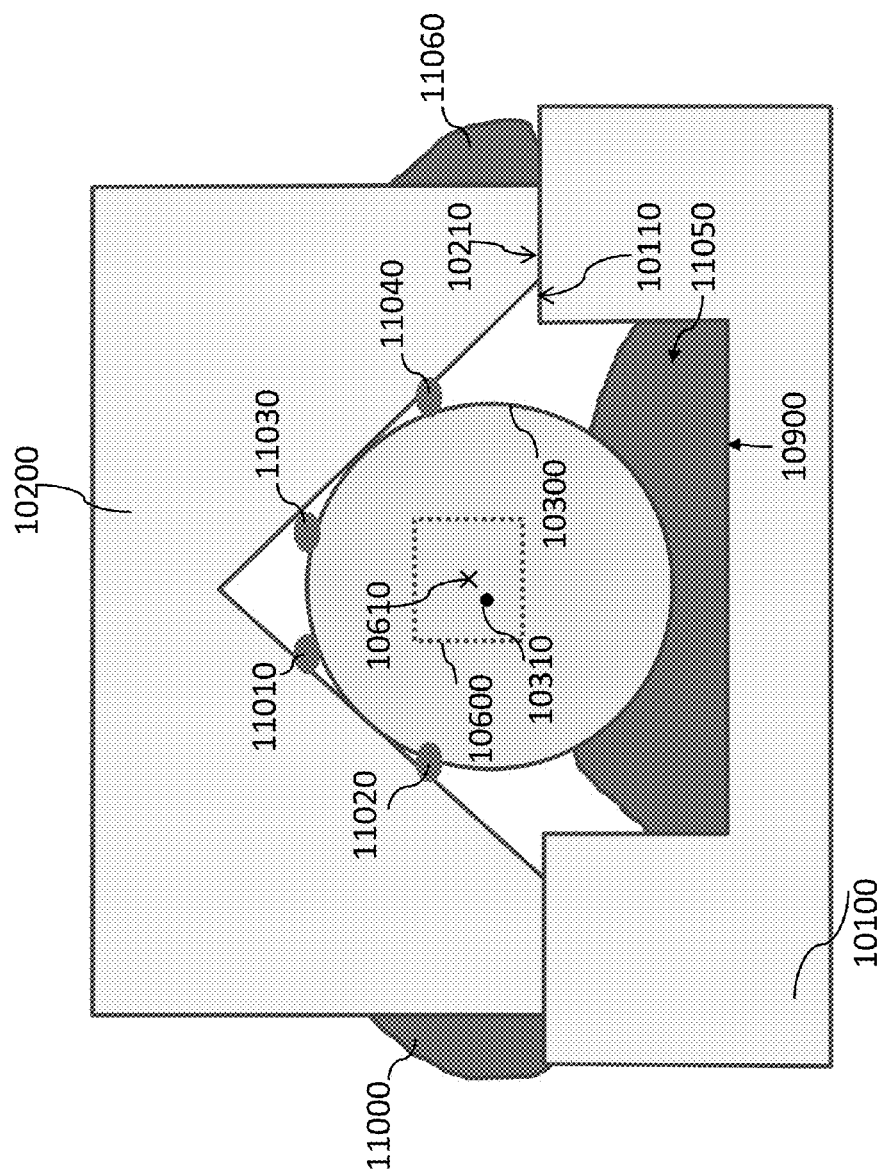
FIG. 27 shows a cross-sectional view of an alternative alignment apparatus that may require active alignment.

If desired, the top holder 10200 may be mounted onto the substrate 10100 without the aid of any self-alignment, as illustrated in FIG. 27. In such a case, other visual alignment or active alignment (where, for example, an optical beam is sent between the optical fiber and the lens, and a detector is used to maximize the optical power coupling between the optical fiber and the lens or the waveguide connected to the lens) may be used.

Figure 28:
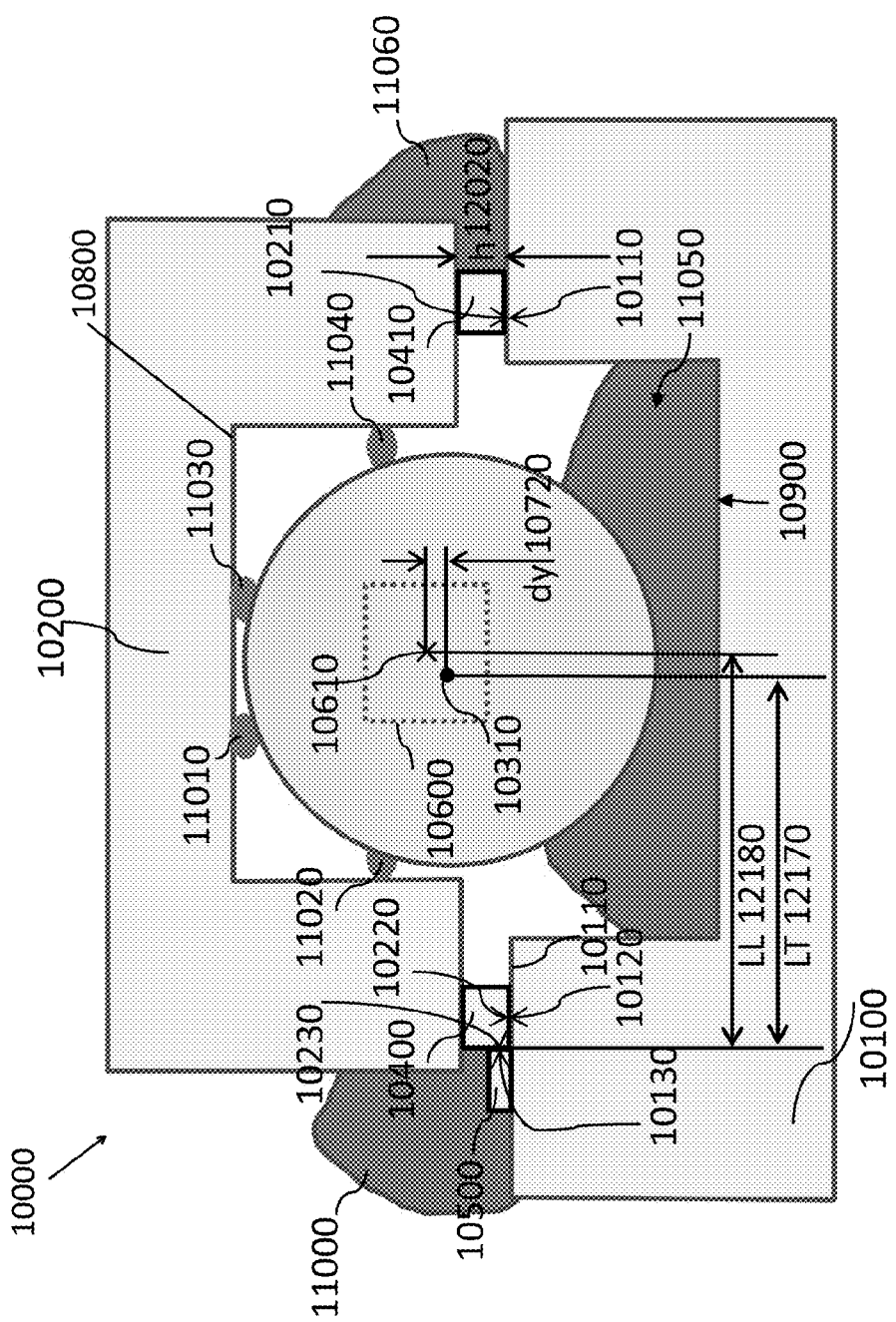
FIG. 28 shows a cross-sectional view of an exemplary alignment apparatus according to a second embodiment.

The specific locations and shapes of the various spacer features disclosed herein, as well as the designs of the longitudinal indentation, the trench and other features of the top holder and/or substrate, are for illustration only and not limitation. For example, FIG. 28 shows that the longitudinal indentation 10800 of the top holder 10200 need not have a V-shape (or triangular) cross-sectional shape. Instead, the cross-sectional shape of the longitudinal indentation 10800 may be rectangular, pentagonal, hexagonal or another polygonal shape. Alternatively, the cross-sectional shape may be a curved shape, such as a U-shape.

Figure 29:
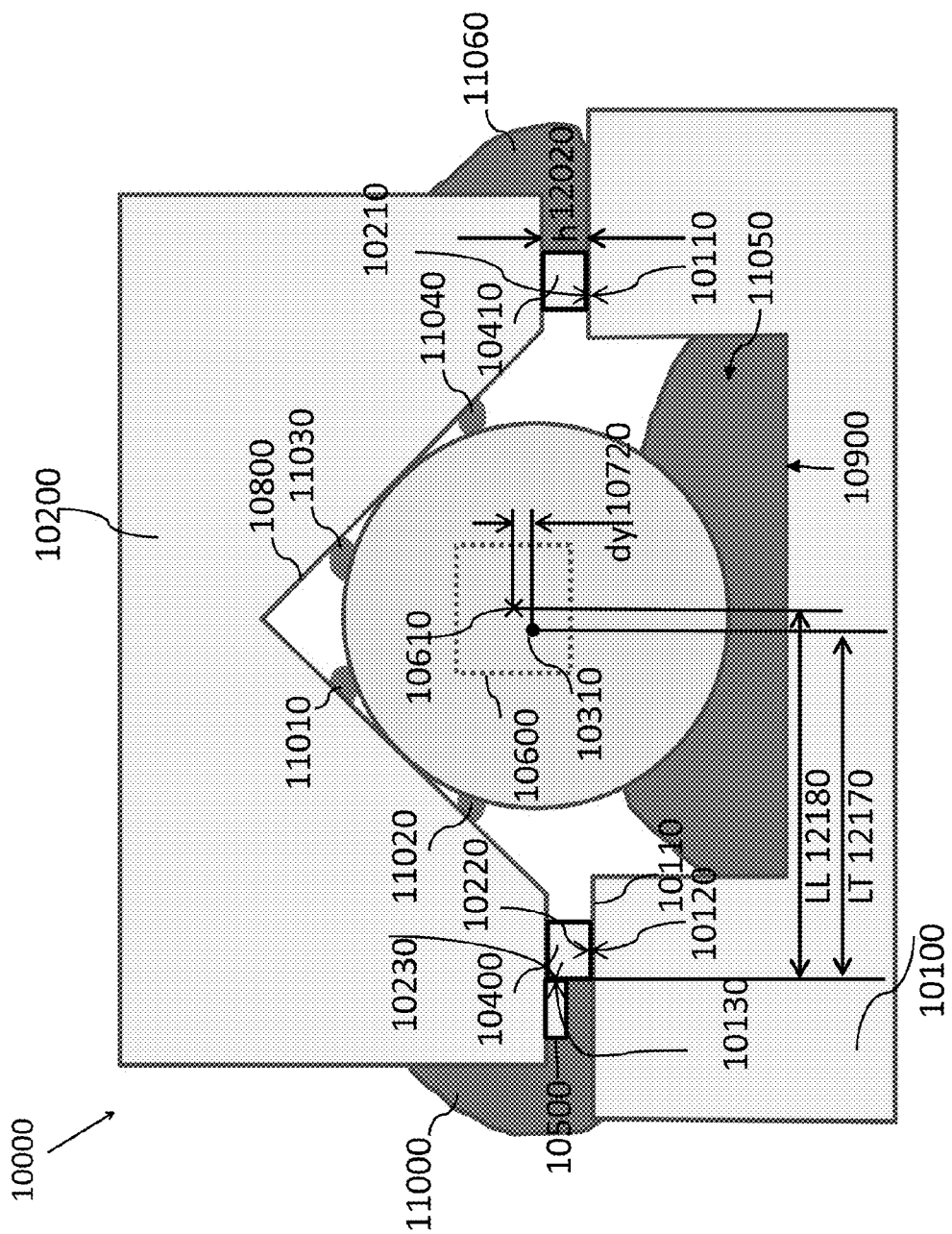
FIG. 29 shows a cross-sectional view of an exemplary alignment apparatus according to a third embodiment.

FIG. 29 shows that the one or more vertical spacer features (e.g., spacer features 10400, 10410) may be formed on the substrate 10100 instead of on the top holder 10200, and the one or more horizontal spacer features (e.g., spacer feature 10500) may be formed on the top holder 10200 instead of on the substrate 10100.

Figure 30:
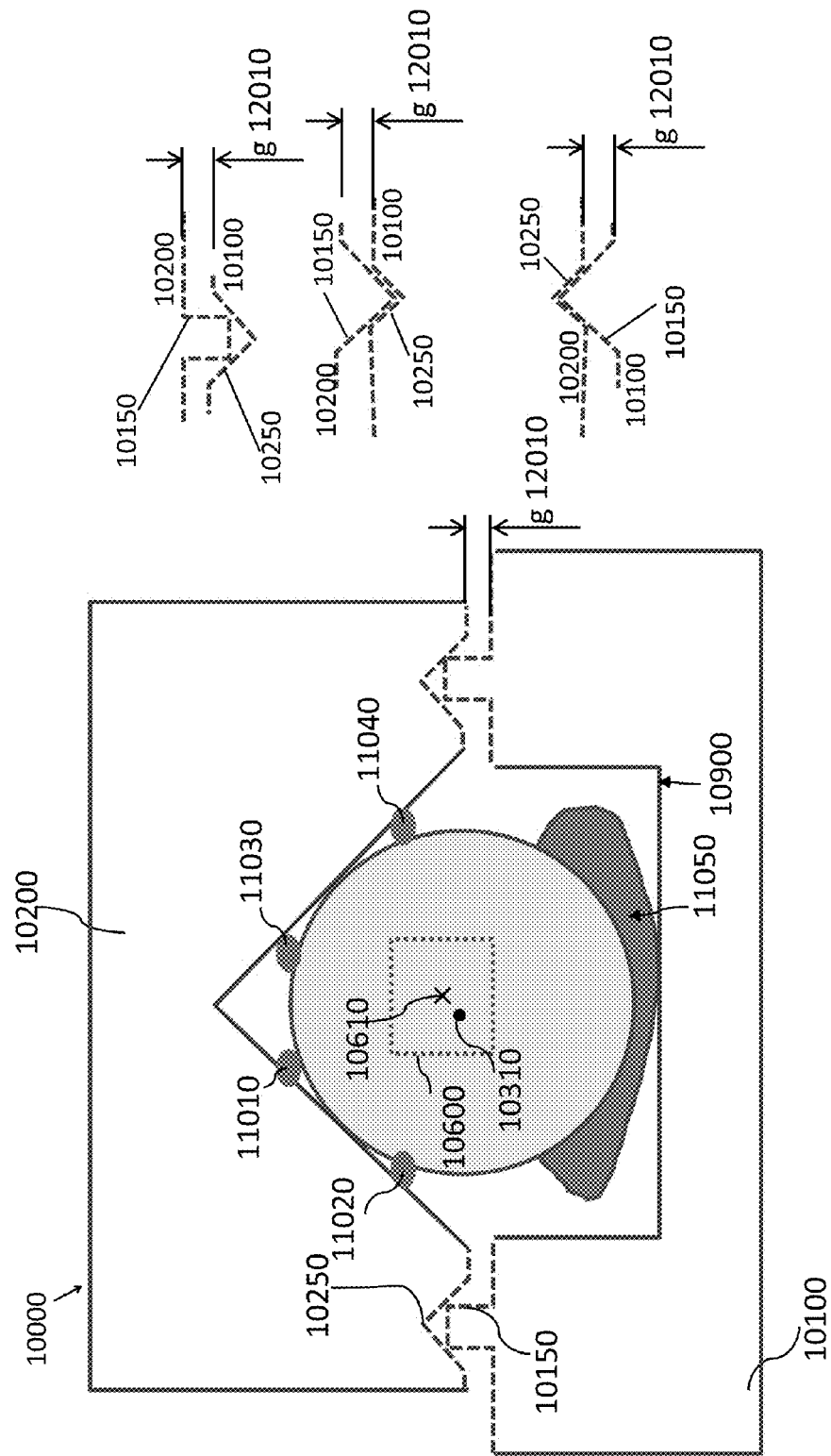
FIG. 30 shows a cross-sectional view of an exemplary alignment apparatus according to a fourth embodiment.

FIG. 30 shows other exemplary implementations of the horizontal and vertical spacer features (e.g., protrusions 10150 and indentations 10250). In these examples, the vertical alignment of the optical fiber with respect to the lens is controlled not by the height of the vertical spacer features, but rather by the distance g defined by matching protrusions 10150 and indentations 10250 found on opposing surfaces of the substrate 10100 and top holder 10200. At least four different schemes are illustrated in FIG. 30.

Figure 31:
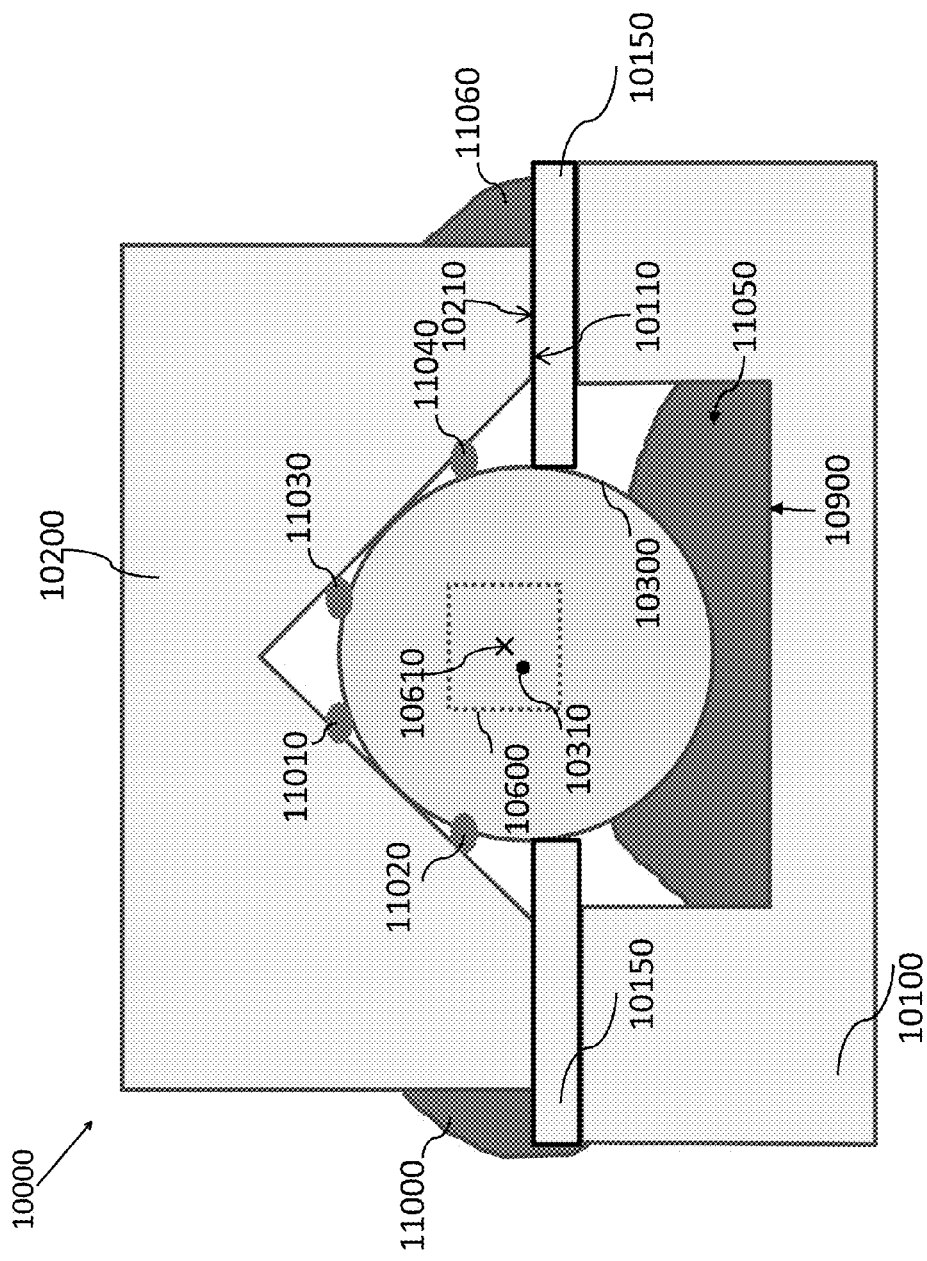
FIG. 31 shows a cross-sectional view of an exemplary alignment apparatus according to a fifth embodiment.

FIG. 31 shows that the one or more spacer features (e.g., the one or more vertical and horizontal spacer features) may comprise a material layer 10150 having a controlled thickness and geometry, which may be determined by vapor deposition and lithography and etching methods known in the art. The material layer 10150 may be deposited on the substrate 10100 to serve as an alignment guide for mounting the optical fiber 10300 held in the longitudinal indentation 10800 of the top holder 10200. The material layer 10150 may comprise either an inorganic material (e.g., silicon dioxide, a metal such as tungsten or nickel) or an organic material (e.g., a polymer such as polyimide).

Figure 32:
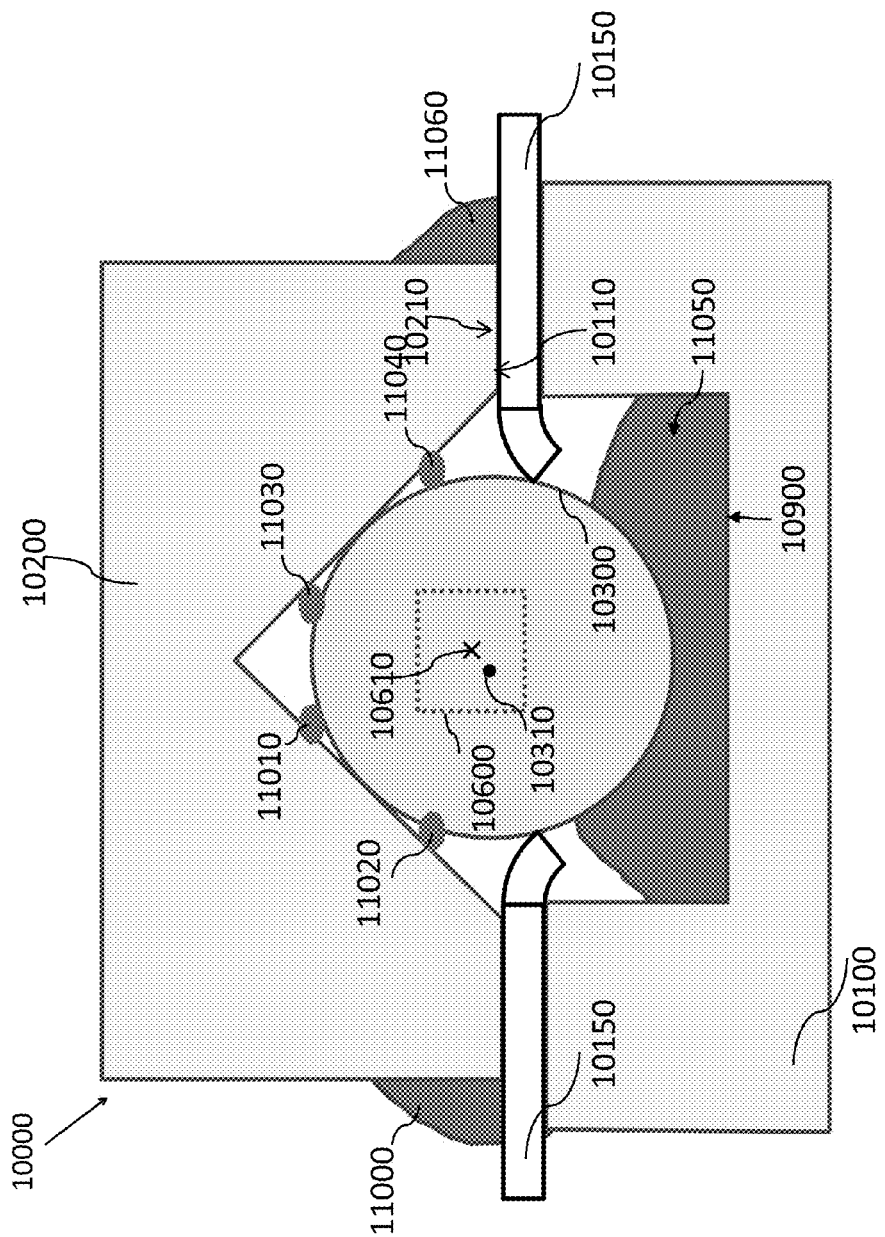
FIG. 32 shows a cross-sectional view of an exemplary alignment apparatus according to a sixth embodiment.

FIG. 32 shows that the material layer 10150 may have a predetermined size, positioning on the substrate, and flexibility so as to curve or bend in response to contact from an optical fiber 10300 when the top holder 10200 is lowered onto the substrate 10100. The bending may provide lateral forces on the optical fiber 10300 mounted in the top holder 10200 so as to facilitate self-alignment.

FIG. 33 shows an embodiment in which a trench 10900 having a V-shape cross-sectional shape in the substrate 10100 serves as an alignment guide for mounting the optical fiber 10300 held by the top holder 10200 onto the trench 10900 in the substrate 10100.

Various other variations to achieve self-alignment in the horizontal, longitudinal and vertical directions are possible. Thus, the cases shown here are only for the purpose of illustration and not limitation. Various configurations of spacer features can be designed so that, using a simple drop and push action, the lens' optical axis can be passively aligned with the fiber's optical axis. The present disclosure also includes an embodiment in which a top holder and substrate configuration as shown for example in FIG. 27 are used along with either visual or active alignment to align the optical fiber with the lens. In addition, it is contemplated that the one or more spacer features may be employed for self-alignment (or passive alignment) in only one of the vertical, horizontal or longitudinal direction, and the other directions may use visual or active alignment.

A method for passive alignment of optical devices includes providing a substrate 10100 containing a trench 10900 in a top surface 10110 thereof, where the trench 10900 has a first end 10900a positioned at an edge of the substrate 10100 and a second end 10900b positioned at an interior region of the substrate 10100. A lens 10600 is disposed on the top surface 10110 of the substrate 10100 adjacent to the second end 10900b of the trench 10900. An optical fiber 10300 is mounted in a top holder 10200 containing a longitudinal indentation 10800 in a bottom surface 10210 thereof, where the longitudinal indentation 10800 is sized to fit a top portion of the optical fiber 10300 such that a bottom portion of the optical fiber 10300 extends below the bottom surface 10210 of the top holder 10200. The top holder 10200 is brought into contact with (or mounted on) the substrate 10100, and one or more spacer features (e.g., 10400,10500) on one or both of the substrate 10100 and the top holder 10200 induce three-dimensional (3D) alignment of the optical fiber 10300 with the lens 10600 during the mounting. The bottom portion of the optical fiber 10300 may be suspended in the trench 10900 without contacting an interior surface thereof.

As discussed above, the one or more spacer features may be fabricated by thin film deposition followed by lithography and etching. After mounting the top holder 1200 on the substrate 10100 as described above, a vertical distance dy between an optical axis of the lens and an optical axis of the optical fiber may be less than a mode radius of the optical fiber (in more stringent applications, less than ¼ of the mode radius), and a horizontal distance dx between an optical axis of the lens and an optical axis of the optical fiber may be less than a mode radius of the optical fiber (in more stringent applications, less than ¼ of the mode radius). Also, a longitudinal spacing dz between an end of the lens and an end of the optical fiber has a small value. For example, dz may be a few times the mode size of the optical beam in the optical fiber. For example, if the optical mode diameter is about 8 microns, dz may be smaller than about 40 microns. In more stringent applications, it would be desirable that dz may be smaller than about the mode radius. For example, dz may be smaller than a 10 mode radius of the optical fiber, and if the optical mode diameter is about 8 microns, dz may be smaller than about 4 microns. Accordingly, the optical fiber 10300 and the lens 10600 may be three-dimensionally aligned without the use of a laser beam in an active alignment process.

Although the present invention has been described in considerable detail with reference to certain embodiments thereof, other embodiments are possible without departing from the present invention. The spirit and scope of the appended claims should not be limited, therefore, to the description of the preferred embodiments included here. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

The invention claimed is:

1. An apparatus for passive alignment of optical devices, the apparatus comprising:
   a substrate including a trench in a top surface thereof, the trench having a first end positioned at an edge of the substrate and a second end positioned at an interior region of the substrate;
   a lens disposed on the top surface of the substrate adjacent to the second end of the trench;
   a top holder having a longitudinal indentation in a bottom surface thereof for mounting an optical fiber, the longitudinal indentation being sized to fit a top portion of the optical fiber such that a bottom portion of the optical fiber extends below the bottom surface of the top holder when the optical fiber is mounted therein,
   wherein one or both of the substrate and the top holder include one or more spacer features configured for three-dimensional (3D) passive alignment of the optical fiber with the lens when the top holder is brought into contact with the substrate, such that a vertical distance dy between an optical axis of the lens and an optical axis of the optical fiber is less than ¼ of a mode radius of the optical fiber, a horizontal distance dx between the optical axis of the lens and the optical axis of the optical fiber is about ¼ of a mode radius of the optical fiber or less, and a longitudinal spacing dz between an end of the lens and an end of the optical fiber is about a mode radius of the optical fiber or less.

2. The apparatus of claim 1, wherein all of the one or more spacer features are attached to the top holder prior to bringing the top holder into contact with the substrate.

3. The apparatus of claim 1, wherein all of the one or more spacer features are attached to the substrate prior to bringing the top holder into contact with the substrate.

4. The apparatus of claim 1, wherein at least one of the one or more spacer features is attached to the top holder and at least one of the one or more spacer features is attached to the substrate prior to bringing the top holder into contact with the substrate.

5. The apparatus of claim 1, wherein the one or more spacer features comprise one or more vertical spacer features configured for vertical alignment of the optical axis of the optical fiber with the optical axis of the lens, the one or more vertical spacer features having a height h with respect to the substrate or the top holder.

6. The apparatus of claim 1, wherein the one or more spacer features include one or more horizontal spacer features configured for horizontal alignment of the optical axis of the optical fiber with the optical axis of the lens, each of the one or more horizontal spacer features on the substrate having a first surface positioned a perpendicular distance LL from the optical axis of the lens, and each of the one or more horizontal spacer features on the top holder having a second surface positioned a perpendicular distance LT from the optical axis of the optical fiber.

7. The apparatus of claim 6, wherein, when the top holder is brought into contact with the substrate, the first and second surfaces come into contact as mating surfaces.

8. The apparatus of claim 1, wherein the one or more spacer features comprise one or more longitudinal spacer features configured for alignment of the end of the lens with respect to the end of the optical fiber, each of the one or more longitudinal spacer features on the substrate having a first surface positioned a perpendicular distance L from the end of the lens, and each of the one or more longitudinal spacer features on the top holder having a second surface positioned a perpendicular distance L1 from a second end of the top holder.

9. The apparatus of claim 8, wherein, when the top holder is brought into contact with the substrate, the first and second surfaces come into contact as mating surfaces, the longitudinal spacing dz being equal to L−L1.

10. A method for passive alignment of optical devices, the method, the method comprising:
providing a substrate including a trench in a top surface thereof, the trench having a first end positioned at an edge of the substrate and a second end positioned at an interior region of the substrate, a lens being disposed on the top surface of the substrate adjacent to the second end of the trench;
mounting an optical fiber in a top holder including a longitudinal indentation in a bottom surface thereof, the longitudinal indentation being sized to fit a top portion of the optical fiber such that a bottom portion of the optical fiber extends below the bottom surface of the top holder,
mounting the top holder on the substrate, the bottom portion of the optical fiber being suspended in the trench, wherein one or more spacer features on one or both of the substrate and the top holder induce three-dimensional (3D) passive alignment of the optical fiber with the lens during the mounting, such that a vertical distance dy between an optical axis of the lens and an optical axis of the optical fiber is less than ¼ of a mode radius of the optical fiber, a horizontal distance dx between the optical axis of the lens and the optical axis of the optical fiber is about ¼ of a mode radius of the optical fiber or less, and a longitudinal spacing dz between an end of the lens and an end of the optical fiber is about a mode radius of the optical fiber or less.

11. The method of claim 10, wherein the one or more spacer features are fabricated by thin film deposition followed by lithography and etching.

12. The method of claim 10, wherein the one or more spacer features comprise one or more vertical spacer features configured for vertical alignment of the optical axis of the optical fiber with the optical axis of the lens, the one or more vertical spacer features having a height h with respect to the substrate or the top holder.

13. The method of claim 10, wherein the one or more spacer features include one or more horizontal spacer features configured for horizontal alignment of the optical axis of the optical fiber with the optical axis of the lens, each of the one or more horizontal spacer features on the substrate having a first surface positioned a perpendicular distance LL from the optical axis of the lens, and each of the one or more horizontal spacer features on the top holder having a second surface positioned a perpendicular distance LT from the optical axis of the optical fiber.

14. The method of claim 13, wherein, during the mounting of the top holder on the substrate, the first and second surfaces come into contact as mating surfaces.

15. The method of claim 10, wherein the one or more spacer features comprise one or more longitudinal spacer features configured for alignment of the end of the lens with respect to the end of the optical fiber, each of the one or more longitudinal spacer features on the substrate having a first surface positioned a perpendicular distance L from the end of the lens, and each of the one or more longitudinal spacer features on the top holder having a second surface positioned a perpendicular distance L1 from a second end of the top holder.

16. The method of claim 15, wherein, during the mounting of the top holder on the substrate, the first and second surfaces come into contact as mating surfaces, the longitudinal spacing dz being equal to L−L1.

\* \* \* \* \*